US009209171B2

(12) United States Patent
Hisamoto et al.

(10) Patent No.: US 9,209,171 B2
(45) Date of Patent: Dec. 8, 2015

(54) SEMICONDUCTOR DEVICE, METHOD FOR MANUFACTURING SAME, AND NONVOLATILE SEMICONDUCTOR MEMORY DEVICE

(75) Inventors: Digh Hisamoto, Kokubunji (JP); Shinichi Saito, Southampton (GB); Akio Shima, Hino (JP); Hiroyuki Yoshimoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 103 days.

(21) Appl. No.: 13/812,181

(22) PCT Filed: Jun. 20, 2011

(86) PCT No.: PCT/JP2011/064060
§ 371 (c)(1),
(2), (4) Date: Sep. 9, 2013

(87) PCT Pub. No.: WO2012/017746
PCT Pub. Date: Feb. 9, 2012

(65) Prior Publication Data
US 2013/0341729 A1    Dec. 26, 2013

(30) Foreign Application Priority Data
Aug. 3, 2010  (JP) ................................ 2010-174172

(51) Int. Cl.
*H01L 27/06* (2006.01)
*H01L 21/8249* (2006.01)
(Continued)

(52) U.S. Cl.
CPC ........ *H01L 27/0623* (2013.01); *G11C 16/0408* (2013.01); *H01L 21/8249* (2013.01);
(Continued)

(58) Field of Classification Search
CPC ............ H01L 27/0623; H01L 27/0705; H01L 27/1026; H01L 27/092; H01L 27/11; H01L 27/11521; H01L 27/11568; H01L 27/1203; H01L 29/66825; H01L 29/66833; H01L 29/788; H01L 29/792; H01L 21/84; H01L 27/1205; G11C 11/412
USPC .................. 257/378, 368, 369, 370, E29.273; 365/145, 146, 185.15, 185.18, 148, 365/185.17
See application file for complete search history.

(56) References Cited

U.S. PATENT DOCUMENTS 6,284,582 B1 *  9/2001  Yu .................................. 438/202
6,873,018 B2 *  3/2005  Bhattacharyya .............. 257/378
(Continued)

FOREIGN PATENT DOCUMENTS

| JP | 62-002650 A | 1/1987 |
| JP | 07-297394 A | 11/1995 |
| JP | 2009-290095 A | 12/2009 |

OTHER PUBLICATIONS

English machine translation of JP 2009-290095A ( Hisamoto , Dec. 10, 2009) Hitachi.*

(Continued)

*Primary Examiner* — Thinh T Nguyen
(74) *Attorney, Agent, or Firm* — Miles & Stockbridge PC

(57) ABSTRACT

Provided is a semiconductor element having, while maintaining the same integratability as a conventional MOSFET, excellent switch characteristics compared with the MOSFET, that is, having the S-value less than 60 mV/order at room temperature. Combining the MOSFET and a tunnel bipolar transistor having a tunnel junction configures a semiconductor element that shows an abrupt change in the drain current with respect to a change in the gate voltage (an S-value of less than 60 mV/order) even at a low voltage.

9 Claims, 34 Drawing Sheets

(51) Int. Cl.
*H01L 21/84* (2006.01)
*H01L 27/07* (2006.01)
*H01L 27/092* (2006.01)
*H01L 27/11* (2006.01)
*H01L 27/115* (2006.01)
*H01L 27/12* (2006.01)
*H01L 29/66* (2006.01)
*H01L 29/788* (2006.01)
*H01L 29/792* (2006.01)
*G11C 16/04* (2006.01)
*H01L 27/102* (2006.01)
*G11C 11/412* (2006.01)

(52) U.S. Cl.
CPC ............ *H01L21/84* (2013.01); *H01L 27/0705* (2013.01); *H01L 27/092* (2013.01); *H01L 27/11* (2013.01); *H01L 27/11521* (2013.01); *H01L 27/11568* (2013.01); *H01L 27/1203* (2013.01); *H01L 29/66825* (2013.01); *H01L 29/66833* (2013.01); *H01L 29/788* (2013.01); *H01L 29/792* (2013.01); *G11C 11/412* (2013.01); *H01L 27/1025* (2013.01); *H01L 27/1026* (2013.01)

(56) References Cited

U.S. PATENT DOCUMENTS

2003/0206429 A2 * 11/2003 Subramanian et al. ........ 365/103
2009/0016094 A1 * 1/2009 Rinerson et al. .............. 365/148

OTHER PUBLICATIONS

English machine translation of JP 07-297394 A (Kawaura, Oct. 11, 1995) NEC.*
Office Action dated Mar. 31, 2014, in Korean Patent Application No. 10-2103-7002168.

* cited by examiner

SEMICONDUCTOR DEVICE, METHOD FOR MANUFACTURING SAME, AND NONVOLATILE SEMICONDUCTOR MEMORY DEVICE

TECHNICAL FIELD

The present invention relates to a semiconductor device, a technique for manufacturing the semiconductor device, and a nonvolatile semiconductor memory device, and more particularly to an effective technique applied to a semiconductor device that is operable at a low voltage, a technique for manufacturing the semiconductor device, and a nonvolatile semiconductor memory device.

BACKGROUND ART

Japanese Unexamined Patent Publication No. 2009-290095 (Patent Literature 1) discloses a technique in which a diode element and a resistive element are arranged in parallel within a drain diffusion layer electrode in a planar logic circuit MOSFET (metal oxide semiconductor field effect transistor) used for a large-scale integrated circuit. With this technique, even if a voltage is low, a high performance transistor indicative of a precipitous change in a drain current to a gate voltage change can be realized.

CITATION LIST

Patent Literature 1: Japanese Unexamined Patent Publication No. 2009-290095

SUMMARY OF INVENTION

Technical Problem

From the end of $20^{th}$ century to $21^{st}$ century, CMOS (complementary MOS) devices are reduced, and an integration degree is enhanced to realize semiconductor integrated circuits (semiconductor chips) that exponentially enhance an information processing capability. It is conceivable that an extremely simple structure of the MOSFET and a continuous progress of a planar technique used for processing greatly contribute to a reduction in the CMOS device. An increase in the integration degree causes an increase in power consumption of the semiconductor chip, and therefore "scaling" that reduces a size of the device, and decreases a working voltage is conducted. A supply voltage of so-called "logic CMOS" used for a logic circuit is set to, for example, 1.2 V in a 90 nm planar technique generation, and 1 V in a further next 45 nm generation. This situation can be found in, for example, International Technology Roadmap for Semiconductor (ITRS), 2005 edition. Also, as disclosed in this literature, it is conceivable that in order to further reduce the device size, there is a need to decrease the voltage to 1 V or lower.

However, in order to allow the MOSFET to operate with a voltage of 1 V or lower, it is conceivable that switching characteristics are largely problematic. The switching of the MOSFET changes on/off of the MOSFET by applying a gate voltage to a gate electrode. This is to employ a rapid change in the conductivity of a channel of the MOSFET with a given voltage (threshold value) as a threshold value. When Subthreshold Swing (hereinafter referred to as "S value") that evaluates the above change as a change in a channel current is used, the S value becomes about 100 mV decade. That is, the channel current can be increased by one decade with application of the gate voltage of about 0.1 V. For that reason, the more precipitous switching characteristic is exhibited as the S value is smaller. In the MOSFET, a magnitude of the channel current is changed by about 10 decades with the voltage of 1 V. Therefore, the precipitous switching characteristic can be sufficiently obtained, and the MOSFET functions as a basic element of digital circuit operation.

It is known that the S value is controlled by channel charge induced by an electric field effect of the gate electrode. That is, since a channel surface state complies with the Boltzmann distribution, if an ideal MOSFET is realized, the S value can be expressed as $S=2.3\ kT/q$. In this expression, k is a Boltzmann constant, T is a temperature, and q is an electron charge. For example, at a room temperature (300° K), the S value takes 59.5 my. In the MOSFET, because the S value cannot be set to that value or lower, this is a problem known as a barrier of 60 mV among the problems with the MOSFET.

As described above, the supply voltage is decreased in order to reduce the power consumption. A lower limit of the S value causes a large barrier to a decrease of the supply voltage. For example, when the supply voltage is set to 0.3 V, a limit is that an on/off ratio of five decades is taken. In a real MOSFET, since an effect of variations of the threshold value is added to this limit, the on/off ratio is further lessened with the result that an excellent circuit operation can be obtained.

Up to now, a new structure of a low S value device in which the S value is improved (reduced) has been proposed. For example, in 2002, Plummer, et al. has proposed a structure called "I-MOS" in the International Electron Device Meeting (IEEE International Electron Devices Meeting Technical Digest pp. 289-292, 2002). In the I-MOS, the Avalanche breakdown occurs due to a high electric field, to thereby amplify the charge amount, and obtain electric charge defined by the Boltzmann distribution.

However, in this principle, because the controllability of the amplified and generated electric charge by the gate electrode is deteriorated, and also a high electric field is developed, a high voltage becomes necessary. Those facts run counter to a reduction in the supply voltage for reducing the electric power considered as the technical problem. For that reason, it is conceivable that the low S value device structure proposed up to now cannot be used in a field dealt with by the present invention. That is, in an element using an amplifying operation, since a larger voltage than a band gap of the semiconductor is usually applied, there is a need to develop a semiconductor element that effectively operates in a state where the semiconductor element operates with a smaller voltage than the band gap.

An object of the present invention is to provide a semiconductor element having an excellent switching characteristic as compared with the MOSFET, that is, having an S value smaller than 60 mV/decade at a room temperature, while maintaining the same integration property as that of the existing MOSFET.

The above and other objects and novel features of the present invention will become apparent from the description of the present specification and the attached drawings.

Solution to Problem

A representative outline of the invention disclosed the present application will be described in brief below.

According to the present invention, there is provided a semiconductor device including a semiconductor element having a first field effect transistor and a bipolar transistor formed on a semiconductor substrate. In this case, the first field effect transistor configuring the semiconductor element includes (a) a first semiconductor region of a first conduction type serving as a first source region, which is disposed within the semiconductor substrate, and (b) a second semiconductor region of the first conduction type serving as a first drain region, which is disposed at a distance from the first semiconductor region within the semiconductor substrate. The first field effect transistor further includes (c) a first channel region of a second conduction type opposite to the first conduction type, which is formed within the semiconductor substrate between the first semiconductor region and the second semiconductor region, (d) a first gate insulating film formed on the first channel region, and (e) a first gate electrode formed on the first gate insulating film. Also, the bipolar transistor configuring the semiconductor element includes (f) a third semiconductor region of the second conduction type serving as an emitter region formed to be included in the second semiconductor region, (g) the second semiconductor region of the first conduction type serving as a base region, and (h) the semiconductor substrate of the second conduction type serving as a collector region. In the configuration, a tunnel junction is formed in a boundary region between the second semiconductor region and the third semiconductor region.

Also, according to the present invention, there is provided a semiconductor device including: a semiconductor element having a first field effect transistor and a bipolar transistor, which are formed in an SOI substrate having a support substrate, a buried insulating layer formed on the support substrate, and an active layer formed on the buried insulating layer. In this case, the field effect transistor configuring the semiconductor element includes (a) a first semiconductor region of a first conduction type serving as a first source region, which is disposed within the active layer, and (b) a second semiconductor region of the first conduction type serving as a first drain region, which is disposed at a distance from the first semiconductor region within the active layer. The field effect transistor further includes (c) a first body region of a second conduction type opposite to the first conduction type, which serves as a first channel region formed within the active layer between the first semiconductor region and the second semiconductor region, (d) a first gate insulating film formed on the first body region, and (e) a first gate electrode formed on the first gate insulating film. Also, the bipolar transistor configuring the semiconductor element includes (f) a third semiconductor region of the second conduction type serving as an emitter region formed to be included in the second semiconductor region, (g) the second semiconductor region of the first conduction type serving as a base region, and (h) the body region of the second conduction type serving as a collector region. In the configuration, a tunnel junction is formed in a boundary region between the second semiconductor region and the third semiconductor region.

Further, according to the present invention, there is provided a nonvolatile semiconductor memory device, including a memory cell having a memory transistor and a bipolar transistor formed on a semiconductor substrate. The memory transistor configuring the memory cell includes: (a) a first semiconductor region of a first conduction type serving as a source region, which is disposed within the semiconductor substrate; (b) a second semiconductor region of the first conduction type serving as a drain region, which is disposed at a distance from the first semiconductor region within the semiconductor substrate; and (c) a channel region of a second conduction type opposite to the first conduction type, which is formed within the semiconductor substrate between the first semiconductor region and the second semiconductor region. The memory transistor further includes: (d) a first potential barrier film formed on the channel region; (e) a charge storage film formed on the first potential barrier film; (f) a second potential barrier film formed on the charge storage film; and (g) agate electrode formed on the second potential barrier film. Also, the bipolar transistor configuring the memory cell includes: (h) a third semiconductor region of the second conduction type serving as an emitter region formed to be included in the second semiconductor region; (i) the second semiconductor region of the first conduction type serving as a base region; and (j) the semiconductor substrate of the second conduction type serving as a collector region. In the configuration, a tunnel junction is formed in a boundary region between the second semiconductor region and the third semiconductor region.

Also, according to the present invention, there is provided a method for manufacturing a semiconductor device, including the steps of: (a) preparing the semiconductor substrate; (b) forming a gate insulating film on the semiconductor substrate; (c) forming a gate electrode on the gate insulating film; and (d) after the step (c), forming a first semiconductor region of a first conduction type and a second semiconductor region of the first conduction type at a distance from each other by introducing a first conduction type impurity into the semiconductor substrate. The method also includes the step of (e) after the step (d), forming a third semiconductor region of a second conduction type opposite to the first conduction type so as to be included in the second semiconductor region by introducing a second conduction type impurity into the semiconductor substrate. Further, the method includes the step of (f) after the step (e), implementing a heat treatment for activating the first conduction type impurity introduced into the first semiconductor region and the second semiconductor region, and the second conduction type impurity introduced into the third semiconductor region. In the method, a tunnel junction is formed in a boundary region between the second semiconductor region and the third semiconductor region by adjusting a concentration of the first conduction type impurity introduced into the first semiconductor region and the second semiconductor region in the step (d), a concentration of the second conduction type impurity introduced into the third semiconductor region in the step (e), and the heat treatment implemented in the step (f).

Advantageous Effects of Invention

The advantageous effects obtained by representative features of the invention disclosed in the present application will be described in brief below.

There can be provided the semiconductor element having an excellent switching characteristic as compared with the MOSFET, that is, having an S value smaller than 60 mV/decade at a room temperature, while maintaining the same integration property as that of the existing MOSFET.

DESCRIPTION OF EMBODIMENTS

Figure 1:
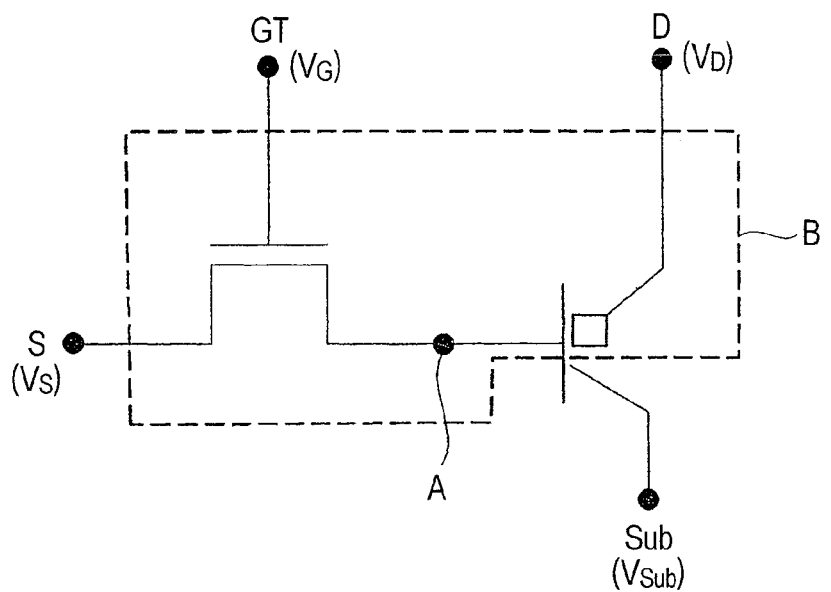
FIG. 1 illustrates an equivalent circuit diagram of a semiconductor element according to a first embodiment of the present invention.

Embodiments described below will be described by dividing into a plurality of sections or further embodiments when required as a matter of convenience. However, these sections or further embodiments are not irrelevant to each other unless otherwise specified, and one of them relates to a modification example, details, a supplementary explanation, or the like that includes the entire or a part of the others.

Also, in the following embodiments, when referring to the number elements (including the number of pieces, values, amounts, ranges, or the like), the number of elements is not limited to a specific number unless otherwise specified or except the case where the number is apparently limited to a specific number in principle. The number may be larger or smaller than a specific number.

Further, in the following embodiments, it goes without saying that the components (including element steps etc.) are not always indispensable unless otherwise specified or except the case where the components are apparently indispensable in principle.

Similarly, in the following embodiments, when the shape of the components, the positional relation thereof, and the like are mentioned, the substantially approximate and similar shapes and the like are included therein unless otherwise specified or except the case where it can be thought that they are apparently excluded in principle. This condition is also applicable to the numerical value and the range described above.

The components having the same function are denoted by the same reference symbols throughout the drawings for describing the embodiments, and the repetitive description thereof will be omitted. Also, in the drawings used in the embodiments, some plan views may be hatched because they are easy to see.

First Embodiment

Description of Features of Circuit Configuration According to the Present Invention The above-mentioned object can be achieved by forming a tunnel diode element within a drain region (drain diffusion layer) of a conventional MOSFET, and forming a tunnel-injection bipolar transistor using a substrate electrode. The tunnel-injection bipolar transistor represents a bipolar transistor having a tunnel junction between an emitter and a base. Although will be described later on the basis of a manufacturing process (working process), this structure does not suffer from a problem on integration. That is, in the planar technique, a drain region (drain diffusion layer) and a source region (source diffusion layer) of the MOSFET are formed on a gate electrode by using an ion implantation method in a self-alignment manner. For that reason, if the gate electrode is downsized, the drain region and the source region for determining the element characteristics can be formed as small as possible (brought close to each other). As a result, since the entire element can be downsized while improving the element performance, the integration can be enhanced. At present, when a spacer technique widely used in a semiconductor industry is used, the tunnel diode according to the present invention can be formed on the gate electrode in the self-alignment manner. For that reason, it is apparent that the structure of the present invention does not suffer from a problem on the integration.

Subsequently, a description will be given of a fact that the S value can be reduced in the semiconductor element according to the first embodiment of the present invention, with reference to FIG. 1. FIG. 1 illustrates an equivalent circuit diagram of a semiconductor element according to the first embodiment. The semiconductor element according to the first embodiment is structurally configured by one element, but can include a MOSFET and a tunnel-injection bipolar transistor in an equivalent circuit by incorporating the tunnel diode into the drain region (drain diffusion layer).

Because the tunnel-injection bipolar transistor is not general up to now, there is no equivalent circuit symbol which is widely used. Accordingly, in the present specification, the tunnel-injection bipolar transistor will be described with the use of a rectangular symbol for junction, by imitating a bipolar transistor normally expressing the junction with an arrow. The notation of the arrow includes a direction of an np junction, but the rectangular symbol in this example merely represents a junction position. In the description of the semiconductor element according to the first embodiment, an n-channel MOSFET is used for the MOSFET, and a pnp tunnel-injection bipolar transistor is used for the tunnel-injection bipolar transistor.

Referring to FIG. 1, the semiconductor element according to the first embodiment includes the MOSFET and the tunnel-injection bipolar transistor. A source region of the MOSFET is connected to a source terminal S, and a gate electrode of the MOSFET is connected to a gate terminal GT. A drain region of the MOSFET is connected to a base region of the tunnel-injection bipolar transistor, and a connection region is expressed as a node A. An emitter region of the tunnel-injection bipolar transistor is connected to a drain terminal D, and a collector region of the tunnel-injection bipolar transistor is connected to a substrate terminal Sub. In the tunnel-injection bipolar transistor, a junction of the emitter region and the base region functions as a tunnel junction, and is expressed by the rectangular symbol of FIG. 1.

Figure 2:
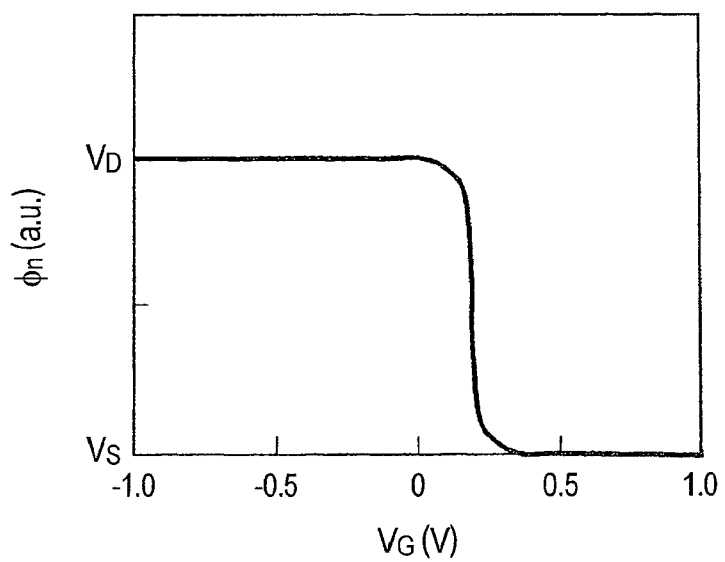
FIG. 2 is a graph illustrating results obtained by measuring a potential change at a node when a voltage is applied to a gate electrode.

FIG. 2 is a graph illustrating results obtained by measuring a potential ($\phi n$) change at the node A when a voltage is applied to the gate electrode. As illustrated in FIG. 2, it is found that when a drain potential $V_D$ is applied to the drain terminal D, and a gate potential $V_G$ to be applied to the gate terminal GT is increased, the potential ($\phi n$) of the node A is rapidly decreased from the drain potential $V_D$. This can be understood under the consideration that a connection between the MOSFET and the tunnel transistor, which are marked with a dashed line B illustrated in FIG. 1, forms an inverter.

That is, it can be assumed that the node A which the connection region between the MOSFET and the tunnel transistor is connected with the source terminal S through a channel resistance of the MOSFET, and also connected with the tunnel transistor D through a tunnel resistance of the tunnel transistor, from the viewpoint of a circuit. Accordingly, a potential of the node A represents a potential obtained by dividing a voltage between a source potential $V_s$ to be applied to the source terminal S and the drain potential $V_D$ to be applied to the drain terminal D, by the channel resistance and the tunnel resistance. For that reason, for example, in a state where the MOSFET is off, because the channel resistance is very high as compared with the tunnel resistance, the potential of the node A becomes substantially the same as the drain potential $V_D$. On the other hand, in a state where the channel of the MOSFET is on, because the channel resistance is very low as compared with the tunnel resistance, the potential of the node A becomes substantially the same as the source potential $V_s$. From this fact, the connection of the MOSFET and the tunnel-injection bipolar transistor which is marked with the dashed line B conducts inverter operation as illustrated in FIG. 2, with respect to a change of the gate potential $V_G$ to be applied to the gate terminal GT.

In this situation, a voltage of $V_D - \phi n$ is applied to the tunnel diode formed between the emitter region and the base region of the tunnel-injection bipolar transistor. That is, as the gate voltage $V_G$ to be applied to the gate terminal GT is increased, the potential $\phi n$ is rapidly changed with respect to a constant drain potential $V_D$ as illustrated in FIG. 2. For that reason, a large voltage is extremely rapidly applied to the tunnel diode. As a result, in the tunnel-injection bipolar transistor, electric charge (hole) is rapidly implanted from the emitter region toward the base region due to the tunnel effect, and most of the electric charge (hole) implanted into the base region reaches the semiconductor substrate (substrate terminal Sub). Therefore, in the semiconductor element according to the first embodiment, a current that rapidly increases can be obtained at the drain terminal D. That is, in the semiconductor element according to the first embodiment, a larger current not obtained by the simplicial MOSFET can be obtained by combination of the MOSFET and the tunnel-injection bipolar transistor.

Figure 3:
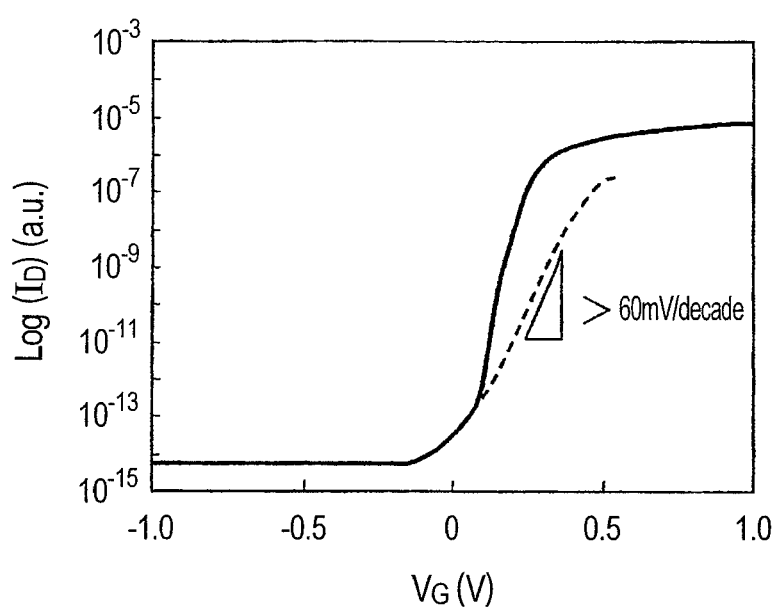
FIG. 3 is a graph illustrating a drain current to gate voltage characteristic of the semiconductor element according to the first embodiment.

Specifically, a description will be given of a relationship between a drain current and a gate voltage of the semiconductor element according to the first embodiment. FIG. 3 is a graph illustrating a drain current to gate voltage characteristic of the semiconductor element according to the first embodiment. The measurement is conducted by setting the drain potential $V_D$ to 0.6V, and setting the source potential Vs and a substrate potential $V_{sub}$ to 0V. Referring to FIG. 3, a solid curve represents a drain current to gate voltage characteristic of the semiconductor element according to the first embodiment, and a dashed curve represents a sub-threshold characteristic of the normal simplicial MOSFET for comparison.

As illustrated in FIG. 3, according to the drain current to gate voltage characteristic of the semiconductor element in the first embodiment, it is found that there is a rapid inclination more than that of 60 mV/decade which is a theoretical limitation of the existing simplicial MOSFET. That is, according to the first embodiment, there can be provided the semiconductor element having an excellent switching characteristic as compared with the simplicial MOSFET, that is, having a value smaller than 60 mV at a room temperature.

As is apparent from the above description of the operation, the gate potential $V_G$ with which the drain current rises depends on the threshold voltage of the MOSFET. For that reason, a rising position of the drain current can be easily adjusted through a technique such as the normal ion implantation. In the semiconductor element according to the first embodiment, because the S value smaller than 60 mV can be obtained, there can be realized the semiconductor element having the excellent switching characteristic.

As illustrated in the equivalent circuit of FIG. 1, the MOSFET and the tunnel-injection bipolar transistor are coupled with each other through a connection method known as a Darlington circuit. A configuration in which the MOSFET and the normal bipolar transistor are connected to each other has been widely used up to now. This is because with this configuration, an excellent response of a gate input which is an advantage of the MOSFET, and a high current drive performance which is an advantage of the bipolar transistor can be combined together.

However, in the existing normal bipolar transistor, because there is an injection barrier due to a built-in potential of the pn junction formed between the emitter region and the base region, the bipolar transistor cannot turn on at a low voltage. In the first embodiment, with the use of the tunnel-injection bipolar transistor having the tunnel junction, an input (gate voltage $V_G$) of the MOSFET to the gate electrode is subject to change larger than that of the drain current. Further, because the tunnel-injection bipolar transistor can be driven at the low voltage, according to the semiconductor element of the first embodiment, the switching characteristic excellent even at the low voltage can be obtained.

That is, in the normal bipolar transistor, even if a forward bias is applied to the pn junction due to the built-in potential of the pn junction formed in the boundary region of the emitter region and the base region, no current flows with the forward bias of a given voltage (rising voltage) or lower. For example, let us consider a case in which the MOSFET and the normal bipolar transistor are combined together as illustrated in FIG. 1. In this case, let us consider a case in which, for example, 0.3V is applied to the drain terminal D, and 0V is applied to the source terminal S with a reduction in the supply voltage. In this case, even if the gate voltage $V_G$ of the threshold voltage or higher is applied to the MOSFET to turn on the MOSFET, the forward bias of no more than 0.3V is applied between the emitter region and the base region of the normal bipolar transistor. In the normal bipolar transistor, when the forward bias is the given voltage (rising voltage) or lower, no current flows between the emitter region and the base region. For that reason, the normal bipolar transistor does not turn on, and the drain current cannot be ensured. That is, even if the MOSFET and the normal bipolar transistor are merely combined together, there cannot be obtained the semiconductor element having the excellent switching characteristic as compared with the simplicial MOSFET, that is, having the S value smaller than 60 mV at a room temperature.

On the contrary, let us consider a case in which the MOSFET and the tunnel-injection bipolar transistor are combined together as in the semiconductor element according to the first embodiment. In the tunnel-injection bipolar transistor, the pn junction formed in the boundary region between the emitter region and the base region is the tunnel junction. Even in the case of the tunnel junction, the built-in potential is present, but a current (tunnel current) flows due to the inter-band tunneling. That is, in the tunnel junction, when the forward bias is applied to the tunnel junction, a current caused by the inter-band tunneling flows even with the forward bias of the given voltage or lower.

For example, let us consider a case in which 0.3V is applied to the drain terminal D, and 0V is applied to the source terminal S with a reduction in the supply voltage. In this case, when the gate voltage $V_G$ of the threshold voltage or higher is applied to the MOSFET to turn on the MOSFET, the forward bias of 0.3V is applied between the emitter region and the base region of the tunnel-injection bipolar transistor. That is, the forward bias of 0.3V is applied to the tunnel junction formed in the boundary region between the emitter region and the base region. As described above, in the tunnel junction, the tunnel current caused by the inter-band tunneling flows even with a voltage (0.3V) of the given voltage or lower at which no current flows due to the built-in potential in the normal pn junction. From this fact, even if no more than the low voltage is applied to the drain terminal D, when the gate potential $V_G$ of the threshold voltage or higher is applied to the MOSFET to turn on the MOSFET, the tunnel-injection bipolar transistor also turns on so that a current flows between the emitter region and the base region, and a large drain current can be ensured. As a result, in the semiconductor element according to the first embodiment, the large drain current that cannot be ensured by the simplicial MOSFET can be obtained by the amplifying function of the tunnel-injection bipolar transistor. As a result, there can be obtained the drain current to gate voltage characteristic having a rapid inclination more than that of 60 mV/decade which is a theoretical limitation of the existing simplicial MOSFET. That is, according to the first embodiment, there can be provided the semiconductor element having the excellent switching characteristic as compared with the simplicial MOSFET, that is, having the S value smaller than 60 mV at a room temperature.

In particular, in the first embodiment, there are used the current amplifying function as the bipolar transistor of the tunnel-injection bipolar transistor, and such a characteristic that the tunnel current flows in the tunnel junction formed in the boundary region between the emitter region and the base region, by the inter-band tunneling even if the forward bias is the low voltage. As a result, there can be realized the semiconductor element having the S value smaller than 60 mV at a room temperature even with the low operating voltage.

<Description of Features of Device Structure According to the Present Invention>

Figure 4:
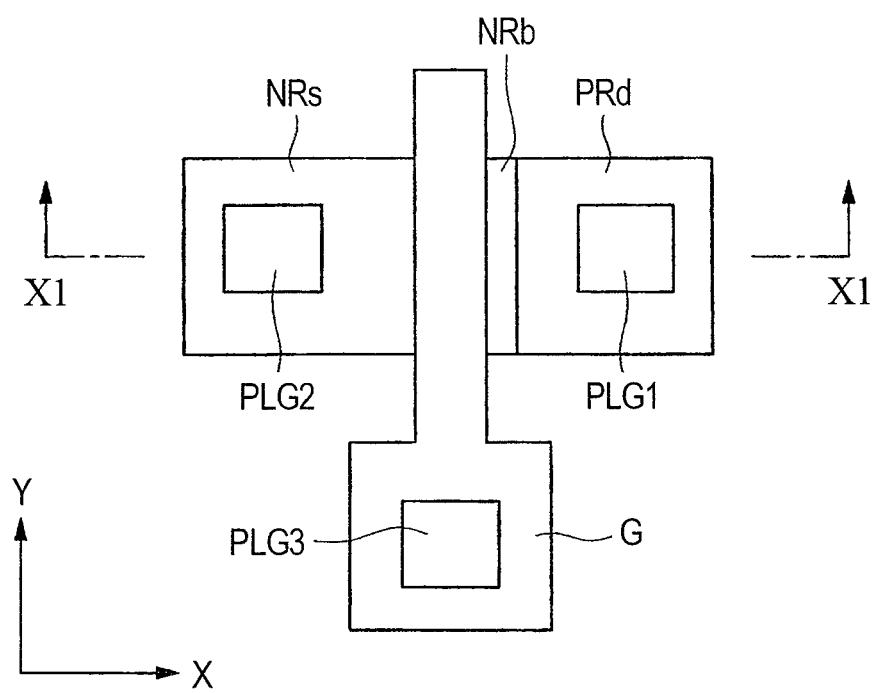
FIG. 4 is a plan view of the semiconductor element viewed from above according to the first embodiment.

Subsequently, a description will be given of the features of the present invention from the viewpoint of the device structure of the semiconductor element according to the present invention. FIG. 4 is a plan view of the semiconductor element viewed from above according to the first embodiment. Referring to FIG. 4, an n-type semiconductor region NRs and an n-type semiconductor region NRb are formed to be aligned at a distance from each other in an X-direction. A p-type semiconductor region PRd is formed on an upper portion of the n-type semiconductor region NRb. A plug PLG1 is formed to be electrically connected with the p-type semiconductor region PRd, and a plug PLG2 is formed to be electrically connected with the n-type semiconductor region NRs. Further, a gate electrode G is formed to extend in a Y-direction between the n-type semiconductor region NRs and the semiconductor region NRb which are arranged at a distance from each other. The gate electrode G is electrically connected to a plug PLG3 at one end of the gate electrode G.

Figure 5:
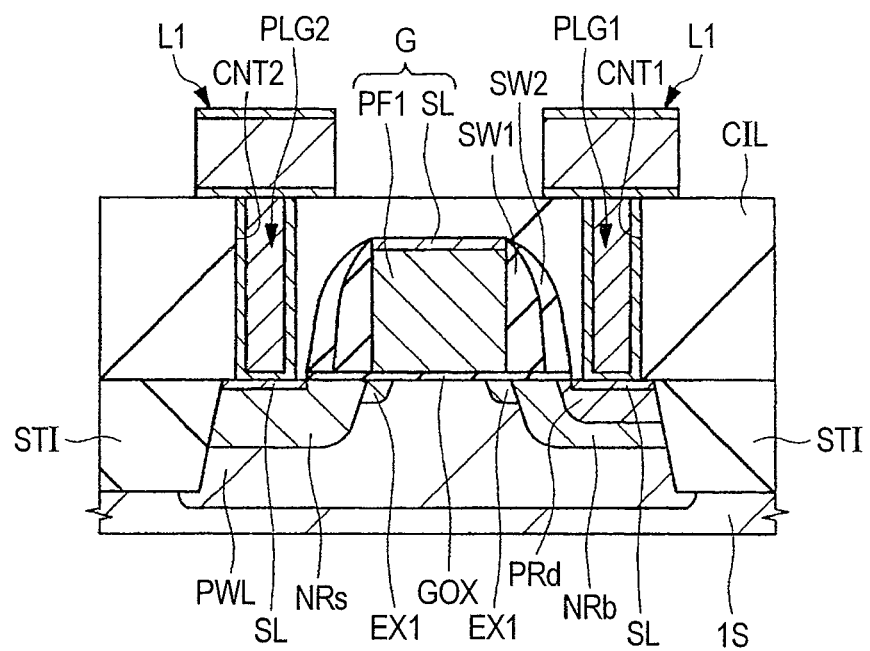
FIG. 5 is a cross-sectional view taken along a line X1-X1 in FIG. 4.

FIG. 5 is a cross-sectional view taken along a line X1-X1 in FIG. 4. As illustrated in FIG. 5, the semiconductor element according to the first embodiment is formed in an active region zoned by an element separation region STI formed on a semiconductor substrate 1S. Specifically, a p-type well PWL doped with a p-type impurity, for example, such as boron is formed within the semiconductor substrate 1S zoned by the element separation region STI. A pair of low-concentration n-type semiconductor regions EX1 is formed at a distance from each other within the p-type well PWL. Each of the low-concentration n-type semiconductor regions EX1 is formed of a semiconductor region doped with an n-type impurity such as phosphorus, and a region between the pair of low-concentration n-type semiconductor regions EX1 within the p-type well PWL serves as a channel region. The n-type semiconductor region NRs and the n-type semiconductor region NRb are formed outside of the low-concentration n-type semiconductor regions EX1. That is, the n-type semiconductor region NRs is formed on the left side of the left low-concentration n-type semiconductor region EX1 of the pair of low-concentration n-type semiconductor regions EX1, and the n-type semiconductor region NRb is formed on the right side of the right low-concentration n-type semiconductor region EX1 of the pair of low-concentration n-type semiconductor regions EX1. The n-type semiconductor region NRs and the n-type semiconductor region NRb are formed of semiconductor regions doped with an n-type impurity such as arsenic.

Further, in the semiconductor element according to the first embodiment, the p-type semiconductor region PRd is formed to be included within the n-type semiconductor region NRb. The p-type semiconductor region PRd is formed of a semiconductor region doped with a p-type impurity such as boron.

Then, a gate insulating film GOX is formed on the channel region, and the gate electrode G is formed on the gate insulating film GOX. The gate insulating film GOX is formed of, for example, a silicon oxide film. However, the gate insulating film GOX is not limited to this member, but may be formed of a high dielectric constant film higher in dielectric constant than the silicon oxide film, for example, such as a hafnium oxide film. Also, the gate electrode G is formed of, for example, a polysilicon film PF1 (n-type polysilicon film) doped with phosphorus, and a silicide film SL formed on the polysilicon film PF1. The silicide film SL is a film formed for decreasing a resistance of the gate electrode G, and the silicide film SL is formed of, for example, a cobalt silicide film, a titanium silicide film, a nickel silicide film, a platinum silicide film, or a nickel platinum silicide film.

A side wall SW1 is formed on both of side walls of the gate electrode G, and a side wall SW2 is formed outside of the side wall SW1. The silicide film SL is formed in a region outside of the side wall SW2. Specifically, the silicide film SL is formed on a surface of the n-type semiconductor region NRs that is exposed to an outside of the left side wall SW2. Also, the silicide film SL is formed on a surface of the p-type semiconductor region PRd that is exposed to an outside of the right side wall SW2.

The semiconductor element according to the first embodiment is configured as described above, and the semiconductor element includes the MOSFET and the tunnel-injection bipolar transistor. That is, the left low-concentration n-type semiconductor region EX1, the n-type semiconductor region NRs, and the silicide film SL form the source region of the MOSFET. The gate insulating film GOX formed on the channel region configures the gate insulating film of the MOSFET, and the gate electrode G formed on the gate insulating film GOX configures the gate electrode of the MOSFET. Further, the right low-concentration n-type semiconductor region EX1, and the n-type semiconductor region NRb form a connection region (drain region of the MOSFET) between the MOSFET and the tunnel-injection bipolar transistor.

The p-type semiconductor region PRd and the silicide film SL serve as the emitter region of the tunnel-injection bipolar transistor, and the right low-concentration n-type semiconductor region EX1 and the n-type semiconductor region NRb serve as the base region of the tunnel-injection bipolar transistor. The p-type well PWL and the semiconductor substrate 1S serve as the collector region of the tunnel-injection bipolar transistor. From the above description, the semiconductor element according to the first embodiment includes the MOSFET and the tunnel-injection bipolar transistor, and the MOSFET and the tunnel-injection bipolar transistor are electrically connected to each other so that the drain region of the MOSFET serves as the base region of the tunnel-injection bipolar transistor.

An inter-contact layer insulating film CIL formed of a silicon oxide film made of TEOS as a raw material is formed on the semiconductor substrate 1S covering the semiconductor element thus configured, as illustrated in FIG. 5. Then, a contact hole CNT1 is so formed as to penetrate through the inter-contact layer insulating film CIL and to reach the silicide film SL formed on a surface of the p-type semiconductor region PRd. Likewise, a contact hole CNT2 is so formed as to penetrate through the inter-contact layer insulating film CIL and to reach the silicide film SL formed on a surface of the n-type semiconductor region NRs. A titanium/titanium nitride layer forming a barrier conductor film, and a tungsten film formed on the barrier conductor film are buried in the interior of the contact hole CNT1 and the interior of the contact hole CNT2 to form the plug PLG1 and the plug PLG2. A line L1 is formed on the inter-contact layer insulating film CTL in which the plug PLG1 and the plug PLG2 are formed.

The line L1 is formed of, for example, a laminated film of a titanium nitride film, an aluminum film, and a titanium nitride film.

The feature of the semiconductor element according to the first embodiment resides in that the p-type semiconductor region PRd is formed to be included in the n-type semiconductor region NRb, and the tunnel junction is formed in the boundary region between the n-type semiconductor region NRb and the p-type semiconductor region PRd. With this configuration, for example, even if a low voltage is applied to the p-type semiconductor region PRd, the tunnel junction is formed between the p-type semiconductor region PRd and the n-type semiconductor region NRb. As a result, holes are implanted into the base region formed by the n-type semiconductor region NRb from the emitter region formed by the p-type semiconductor region PRd, and the holes that have been implanted into the base region are drawn into the collector region formed by the p-type well PWL (semiconductor substrate 1S), to thereby function as the tunnel-injection bipolar transistor. That is, in the semiconductor element according to the first embodiment, the MOSFET and the tunnel-injection bipolar transistor are connected to each other, and when the MOSFET turns on, the tunnel current flows between the emitter region and the base region of the tunnel-injection bipolar transistor by the inter-band tunneling even if the voltage is low. With this configuration, the large drain current that cannot be obtained by the simplicial MOSFET can be obtained by the amplifying function of the tunnel-injection bipolar transistor. As a result, according to the first embodiment, there can be provided the semiconductor element having the excellent switching characteristic as compared with the simplicial MOSFET, that is, having the S value smaller than 60 mV at a room temperature.

In order to turn on the normal bipolar transistor, the voltage of the given voltage (rising voltage) or higher must be applied between the emitter region and the base region. However, in the semiconductor element according to the first embodiment, the normal bipolar transistor is replaced with the tunnel-injection bipolar transistor. For that reason, even when the forward bias of the above-mentioned given voltage (rising voltage) or lower is applied between the emitter region and the base region of the tunnel-injection bipolar transistor, the tunnel-injection bipolar transistor can be turned on.

That is, according to the first embodiment, first, in the simplicial MOSFET, taking a fact that the S value cannot be set to the 60 V/decade or lower into consideration, the MOSFET and the bipolar transistor having the current amplifying function are combined together to obtain the semiconductor element which is 60 mV or lower in the S value. In this situation, the simple combination of the normal bipolar transistor cannot turn on the bipolar transistor with the forward bias of the given voltage (rising voltage) or lower, and therefore cannot deal with a reduction in the supply voltage. Taking this fact into consideration, the first embodiment focuses attention on the tunnel-injection bipolar transistor that can turn on with the forward bias of the given voltage (rising voltage) or lower. That is, according to the first embodiment, there can be obtained the semiconductor element having the low S value that cannot be obtained by the simplicial MOSFET with respect to a change in the gate voltage, with the use of the current amplifying function of the bipolar transistor by combining the MOSFET and the bipolar transistor together. In particular, according to the first embodiment, in order to deal with a reduction in the supply voltage, the normal bipolar transistor is not used, but the tunnel-injection bipolar transistor is used as the bipolar transistor, to thereby turn on even when the supply voltage is low. As a result, there can be obtained the semiconductor element that enables the low voltage operation, and is 60 mV/decade or lower in the S value.

Figure 6:
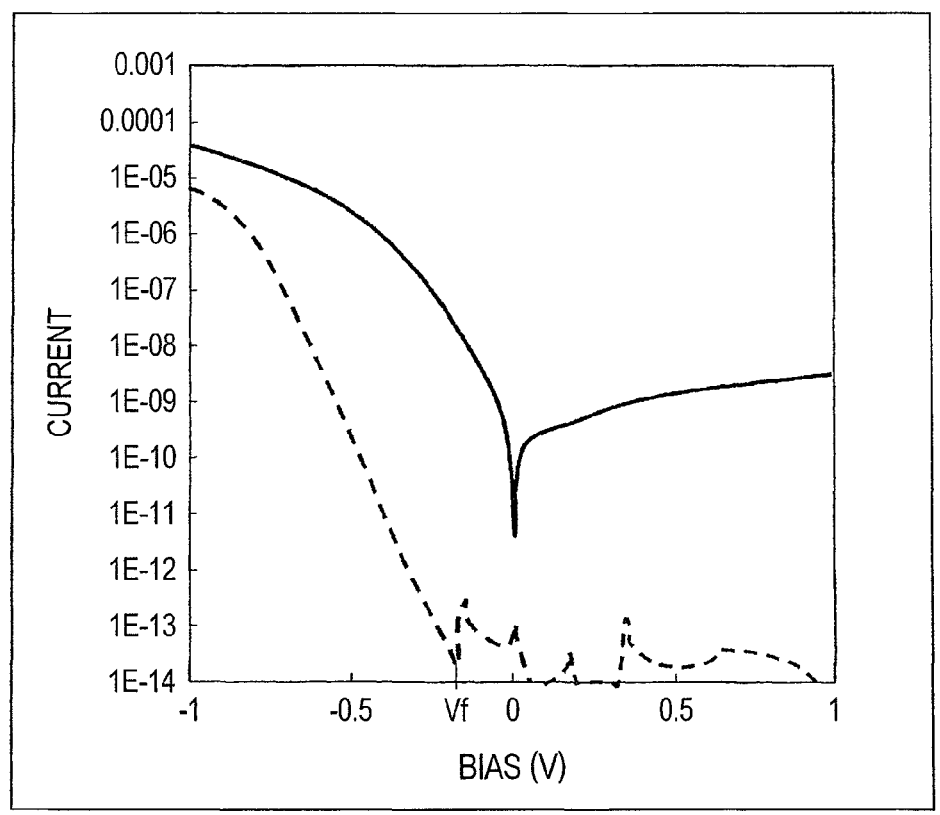
FIG. 6 is a graph illustrating a relationship between a voltage to be applied to a junction, and an absolute value of a current flowing in the junction in a normal pn junction and a tunnel junction.

Hereinafter, a description will be given of a difference of characteristics between the pn unction of the normal bipolar transistor and the tunnel junction of the tunnel-injection bipolar transistor in the first embodiment. FIG. 6 is a graph illustrating a relationship between a voltage to be applied to the junction, and an absolute value of a current flowing in the junction. A solid line represents the tunnel junction according to the first embodiment, and a dashed line represents the normal pn junction. Referring to FIG. 6, the axis of abscissa represents a voltage to be applied to the junction. In this case, a forward voltage represents that a reverse bias is applied to the junction, and a backward voltage represents that a forward bias is applied to the junction. On the other hand, the axis of ordinate represents an absolute value of a current flowing in the junction by logarithmic expression.

First, a description will be given of the characteristics of the normal pn junction indicated by a dashed line. As illustrated in FIG. 6, if the reverse bias is applied to the normal pn junction, it is found that a current value is $1\times10^{13}$ (1E-13) A or lower, and a current hardly flows. Then, let us consider a case in which the forward bias is applied to the normal pn junction. In this case, it is found that a current hardly flows if the forward bias is Vf or lower in FIG. 6, and a current rapidly flows into the normal pn junction (forward current) if a magnitude of the forward bias exceeds Vf. From the above description, the normal pn junction can be defined as a junction having characteristics that a current (backward current) hardly flows therein when the reverse bias is applied thereto, no current flows if the forward bias is the given voltage (rising voltage) (Vf) or lower even when the forward bias is applied thereto, and a current (forward current) flows for the first time when the forward bias exceeds the given voltage (Vf).

Subsequently, a description will be given of the characteristics of the tunnel junction indicated by the solid line according to the first embodiment. As illustrated in FIG. 6, it is found that when the reverse bias is applied to the tunnel junction, even if the reverse bias is increased, the current value is suppressed to $1\times10^{-9}$ (1E-13) A or lower. That is, in the tunnel junction indicated by the solid line, there is a tendency to increase the backward current more than the normal pn junction indicated by the dashed line. Nevertheless, since the current value is suppressed to a given value or lower even if the backward bias is increased, it is found that this tunnel junction also has a given current suppression function (rectifying function) with respect to the reverse bias. On the other hand, let us consider a case in which the forward bias is applied to the tunnel junction. In this case, it is found that a current (forward current) rapidly flows when the forward bias becomes larger than 0 V. That is, it is found that, in the tunnel junction, even when the forward bias of the given voltage or lower is applied thereto, a current (forward current) flows therein. That is, in the normal pn junction, the current (forward current) hardly flows therein when the forward bias is the given voltage (Vf) or lower. On the contrary, in the tunnel junction, a large current (forward current) flows therein even when the forward bias is the given voltage (Vf) or lower. In this aspect, the tunnel junction is largely different from the normal pn junction. From the above description, the tunnel junction according to the first embodiment can be defined as a junction that not the current hardly flows therein, but the forward current flows therein even when the forward bias of the given voltage (Vf) or lower is applied in the forward direction, and the given current suppression function is provided when the reverse bias is applied thereto.

Thus, there are large differences between the characteristic of the normal pn junction and the characteristic of the tunnel junction in the first embodiment, and a mechanism caused by the differences will be described below.

Figure 7:
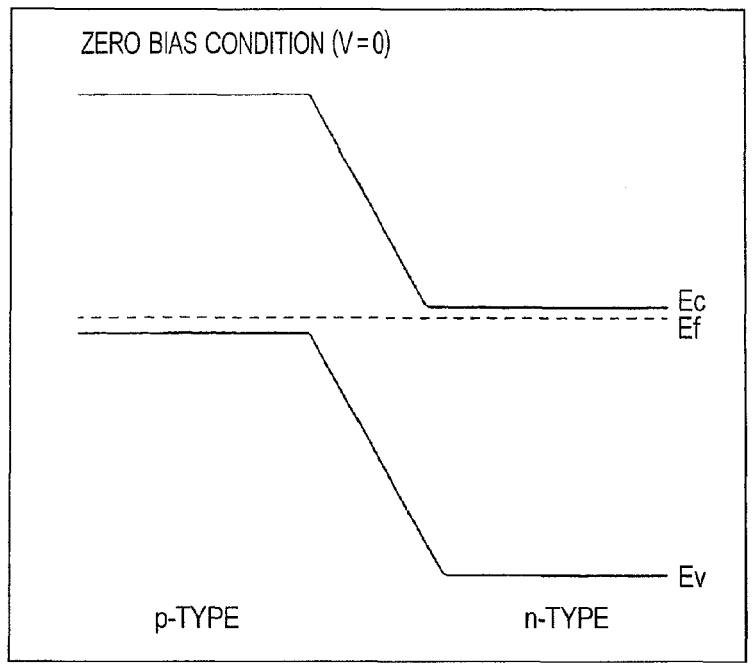
FIG. 7 is a band diagram when no voltage is applied to the normal pn junction.

First, a description will be given the forward characteristic in the normal pn junction with reference to a band diagram. FIG. 7 is a band diagram when no voltage is applied to the normal pn junction (V=0). A left region of FIG. 7 represents a p-type semiconductor region, and a right region of FIG. 7 represents an n-type semiconductor region. In this situation, the impurity concentration of the p-type semiconductor region and the impurity concentration of the n-type semiconductor region, which form the normal pn junction, are as low as those concentrations are not degenerate. Therefore, a Fermi level Ef of the p-type semiconductor region is present immediately above a valence band Ev, and the Fermi level Ef of the n-type semiconductor region is present immediately above a valence band Ec. In a zero bias condition (V=0), the Fermi level Ef of the p-type semiconductor region matches the Fermi level Ef of the n-type semiconductor region. Therefore, as illustrated in FIG. 7, a built-in potential is present in the normal pn junction.

Figure 8:
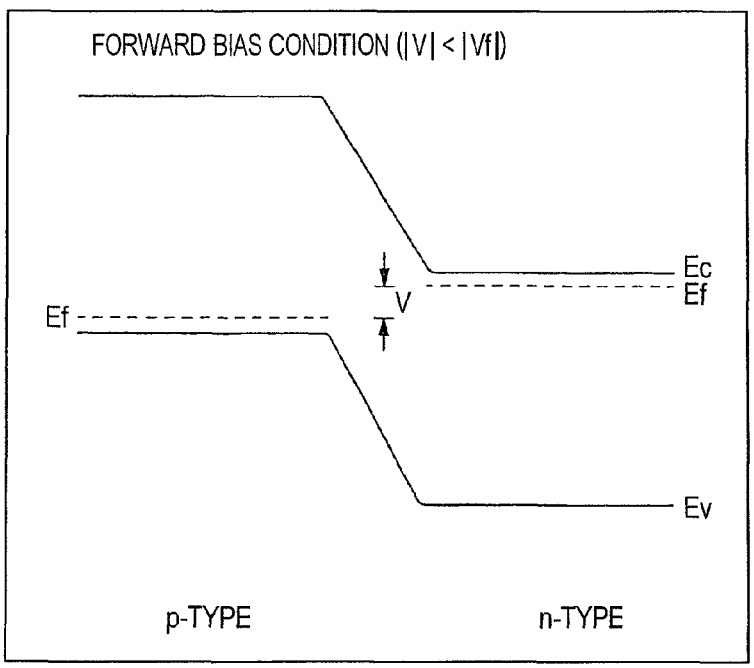
FIG. 8 is a band diagram when a forward bias of a given voltage or lower is applied thereto.

FIG. 8 is a band diagram when a forward bias ($|V|<|Vf|$) of the given voltage (Vf) or lower is applied thereto. As illustrated in FIG. 8, when the forward bias of the given voltage (Vf) or lower is applied, a potential difference occurs between the Fermi level Ef of the p-type semiconductor region and the Fermi level Ef of the n-type semiconductor region, and the built-in potential becomes smaller than the built-in potential of the zero bias condition. However, a magnitude of the built-in potential is still large. This makes it difficult that electrons in the valence band Ec of the n-type semiconductor region move beyond a built-in potential, and diffuse into a conduction band Ec of the p-type semiconductor region, and that holes in the valence band Ev of the p-type semiconductor region move beyond the built-in potential, and diffuse into the valence band Ev of the n-type semiconductor region. From this fact, it is found that when the forward bias ($|V|<|Vf|$) of the given voltage (Vf)) or lower is applied, a current (forward current) hardly flows from the p-type semiconductor region to the n-type semiconductor region in the normal pn junction.

Figure 9:
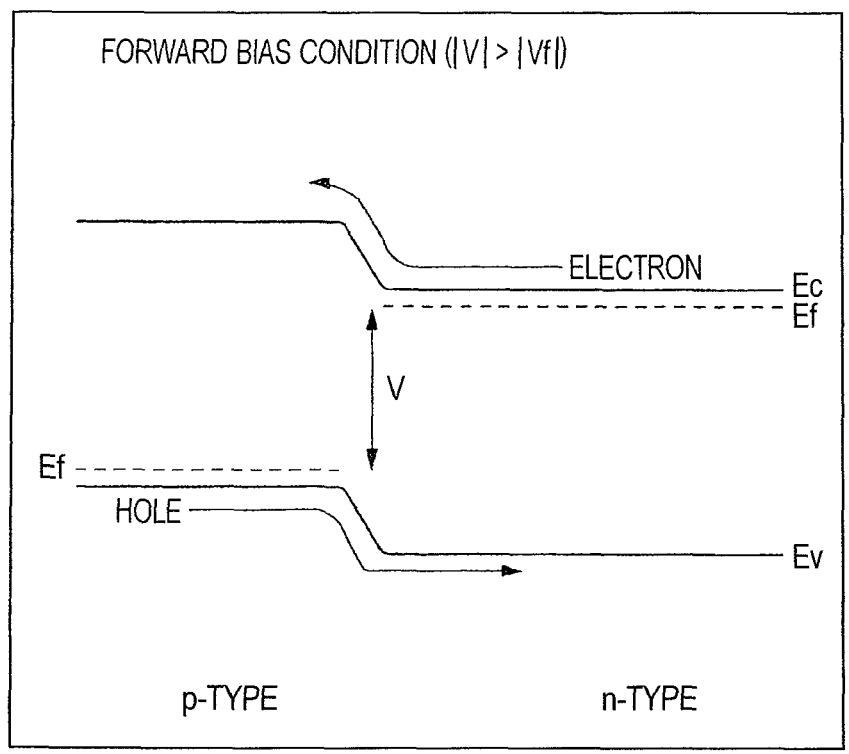
FIG. 9 is a band diagram when the forward bias larger than the given voltage is applied thereto.

FIG. 9 is a band diagram when the forward bias ($|V|>|Vf|$) larger than the given voltage (Vf) is applied thereto. As illustrated in FIG. 9, it is found that with the application of the forward bias larger than the given voltage (Vf), the potential difference $|V|$ occurs between the Fermi level Ef of the p-type semiconductor region and the Fermi level Ef of the n-type semiconductor region, and the built-in potential becomes sufficiently smaller than the built-in potential of the zero bias condition. For that reason, the electrons in the conduction band Ec of the n-type semiconductor region easily move beyond the built-in potential, and diffuse into the conduction band Ec of the p-type semiconductor region. Likewise, the holes in the valence band Ev of the p-type semiconductor region move beyond the built-in potential, and diffuse into the valence band Ev of the n-type semiconductor region. From this fact, it is found that the forward bias ($|V|>|Vf|$) larger than the given voltage (Vf) is applied thereto, a current (forward current) flows from the p-type semiconductor region into the n-type semiconductor region in the normal pn junction. Accordingly, the normal pn junction has such characteristics that even when the forward bias is applied thereto, no current flows therein if the forward bias is the given voltage (rising voltage) (Vf) or lower, and the current (forward current) flows for the first time when the forward bias exceeds the given voltage (Vf).

Figure 10:
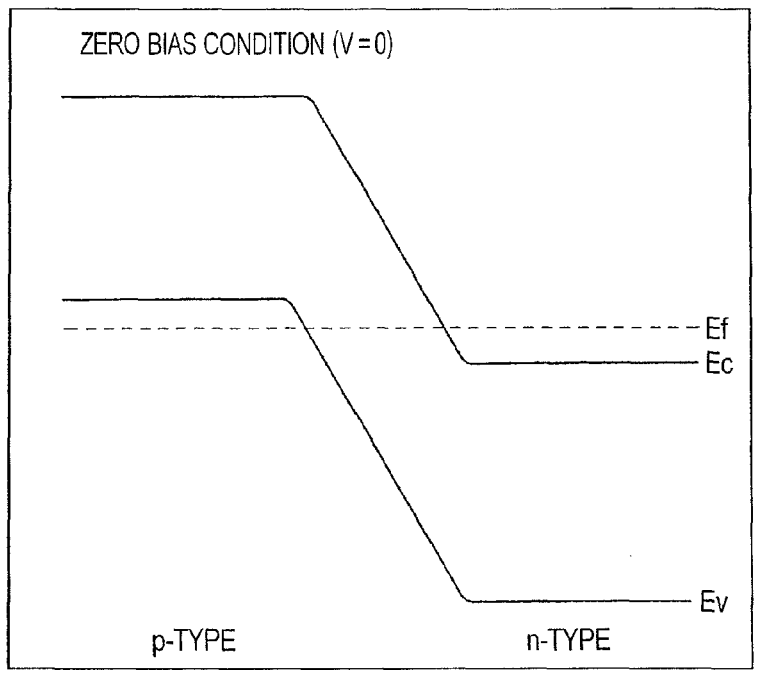
FIG. 10 is a band diagram when no voltage is applied to the tunnel junction.

Subsequently, the forward characteristics in the tunnel junction will be described with reference to the band diagrams. FIG. 10 is a band diagram when no voltage is applied to the tunnel junction (V=0). A left region of FIG. 10 represents the p-type semiconductor region, and a right region of FIG. 10 represents the n-type semiconductor region. The impurity concentration of the p-type semiconductor region and the impurity concentration of the n-type semiconductor region, which form the tunnel junction, are as high as those concentrations are degenerate. Therefore, the Fermi level Ef of the p-type semiconductor region enters the interior of the valence band Ev, and the Fermi level Ef of the n-type semiconductor region enters the interior of the valence band Ec. In the zero bias condition (V=0), since the Fermi level Ef of the p-type semiconductor region and the Fermi level Ef of the n-type semiconductor region match each other, the built-in potential is present even in the tunnel junction, as illustrated in FIG. 10.

Figure 11:
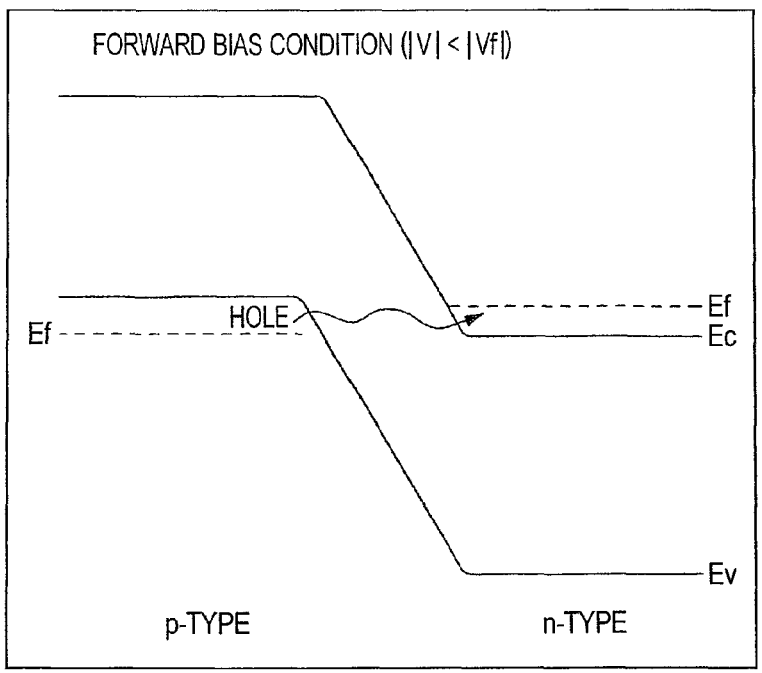
FIG. 11 is a band diagram when the forward bias of the given voltage or lower is applied thereto.

FIG. 11 is a band diagram when the forward bias ($|V|<|Vf|$) of the given voltage (Vf) or lower is applied thereto. As illustrated in FIG. 11, with the application of the forward bias of the given voltage (Vf) or lower, the potential difference $|V|$ occurs between the Fermi level Ef of the p-type semiconductor region and the Fermi level Ef of the n-type semiconductor region. In this situation, in the tunnel junction, the Fermi level Ef of the p-type semiconductor region enters the interior of the valence band Ev, and the Fermi level Ef of the n-type semiconductor region enters the interior of the conduction band Ec. Therefore, an overlap occurs between the valence band Ev of the p-type semiconductor region and the conduction band Ec of the n-type semiconductor region. That is, an empty level existing in the p-type semiconductor region opposes the filled level existing in the n-type semiconductor region at the same energy level. Then, in the tunnel junction, the impurity concentration of the p-type semiconductor region and the impurity concentration of the n-type semiconductor region become as high as those concentrations are degenerate. Therefore, a depletion layer formed in the tunnel junction becomes very narrow, and an electric field in the tunnel junction becomes extremely large. Accordingly, in the tunnel junction, the occurrence conditions of the inter-band tunneling are satisfied between the empty level (valence band Ev) and the satisfied level (conduction band Ec), which are separated by the narrow built-in potential having a finite height. For example, as illustrated in FIG. 11, holes existing in the p-type semiconductor region tunnel from the valence band Ev of the p-type semiconductor region to the conduction band Ec of the n-type semiconductor region by the inter-band tunneling. Likewise, electrons existing in the n-type semiconductor region tunnel from the conduction band Ec of the n-type semiconductor region to the valence band Ev of the p-type semiconductor region by the inter-band tunneling. As a result, it is found that in the tunnel junction, even when the forward bias ($|V|<|Vf|$) of the given voltage (Vf) or lower is applied thereto, the current (forward current) flows by the inter-band tunneling.

Figure 12:
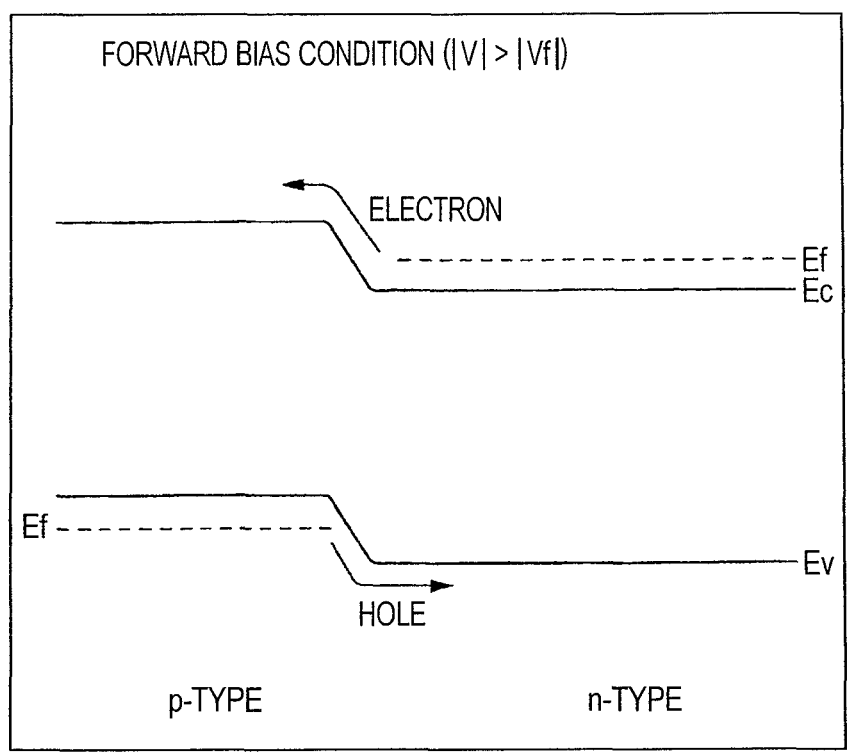
FIG. 12 is a band diagram when the forward bias larger than the given voltage is applied thereto.

FIG. 12 is a band diagram when the forward bias ($|V|>|Vf|$) larger than the given voltage (Vf) is applied thereto. As illustrated in FIG. 12, it is found that with the application of the forward bias larger than the given voltage (Vf), the potential difference $|V|$ occurs between the Fermi level Ef of the p-type semiconductor region and the Fermi level Ef of the n-type semiconductor region, and the built-in potential becomes sufficiently smaller than the built-in potential of the zero bias condition. For that reason, the electrons in the conduction band Ec of the n-type semiconductor region easily move beyond the built-in potential, and diffuse into the conduction band Ec of the p-type semiconductor region. Likewise, the holes in the valence band Ev of the p-type semiconductor region move beyond the built-in potential, and diffuse into the valence band Ev of the n-type semiconductor region. From this fact, it is found that when the forward bias ($|V|>|Vf|$) larger than the given voltage (Vf) is applied thereto, a current (forward current) flows from the p-type semiconductor region into the n-type semiconductor region in the tunnel junction. Accordingly, the tunnel junction has such a characteristic that even when the forward bias of the given voltage (Vf) or lower is applied in the forward direction, the forward current flows therein.

In the semiconductor element according to the first embodiment, as illustrated in FIG. 5, the junction formed in the boundary region between the p-type semiconductor region PRd and the n-type semiconductor region NRb is formed in the above-mentioned tunnel junction as illustrated in FIG. 5. From this fact, the impurity concentration of the p-type semiconductor region PRd and the impurity concentration of the n-type semiconductor region NRb need to be as high as those concentrations are degenerate. However, in the first embodiment, the impurity concentration of the n-type semiconductor region NRb needs to be as low as possible to the extent where the concentration is degenerate. The reason will be described.

As illustrated in FIG. 5, the semiconductor element according to the first embodiment includes the tunnel-injection bipolar transistor with the p-type semiconductor region PRd as the emitter region, the n-type semiconductor region NRb as the base region, and the p-type well PWL (semiconductor substrate 1S) as the collector region. In this case, the tunnel junction is formed between the p-type semiconductor region PRd which is the emitter region, and the n-type semiconductor region NRb which is the base region. When the forward bias is applied between the base region and the base region of the tunnel-injection bipolar transistor, an emitter current flows from the emitter region into the base region. The emitter current is a current attributable to the inter-band tunneling in the tunnel junction, and includes a hole current flowing from the emitter region (p-type semiconductor region PRd) into the base region (n-type semiconductor region NRb), and an electronic current flowing from the base region (n-type semiconductor region NRb) into the emitter region (p-type semiconductor region PRd).

In this situation, when the semiconductor element is considered as the tunnel-injection bipolar transistor, it is desirable that most of the emitter current is the hole current from the viewpoint that the amplification factor of the tunnel-injection bipolar transistor is increased. That is, most of the hole current implanted from the emitter region into the base region is drawn into the collector region to conduct the amplifying operation of the tunnel-injection bipolar transistor. On the other hand, the electronic current implanted from the base region into the emitter region does not contribute to the amplifying operation of the tunnel-injection bipolar transistor. Accordingly, the amplification factor of the tunnel-injection bipolar transistor can be improved more when the hole current flowing from the emitter region into the base region is increased, and the electronic current flowing from the base region into the emitter region is decreased as much as possible. This represents that it is desirable that an emitter implantation efficiency (hole current/(hole current+electronic current)) is brought as close as possible to 1.

In this example, in the tunnel-injection bipolar transistor, an improvement in the emitter implantation efficiency can be realized by decreasing the impurity concentration of the base region, and increasing the impurity concentration of the emitter region. Accordingly, from the viewpoint of a need to form the junction formed in the boundary region between the p-type semiconductor region PRd and the n-type semiconductor region NRb by the tunnel junction, there is a need to make the impurity concentration of the n-type semiconductor region NRb, which becomes the base region, as high as the impurity concentration is degenerate. On the other hand, when the semiconductor element is considered as the tunnel-injection bipolar transistor, it is not desirable to lessen the impurity concentration of the n-type semiconductor region NRb, which becomes the base region. From the above description, it is desirable that the impurity concentration of the n-type semiconductor region NRb is as low as possible to the extent where the concentration is degenerate. For that reason, according to the first embodiment, the impurity concentration of the n-type semiconductor region NRb, which becomes the base region, is made lower than the impurity concentration of the p-type semiconductor region PRd, which becomes the emitter region. Specifically, according to the first embodiment, the impurity concentration of the p-type semiconductor region PRd is a factor of $10^{20}/cm^3$, and the impurity concentration of the n-type semiconductor region NRb is a factor of $10^{19}/cm^3$.

Figure 13:
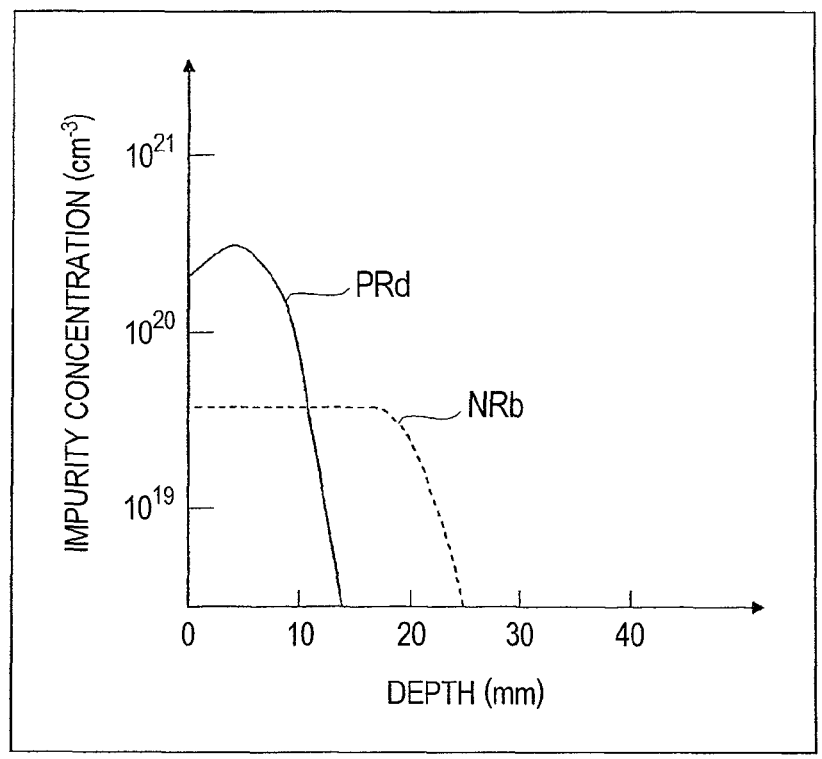
FIG. 13 is a graph illustrating impurity profiles of a p-type semiconductor region and an n-type semiconductor region.

FIG. 13 is a graph illustrating the impurity profiles of the p-type semiconductor region PRd and the n-type semiconductor region NRb. Referring to FIG. 13, the axis of abscissa represents a depth (substrate depth) from the semiconductor substrate, and the axis of ordinate represents the impurity concentration. As illustrated in FIG. 13, the p-type semiconductor region PRd is formed with the depth of about 0 nm to 15 nm, and a peak of the impurity concentration (boron concentration) of the p-type semiconductor region PRd is a factor of $10^{20}/cm^3$. On the other hand, the n-type semiconductor region NRb is formed with the depth of about 0 nm to 25 nm, and a peak of the impurity concentration (arsenic concentration) of the n-type semiconductor region NRb is a factor of $10^{19}/cm^3$.

As described above, according to the first embodiment, the tunnel junction is formed by the p-type semiconductor region PRd and the n-type semiconductor region NRb, and the impurity concentration of the n-type semiconductor region NRb is made lower than the impurity concentration of the p-type semiconductor region PRd, to thereby improve the impurity concentration of the tunnel-injection bipolar transistor. The tunnel junction according to the first embodiment has such a characteristic that the p-type semiconductor region PRd and the n-type semiconductor region NRb are degenerated so that the forward current flows due to the inter-band tunneling even if the forward bias of the given voltage (Vf) or lower is applied in the forward direction. The impurity concentration of the n-type semiconductor region NRb is made lower than the impurity concentration of the p-type semiconductor region PRd, to thereby exert the current suppression function when the reverse bias is applied thereto. That is, in the semiconductor element according to the first embodiment, a configuration in which the impurity concentration of the n-type semiconductor region NRb is made lower than that the impurity concentration of the p-type semiconductor region PRd is made for the purpose of improving the emitter implantation efficiency from the viewpoint of the tunnel-injection bipolar transistor. On the other hand, in this configuration, the impurity concentration of the n-type semiconductor region NRb is as low as possible from the viewpoint of the tunnel junction. Therefore, a depletion layer extends when the reverse bias is applied, as a result of which the inter-band tunneling when the reverse bias is applied is suppressed, and the backward current is suppressed. Accordingly, in the tunnel junction according to the first embodiment, even if the forward bias of the given voltage (Vf) or lower is applied in the forward direction, not a current hardly flows therein, but the forward current flows therein, and the given current suppression function is provided when the reverse bias is applied thereto.

As a method of improving the characteristic of the tunnel junction, there has been known a technique in which a heterostructure is taken with the use of crystal of germanium or silicon germanium narrow in band gap, and the technique can be applied to the first embodiment.

<Method for Manufacturing Semiconductor Device According to First Embodiment>

The semiconductor device according to the first embodiment is configured as described above, and a method for manufacturing the semiconductor device will be described below with reference to the drawings.

Figure 14:
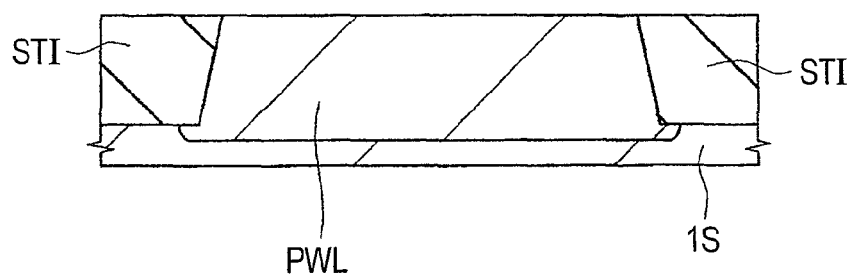
FIG. 14 is a cross-sectional view illustrating a process of manufacturing the semiconductor device according to the first embodiment.

First, as illustrated in FIG. 14, after a silicon oxide film of, for example, 10 nm has been formed on a surface of the semiconductor substrate (p-type silicon substrate) 1S with the use of a thermal oxidation method, a silicon nitride film of 100 nm is deposited thereon with the use of a CVD (chemical vapor deposition) method. Then, an active region is patterned with the use of a photolithography technique. Thereafter, the silicon nitride film and the silicon oxide film have been anisotropically etched in a direction perpendicular to a main surface (substrate surface) of the semiconductor substrate 1S with the use of a dry etching technique. Thereafter, the semiconductor substrate 1S is further anisotropically etched to form a trench having a depth of, for example, 300 nm, in the semiconductor substrate 1S.

Subsequently, a silicon surface exposed to the interior of the trench is oxidized to form a silicon oxide film of 5 nm, and a silicon oxide film of 700 nm is further deposited on the semiconductor substrate 1S through the CVD method. Then, with the user of a CMP (chemical mechanical polishing) method, the deposited silicon oxide film is polished with the silicon nitride film as an underlying mask to remove the silicon oxide film deposited on the semiconductor substrate 1S except for the interior of the groove. Thereafter, the silicon nitride film used as the mask is removed by wet etching using thermal phosphoric acid. In the manner described above, an element separation region ST1 can be formed on the main surface side of the semiconductor substrate 1S.

Then, p-type impurities, for example, such as boron (B) are introduced into the semiconductor substrate 1S with the use of the ion implantation method and a heat treatment to form the p-type well PWL in which the impurity concentration in the vicinity of the substrate surface is set to $8\times10^{17}/cm^{-3}$. A threshold value of the MOSFET can be adjusted by setting the impurity concentration profile in the p-type well PWL. The silicon oxide film that has been formed under the silicon nitride film is removed by hydrofluoric acid to expose a surface (silicon surface) of the semiconductor substrate 1S.

Figure 15:
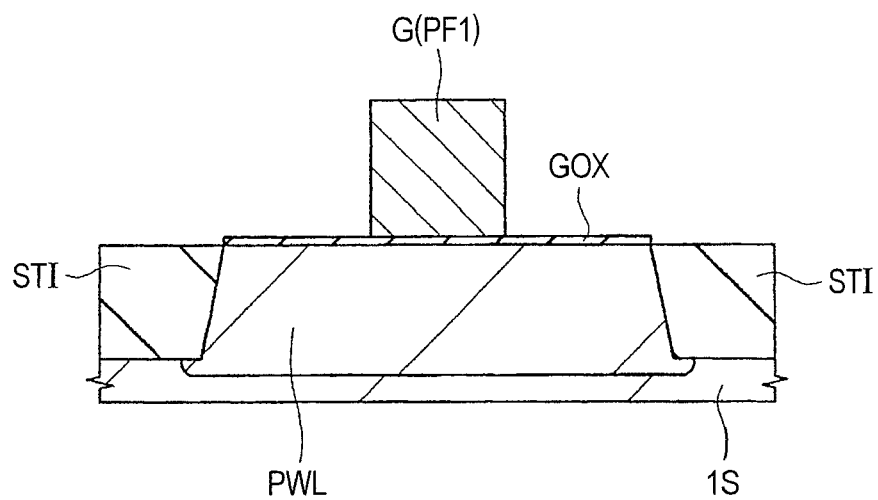
FIG. 15 is a cross-sectional view illustrating the process of manufacturing the semiconductor device subsequent to FIG. 14.

Subsequently, as illustrated in FIG. 15, the gate insulating film GOX of, for example, 3 nm is formed in the active region with the use of the thermal oxidation method. The gate insulating film GOX is formed of, for example, a silicon oxide film. However, the gate insulating film GOX is not limited to this film, but may be formed of a high dielectric film higher in dielectric constant than the silicon oxide film. Thereafter, the polysilicon film PF1 is deposited in thickness of about 100 nm on the gate insulating film GOX with the use of the CVD method. In this situation, the polysilicon film PF1 is doped with phosphorus with a high concentration with the use of an in-situ doping method or the ion implantation method. Then, the polysilicon film PF1 is patterned with the use of the photolithography technique and the dry etching method. Specifically, a resist film formed on the polysilicon film PF1 is patterned with the use of the photolithography technique. Then, the polysilicon film PF1 is dry-etched with the patterned resist film as a mask. In this way, the polysilicon film PF1 is anisotropically etched in a direction perpendicular to the substrate surface of the semiconductor substrate 1S to form the gate electrode G formed of the polysilicon film PF1.

Figure 16:
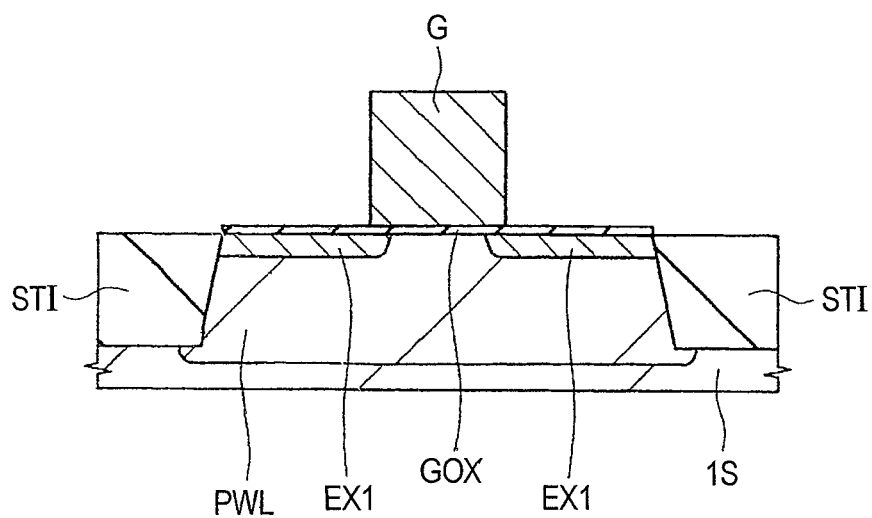
FIG. 16 is a cross-sectional view illustrating the process of manufacturing the semiconductor device subsequent to FIG. 15.
Figure 17:
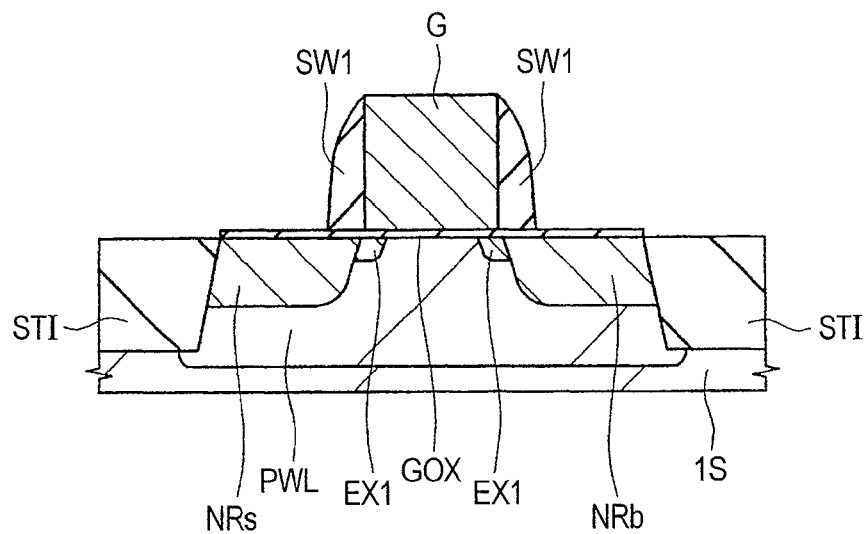
FIG. 17 is a cross-sectional view illustrating the process of manufacturing the semiconductor device subsequent to FIG. 16.

Then, as illustrated in FIG. 16, the low-concentration n-type semiconductor regions EX1 matching the gate electrode G is formed within the semiconductor substrate 1S with the use of the photolithography technique and the ion implantation method. Then, as illustrated in FIG. 17, a silicon oxide film is deposited in thickness of about 50 nm on the semiconductor substrate 1S covering the gate electrode G through the CVD method, and the deposited silicon oxide film is anisotropically etched to form the side wall SW1 on both of side walls of the gate electrode G.

Thereafter, the semiconductor substrate 1S is doped with arsenic with an acceleration energy of 25 keV, and a dose amount of about $5\times10^{14}/cm^2$ with the gate electrode G forming the side wall SW1 as a mask. With this processing, the n-type semiconductor region NRs and the n-type semiconductor region NRb can be formed. Thereafter, the introduced impurities (arsenic) may be activated by a heat treatment. In this situation, in implementing the ion implantation method, the gate electrode G forming the side wall SW1 as well as the resist film is patterned into a mask for the ion implantation method. In this case, the n-type semiconductor region NRs and the n-type semiconductor region NRb can be made different in impurity concentration from each other.

Figure 18:
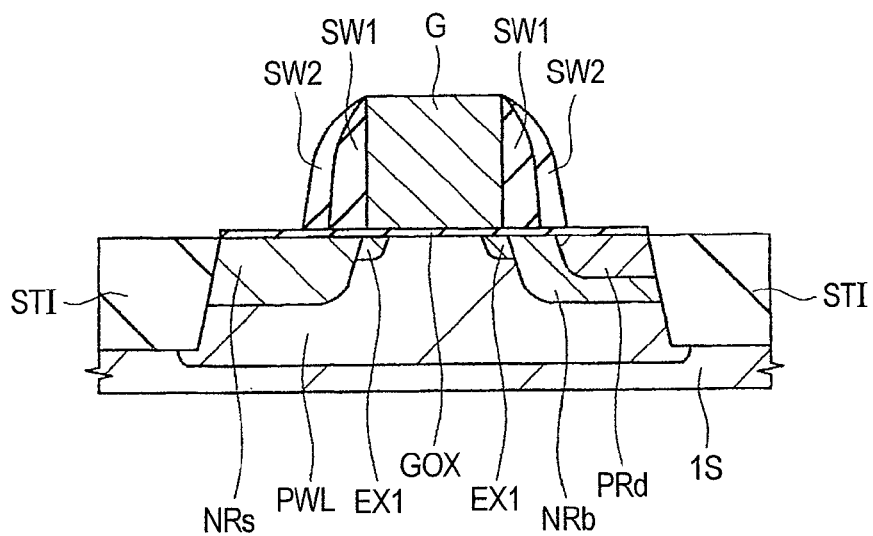
FIG. 18 is a cross-sectional view illustrating the process of manufacturing the semiconductor device subsequent to FIG. 17.

Subsequently, as illustrated in FIG. 18, a silicon oxide film is deposited in thickness of about 50 nm on the semiconductor substrate 1S covering the gate electrode G through the CVD method. Then, the deposited silicon oxide film is anisotropically etched to form the side wall SW2 outside of the side wall SW1. Then, with the use of the photolithography technique and the ion implantation method, the p-type semiconductor region PRd is formed to be included in the n-type semiconductor region NRb. In this situation, in the ion implantation method, the p-type semiconductor region PRd is doped with boron (B) which is the p-type impurities with the acceleration energy of 2 keV and the dose amount of about $2\times10^{15}/cm^2$.

Thereafter, a high-temperature activation treatment is conducted in a short time with the use of laser spike annealing (ISA). As a result, for example, the n-type semiconductor region NRb and the p-type semiconductor region PRd are formed to have the impurity profiles as illustrated in FIG. 13. As a result, the tunnel junction can be formed in the boundary region between the n-type semiconductor region NRb and the p-type semiconductor region PRd.

One feature of the present invention resides in that the p-type semiconductor region PRd can be formed within the n-type semiconductor region NRb in a self-aligning manner. Since the p-type semiconductor region PRd is formed to be included in the n-type semiconductor region NRb, even if the p-type semiconductor region PRd is newly formed, the semiconductor element according to the first embodiment can be formed with the same size as that of the simplicial MOSFET. For that reason, there is advantageous in that the semiconductor element according to the first embodiment can be formed with the same integration degree as that of the simplicial MOSFET without affecting the integration degree.

In the semiconductor element according to the first embodiment, even if a positive voltage (for example, 0.6 V) is applied to the drain region which is the p-type semiconductor region PRd, because only the n-type semiconductor region NRb of the opposite conduction type contacts with the p-type well PWL (semiconductor substrate 1S), no leakage current caused by the forward bias occurs between the n-type semiconductor region NRb and the semiconductor substrate 1S. Further, the characteristics of the tunnel junction formed by the p-type semiconductor region PRd and the n-type semiconductor region NRb can be changed by adjusting the implantation energy of the impurities to be implanted into the p-type semiconductor region PRd and the n-type semiconductor region NRb.

Also, the drawing of the electric charge (holes), which has been implanted into the n-type semiconductor region NRb from the p-type semiconductor region PRd, into the semiconductor substrate 1S can be controlled by adjusting the vertical impurity distributions of the p-type semiconductor region PRd and the n-type semiconductor region NRb, that is, the effective thickness of the n-type semiconductor region NRb (base region), as well as the lateral width, that is, the width of the side wall SW2, and the impurity profile of the channel region. That is, the drawing efficiency can be improved by lessening the width of the n-type semiconductor region NRb (base region). On the other hand, the leakage current can be reduced by increasing the width of the n-type semiconductor region NRb (base region). Also, the drawing efficiency can be improved by lessening the width of the side wall SW2, and the drawing efficiency can be improved by increasing the impurity concentration of the channel region.

Figure 19:
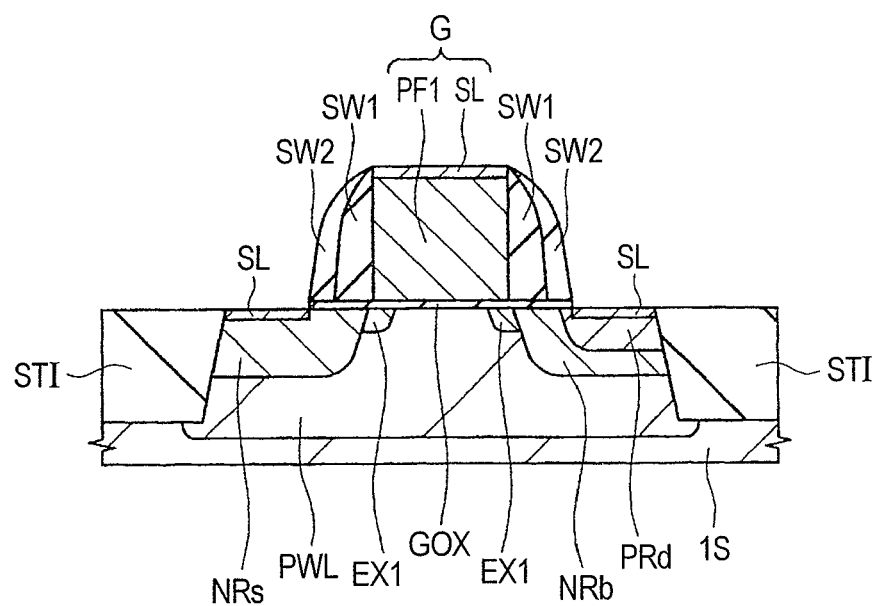
FIG. 19 is a cross-sectional view illustrating the process of manufacturing the semiconductor device subsequent to FIG. 18.

Then, as illustrated in FIG. 19, the silicide film SL is selectively formed on an upper surface of the gate electrode G, a surface of the p-type semiconductor region PRd, and a surface of the n-type semiconductor region NRs with the side wall SW2 as a mask. With this configuration, the gate electrode G, the p-type semiconductor region PRd, and the n-type semiconductor region NRs can be reduced in resistance. This is a normal process known as a salicide process. The silicide film SL can be formed of, for example, a cobalt silicide film, a titanium silicide film, a nickel silicide film, a platinum silicide film, or a nickel platinum silicide film.

Thereafter, as illustrated in FIG. 5, a wiring process used in the normal LSI is conducted to obtain the semiconductor element in the first embodiment. Specifically, as illustrated in FIG. 5, the inter-contact layer insulating film CIL formed of, for example, the silicon oxide film, is formed on the semiconductor substrate 1S, and an upper surface of the inter-contact layer insulating film CIL is flattened through the CMP method. Then, with the use of the photolithography technique and the etching technique, the contact hole CNT1 and the contact hole CNT2, which penetrate through the inter-contact layer insulating film CIL, are formed.

Subsequently, a titanium/titanium nitride film is formed on the inter-contact layer insulating film CIL including bottoms and inner walls of the contact holes CNT1 and CNT2. The titanium/titanium nitride film can be formed of a laminated film including a titanium film and a titanium nitride film, and formed, for example, with the use of a sputtering method. The titanium/titanium nitride film has a so-called barrier property which prevents tungsten, which is a material of a film to be buried in a post-process, from diffusing into silicon.

Subsequently, a tungsten film is formed on an entire main surface of the semiconductor substrate 1S so as to bury the contact holes CNT1 and CNT2. The tungsten film can be formed, for example, with the use of the CVD method. The unnecessary titanium/titanium nitride film and tungsten film, which have been formed on the inter-contact layer insulating film. CIL, are removed, for example, through the CMP method, to thereby form the plug PLG1 and the plug PLG2. Subsequently, a titanium/titanium nitride film, an aluminum film, and a titanium/titanium nitride film are sequentially formed on the inter-contact layer insulating film CIL, and the plugs PLG1, PLG2. Those films can be formed thereon with the use of, for example, the sputtering method. Subsequently, those films are patterned with the use of the photolithography technique and the etching technique to form the line L1.

A known drag reduction process can be used for the wiring process. For example, the line L1 formed in the above-mentioned wiring process is formed of an aluminum wiring, but the line L1 may be formed of a copper wiring (Damascene interconnect technology). Also, a multilayer wiring can be formed as occasion demands.

In the above manner, the semiconductor device according to the first embodiment can be manufactured. It is apparent that the semiconductor element formed by the above-mentioned manufacturing process can be manufactured by the same planar layout as that of the normal MOS FET. For that reason, in the semiconductor device according to the first embodiment, a high-performance semiconductor device can be obtained without lessening the integration property.

In FIG. 1 illustrating an equivalent circuit of the semiconductor element according to the first embodiment, for description of the source terminal S and the substrate terminal Sub, the source terminal S and the substrate terminal Sub are separated from each other. However, because both of the source potential $V_s$ and the substrate potential $V_{sub}$ are set to 0 V, those terminals can be formed to each other to form a three-terminal element. Also, from the viewpoint of a fact that an injection charge is drawn from the n-type semiconductor region NRb to the semiconductor substrate 1S, the substrate potential $V_{sub}$ is set to be lower than the source potential $V_s$, and the reverse bias is applied between the n-type semiconductor region NRb and the semiconductor substrate 1S to improve the drawing efficiency.

Second Embodiment

In the first embodiment, the n-channel semiconductor element in which the n-channel MOSFET and the PNP tunnel-injection bipolar transistor are combined together has been described. In the semiconductor element according to the present invention, a p-channel semiconductor element in which a p-channel MOSFET and an NPN tunnel-injection bipolar transistor are combined together can be also formed. Accordingly, in the semiconductor element according to the present invention, there can be formed a complementary semiconductor element using the n-channel semiconductor element and the p-channel semiconductor element. In a second embodiment, a description will be given of the complementary semiconductor element in which the n-channel semiconductor element and the p-channel semiconductor element are combined together. In particular, in the second embodiment, an inverter circuit will be described as an example of a circuit using the complementary semiconductor element.

Figure 20:
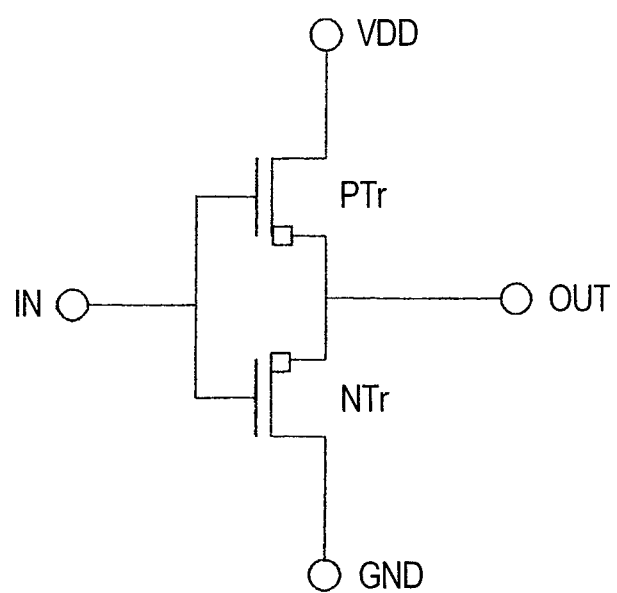
FIG. 20 is a circuit diagram illustrating an inverter circuit according to a second embodiment.

FIG. 20 is a circuit diagram illustrating an inverter circuit according to the second embodiment. As illustrated in FIG. 20, a p-channel semiconductor element PTr and an n-channel semiconductor element NTr are connected in series between a supply potential VDD and a ground potential GND. Specifically, the p-channel semiconductor element PTr is arranged on the supply potential VDD, and the n-channel semiconductor element NTr is arranged on the ground potential GND side. A gate electrode of the p-channel semiconductor element PTr and a gate electrode of the n-channel semiconductor element are electrically connected to each other to serve as an input IN, and a node at which a drain region of the p-channel semiconductor element and a drain region of the n-channel semiconductor element are connected to each other serves as an output OUT.

According to the inverter circuit thus configured, when "H" (for example, 1 V) is input to the input IN, "H" is supplied to the gate electrode of the p-channel semiconductor element PTr and the gate electrode of the n-channel semiconductor element NTr. In this case, the p-channel semiconductor element PTr turns off, and the n-channel semiconductor element NTr turns on. Accordingly, the output OUT is electrically connected to the ground potential GND by the n-channel semiconductor element NTr that has turned on, and "L" (for example, 0 V) is output from the output OUT. On the other hand, when "L" (for example, 0 V) is input to the input IN, "L" is applied to the gate electrode of the p-channel semiconductor element PTr and the gate electrode of the n-channel semiconductor element NTr. In this case, the n-channel semiconductor element NTr turns off, and the p-channel semiconductor element PTr turns on. Accordingly, the output OUT is electrically connected to the supply potential VDD by the p-channel semiconductor element PTr that has turned on, and "H" (for example, 1 V) is output from the output OUT. In this way, a potential opposite to the input IN is output to the output OUT to operate the inverter circuit.

Figure 21:
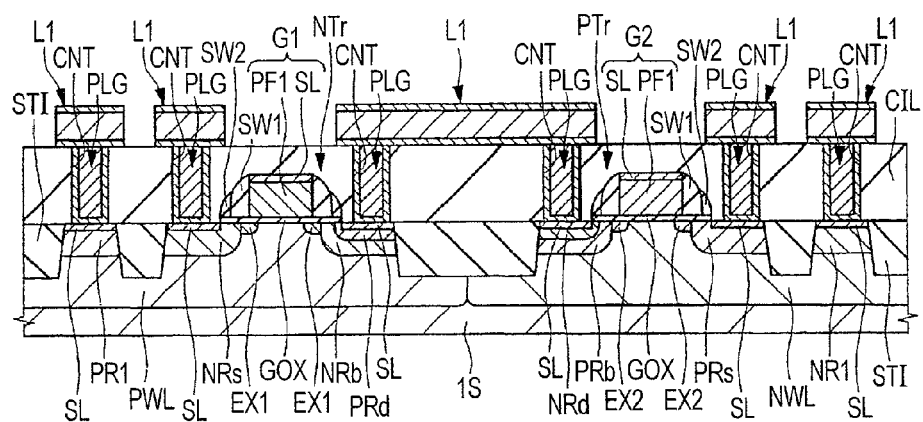
FIG. 21 is a cross-sectional view illustrating a device structure of an n-channel semiconductor element and a p-channel semiconductor element.

Subsequently, a description will be given of a device structure of the n-channel semiconductor element NTr and the p-channel semiconductor element PTr, which configure the above-mentioned inverter circuit. FIG. 21 is a cross-sectional view illustrating the device structure of the n-channel semiconductor element NTr and the p-channel semiconductor element PTr. Referring to FIG. 21, the element separation region ST1 is formed on a main surface of the semiconductor substrate 1S, and the p-type well PWL and an n-type well NWL are formed in the active region zoned by the element separation region ST1. In FIG. 21, the p-type well PWL is formed in a left region, and the n-type well NWL is formed in a right region. Then, the n-channel semiconductor element NTr is formed on the p-type well PWL, and the p-channel semiconductor element PTr is formed on the n-type well NWL.

First, a description will be given of a structure of the n-channel semiconductor element NTr formed on the p-type well PWL. Within the semiconductor substrate 1S zoned by the element separation region ST1, the p-type well PWL into which the p-type impurities, for example, such as boron are introduced is formed, and a pair of low-concentration n-type semiconductor regions EX1 is formed so as to be distant from each other within the p-type well PWL. The low-concentration n-type semiconductor regions EX1 are semiconductor regions into which the n-type impurities such as phosphorus have been introduced, and a region within the p-type well PWL sandwiched between the pair of low-concentration n-type semiconductor regions EX1 serves as the channel region. Then, the n-type semiconductor region NRs and the n-type semiconductor region NRb are formed outside of the low-concentration n-type semiconductor regions EX1. That is, the n-type semiconductor region NRs is formed on a left side of the left low-concentration n-type semiconductor region EX1 of the pair of low-concentration n-type semiconductor regions EX1, and the n-type semiconductor region NRb is formed on a right side of the right low-concentration n-type semiconductor region EX1 of the pair of low-concentration n-type semiconductor regions EX1. The n-type semiconductor region NRs and the n-type semiconductor region NRb are semiconductor regions into which the n-type impurities such as arsenic have been introduced.

Further, in the n-channel semiconductor element NTr according to the second embodiment, the p-type semiconductor region PRd is formed to be included in the n-type semiconductor region NRb. The p-type semiconductor region PRd is a semiconductor region into which the p-type impurities such as boron have been introduced.

Subsequently, the gate insulating film GOX is formed in the channel region, and a gate electrode G1 is formed on the gate insulating film GOX. The gate insulating film GOX is formed of, for example, a silicon oxide film. However, the gate insulating film GOX is not limited to this film, but may be formed of a high dielectric film higher in dielectric constant than the silicon oxide film such as a hafnium oxide. Also, the gate electrode G1 is formed of, for example, the polysilicon film PF1 (n-type polysilicon film) into which phosphorus has been introduced, and the silicide film SL which has been formed on the polysilicon film PF1. The silicide film SL is a film formed for decreasing a resistance of the gate electrode G1, and the silicide film SL is formed of, for example, a cobalt silicide film, a titanium silicide film, a nickel silicide film, a platinum silicide film, or a nickel platinum silicide film.

The side wall SW1 is formed on both of side walls of the gate electrode G1, and the side wall SW2 is formed outside of the side wall SW1. The silicide film SL is formed in a region outside of the side wall SW2. Specifically, the silicide film SL is formed on a surface of the n-type semiconductor region NRs that is exposed to an outside of the left side wall SW2. Also, the silicide film SL is formed on a surface of the p-type semiconductor region PRd that is exposed to an outside of the right side wall SW2.

The n-channel semiconductor element NTr according to the second embodiment is configured as described above, and the n-channel semiconductor element NTr includes the n-channel MOSFET and the PNP tunnel-injection bipolar transistor. That is, the left low-concentration n-type semiconductor region EX1, the n-type semiconductor region NRs, and the silicide film SL form the source region of the n-channel MOSFET. The gate insulating film GOX formed on the channel region configures the gate insulating film of the n-channel MOSFET, and the gate electrode G1 formed on the gate insulating film GOX configures the gate electrode of the n-channel MOSFET. Further, the right low-concentration n-type semiconductor region EX1, and the n-type semiconductor region NRb form a connection region between the n-channel MOSFET and the PNP tunnel-injection bipolar transistor.

The p-type semiconductor region PRd and the silicide film SL serve as the emitter region of the PNP tunnel-injection bipolar transistor, and the right low-concentration n-type semiconductor region EX1 and the n-type semiconductor region NRb serve as the base region of the PNP tunnel-injection bipolar transistor. The p-type well PWL and the semiconductor substrate serve as the collector region of the PNP tunnel-injection bipolar transistor. From the above description, the n-channel semiconductor element NTr according to the second embodiment includes the n-channel MOSFET and the PNP tunnel-injection bipolar transistor, and the n-channel MOSFET and the PNP tunnel-injection bipolar transistor are electrically connected to each other so that the drain region of the n-channel MOSFET serves as the base region of the PNP tunnel-injection bipolar transistor. The p-type well PWL is also formed with a p-type feed region PR1 for applying a potential to the p-type well PWL.

Subsequently, a description will be given of a structure of the p-channel semiconductor element PTr formed on the n-type well NWL. Within the semiconductor substrate 1S zoned by the element separation region ST1, the n-type well NWL into which the n-type impurities, for example, such as phosphorus or arsenic are introduced is formed, and a pair of low-concentration p-type semiconductor regions EX2 is formed so as to be distant from each other within the n-type well NWL. The low-concentration p-type semiconductor regions EX2 are semiconductor regions into which the p-type impurities such as boron have been introduced, and a region within the n-type well NWL sandwiched between the pair of low-concentration p-type semiconductor regions EX2 serves as the channel region. Then, a p-type semiconductor region PRb and a p-type semiconductor region PRs are formed outside of the low-concentration p-type semiconductor regions EX2. That is, the p-type semiconductor region PRb is formed on a left side of the left low-concentration p-type semiconductor region EX2 of the pair of low-concentration p-type semiconductor regions EX2, and the p-type semiconductor region PRs is formed on a right side of the right low-concentration p-type semiconductor region EX2 of the pair of low-concentration p-type semiconductor regions EX2. The p-type semiconductor region PRb and the p-type semiconductor region PRs are semiconductor regions into which the p-type impurities such as boron have been introduced.

Further, in the p-channel semiconductor element PTr according to the second embodiment, the n-type semiconductor region NRd is formed to be included in the p-type semiconductor region PRb. The n-type semiconductor region NRd is a semiconductor region into which the n-type impurities such as phosphorus or arsenic have been introduced.

Subsequently, the gate insulating film GOX is formed in the channel region, and a gate electrode G2 is formed on the gate insulating film GOX. The gate insulating film GOX is formed of, for example, a silicon oxide film. However, the gate insulating film GOX is not limited to this film, but may be formed of a high dielectric film higher in dielectric constant than the silicon oxide film such as a hafnium oxide. Also, the gate electrode G2 is formed of, for example, the polysilicon film PF1 (p-type polysilicon film) into which boron has been introduced, and the silicide film St which has been formed on the polysilicon film PF1. The silicide film SL is a film formed for decreasing a resistance of the gate electrode G2, and the silicide film SL is formed of, for example, a cobalt silicide film, a titanium silicide film, a nickel silicide film, a platinum silicide film, or a nickel platinum silicide film.

The side wall SW1 is formed on both of side walls of the gate electrode G2, and the side wall SW2 is formed outside of the side wall SW1. The silicide film SL is formed in a region outside of the side wall SW2. Specifically, the silicide film SL is formed on a surface of the n-type semiconductor region NRs that is exposed to an outside of the left side wall SW2. Also, the silicide film SI is formed on a surface of the p-type semiconductor region PRd that is exposed to an outside of the right side wall SW2.

The p-channel semiconductor element PTr according to the second embodiment is configured as described above, and the p-channel semiconductor element PTr includes the p-channel MOSFET and the NPN tunnel-injection bipolar transistor. That is, the right low-concentration p-type semiconductor region EX2, the p-type semiconductor region PRs, and the silicide film SI form the source region of the p-channel MOSFET. The gate insulating film GOX formed on the channel region configures the gate insulating film of the p-channel MOSFET, and the gate electrode G2 formed on the gate insulating film GOX configures the gate electrode of the p-channel MOSFET. Further, the left low-concentration n-type semiconductor region EX1, and the p-type semiconductor region PRb form a connection region between the p-channel MOSFET and the NPN tunnel-injection bipolar transistor.

The n-type semiconductor region NRd and the silicide film SL serve as the emitter region of the NPN tunnel-injection bipolar transistor, and the left low-concentration p-type semiconductor region EX2 and the p-type semiconductor region PRb serve as the base region of the NPN tunnel-injection bipolar transistor. The n-type well NWL serves as the collector region of the NPN tunnel-injection bipolar transistor. From the above description, the p-channel semiconductor element PTr according to the second embodiment includes the p-channel MOSFET and the NPN tunnel-injection bipolar transistor, and the p-channel MOSFET and the NPN tunnel-injection bipolar transistor are electrically connected to each other so that the drain region of the p-channel MOSFET serves as the base region of the NPN tunnel-injection bipolar transistor. The n-type well NWL is also formed with an n-type feed region NR1 for applying a potential to the n-type well NWL.

The inter-contact layer insulating film CIL formed of a silicon oxide film made of TEOS as a raw material is formed on the semiconductor substrate 1S covering the n-channel semiconductor element NTr and the p-channel semiconductor element PTr thus configured, for example, as illustrated in FIG. 21. Then, a contact hole CNT is so formed as to penetrate through the inter-contact layer insulating film CIL and to reach the silicide film SL. A titanium/titanium nitride layer forming a barrier conductor film, and a tungsten film formed on the barrier conductor film are buried in the interior of the contact hole CNT to form a plug PLG. The line L1 is formed on the inter-contact layer insulating film CIL in which the plug PLG is formed. The line L1 is formed of, for example, a laminated film of a titanium nitride film, an aluminum film, and a titanium nitride film.

The semiconductor device according to the second embodiment is configured as described above, and a method for manufacturing the semiconductor device will be described below with reference to the drawings.

Figure 22:
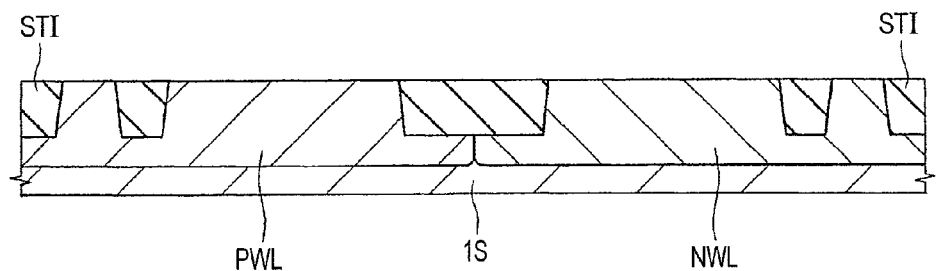
FIG. 22 is a cross-sectional view illustrating a process of manufacturing a semiconductor device according to the second embodiment.

First, as illustrated in FIG. 22, after a silicon oxide film of, for example, 10 nm has been formed on a surface of the semiconductor substrate (p-type silicon substrate) 1S with the use of the thermal oxidation method, a silicon nitride film of 100 nm is deposited thereon with the use of the CVD (chemical vapor deposition) method. Then, an active region is patterned with the use of the photolithography technique. Thereafter, the silicon nitride film and the silicon oxide film have been anisotropically etched in a direction perpendicular to a main surface (substrate surface) of the semiconductor substrate 1S with the use of a dry etching technique. Thereafter, the semiconductor substrate 1S is further anisotropically etched to form a trench having a depth of, for example, 300 nm, in the semiconductor substrate 1S.

Subsequently, a silicon surface exposed to the interior of the trench is oxidized to form a silicon oxide film of 5 nm, and a silicon oxide film of 700 nm is further deposited on the semiconductor substrate 1S through the CVD method. Then, with the user of a CMP (chemical mechanical polishing) method, the deposited silicon oxide film is polished with the silicon nitride film as an underlying mask to remove the silicon oxide film deposited on the semiconductor substrate 1S except for the interior of the groove. Thereafter, the silicon nitride film used as the mask is removed by wet etching using thermal phosphoric acid. In the manner described above, the element separation region ST1 can be formed on the main surface side of the semiconductor substrate 1S.

Then, with the use of the ion implantation method and the heat treatment, the p-type well PWL and the n-type well NWL are formed within the semiconductor substrate 1S. Then, the silicon oxide film that has been formed under the silicon nitride film is removed by hydrofluoric acid to expose the surface (silicon surface) of the semiconductor substrate 1S.

Figure 23:
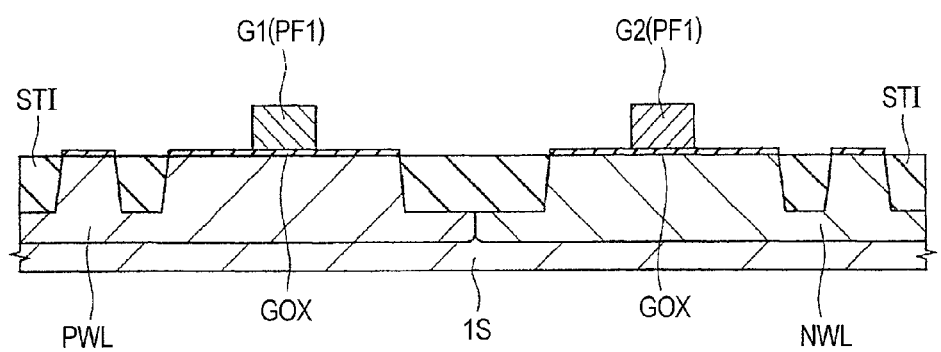
FIG. 23 is a cross-sectional view illustrating the process of manufacturing the semiconductor device subsequent to FIG. 22.

Subsequently, as illustrated in FIG. 23, the gate insulating film GOX of, for example, 3 nm is formed in the active region with the use of the thermal oxidation method. The gate insulating film GOX is formed of, for example, a silicon oxide film. However, the gate insulating film GOX is not limited to this film, but may be formed of a high dielectric film higher in dielectric constant than the silicon oxide film. Thereafter, the polysilicon film PF1 is deposited in thickness of about 100 nm on the gate insulating film GOX with the use of the CVD method. In this situation, the polysilicon film PF1 formed in the n-channel semiconductor element formation region is doped with phosphorus with a high concentration with the use of the ion implantation method. Likewise, the polysilicon film PF1 formed in the p-channel semiconductor element formation region is doped with boron with a high concentration with the use of the ion implantation method.

Then, the polysilicon film PF1 is patterned with the use of the photolithography technique and the dry etching method. Specifically, a resist film formed on the polysilicon film PF1 is patterned with the use of the photolithography technique. Then, the polysilicon film PF1 is dry-etched with the patterned resist film as a mask. In this way, the polysilicon film PF1 is anisotropically etched in a direction perpendicular to the substrate surface of the semiconductor substrate 1S to form the gate electrode G1 and the gate electrode G2 each formed of the polysilicon film PF1.

Figure 24:
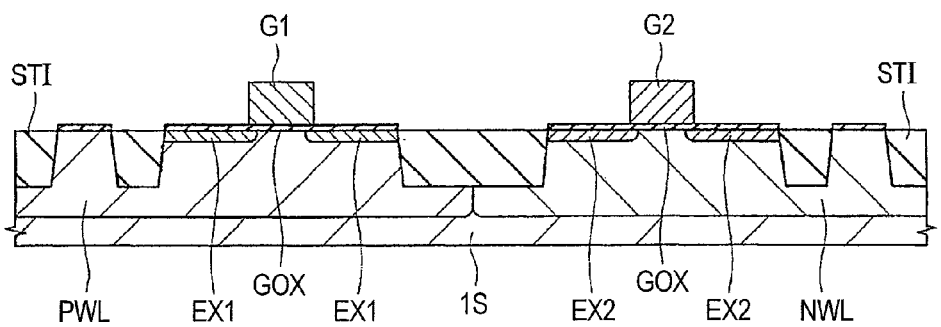
FIG. 24 is a cross-sectional view illustrating the process of manufacturing the semiconductor device subsequent to FIG. 23.
Figure 25:
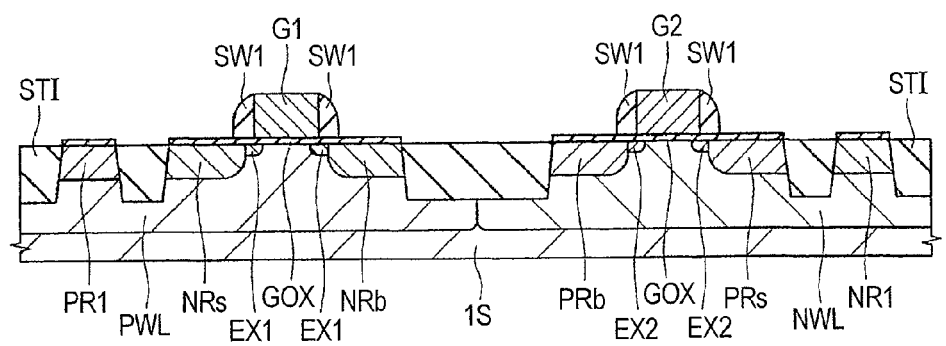
FIG. 25 is a cross-sectional view illustrating the process of manufacturing the semiconductor device subsequent to FIG. 24.

Then, as illustrated in FIG. 24, the low-concentration n-type semiconductor regions EX1 matching the gate electrode G is formed within the semiconductor substrate 1S with the use of the photolithography technique and the ion implantation method. Likewise, the low-concentration p-type semiconductor regions EX2 matching the gate electrode G2 is formed within the semiconductor substrate 1S with the use of the photolithography technique and the ion implantation method. Then, as illustrated in FIG. 25, a silicon oxide film is deposited in thickness of about 50 nm on the semiconductor substrate 1S covering the gate electrode G1 and the gate electrode G2 through the CVD method, and the deposited silicon oxide film is anisotropically etched to form the side wall SW1 on both of side walls of the gate electrode G1 and the gate electrode G2.

Thereafter, the p-type well PWL is doped with arsenic through the ion implantation method using the gate electrode G1 forming the side wall SW1 and the patterned resist film as a mask. With this processing, the n-type semiconductor region NRs and the n-type semiconductor region NRb can be formed. In this situation, the n-type feed region NR1 is also formed within the n-type well NWL. Likewise, the n-type well NWL is doped with boron through the ion implantation method using the gate electrode G2 forming the side wall SW1 and the patterned resist film as a mask. With this processing, the p-type semiconductor region PRs and the p-type semiconductor region PRb can be formed. In this situation, the p-type feed region NR1 is also formed within the p-type well PWL. Thereafter, the impurities (arsenic and boron) introduced by the heat treatment may be activated.

Figure 26:
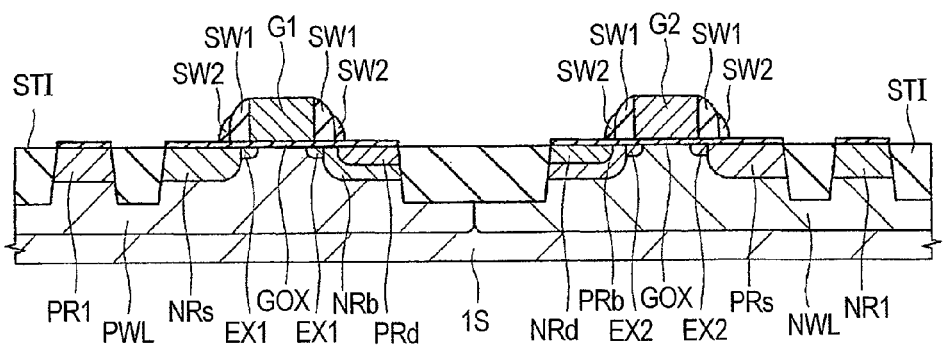
FIG. 26 is a cross-sectional view illustrating the process of manufacturing the semiconductor device subsequent to FIG. 25.

Subsequently, as illustrated in FIG. 26, a silicon oxide film is deposited in thickness of about 50 nm on the semiconductor substrate 1S covering the gate electrode G1 and the gate electrode G2 through the CVD method. Then, the deposited silicon oxide film is anisotropically etched to form the side wall SW2 outside of the side wall SW1. Then, in the n-channel semiconductor element formation region, the p-type semiconductor region PRd is formed to be included in the n-type semiconductor region NRb with the use of the photolithography technique and the ion implantation method. Likewise, in the p-channel semiconductor element formation region, the n-type semiconductor region NRd is formed to be included in the p-type semiconductor region PRb with the use of the photolithography technique and the ion implantation method.

Thereafter, a high-temperature activation treatment is conducted in a short time with the use of laser spike annealing (LSA). As a result, in the n-channel semiconductor element formation region, the tunnel junction can be formed in the boundary region between the n-type semiconductor region NRb and the p-type semiconductor region PRd. Likewise, in the p-channel semiconductor element formation region, the tunnel junction can be formed in the boundary region between the p-type semiconductor region PRb and the n-type semiconductor region NRd.

Figure 27:
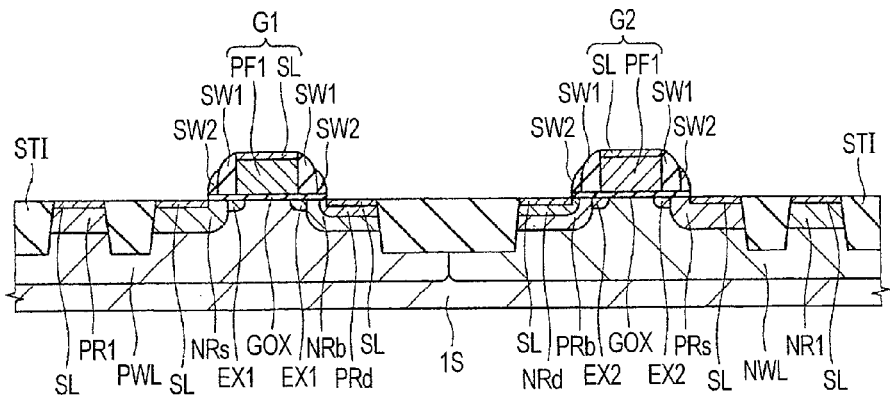
FIG. 27 is a cross-sectional view illustrating the process of manufacturing the semiconductor device subsequent to FIG. 26.

Then, as illustrated in FIG. 27, the silicide film SL is selectively formed on upper surfaces of the gate electrode G1 and the gate electrode G2, the surface of the p-type semiconductor region PRd, the surface of the n-type semiconductor region NRs, the surface of the n-type semiconductor region NRd, the surface of the p-type semiconductor region PRs, the surface of the p-type feed region PR1, and the surface of the n-type feed region NR1 with the side wall SW2 as a mask. With this configuration, the gate electrode G1, the gate electrode G2, the p-type semiconductor region PRd, the n-type semiconductor region NRs, the n-type semiconductor region NRd, the p-type semiconductor region PRs, the p-type feed region PR1, and the n-type feed region NR1 can be reduced in resistance. This is a normal process known as a salicide process. The silicide film SL can be formed of, for example, a cobalt silicide film, a titanium silicide film, a nickel silicide film, a platinum silicide film, or a nickel platinum silicide film.

Thereafter, as illustrated in FIG. 21, a wiring process used in the normal LSI is conducted to obtain the semiconductor element in the second embodiment. Specifically, as illustrated in FIG. 21, the inter-contact layer insulating film CIL formed of, for example, the silicon oxide film, is formed on the semiconductor substrate 1S, and an upper surface of the inter-contact layer insulating film CIL is flattened through the CMP method. Then, with the use of the photolithography technique and the etching technique, the contact hole CNT, which penetrates through the inter-contact layer insulating film CIL, is formed.

Subsequently, a titanium/titanium nitride film is formed on the inter-contact layer insulating film CIL including a bottom and an inner wall of the contact hole CNT. The titanium/titanium nitride film can be formed of a laminated film including a titanium film and a titanium nitride film, and formed, for example, with the use of a sputtering method. The titanium/titanium nitride film has a so-called barrier property which prevents tungsten, which is a material of a film to be buried in a post-process, from diffusing into silicon.

Subsequently, a tungsten film is formed on an entire main surface of the semiconductor substrate 1S so as to bury the contact hole CNT. The tungsten film can be formed, for example, with the use of the CVD method. The unnecessary titanium/titanium nitride film and tungsten film, which have been formed on the inter-contact layer insulating film CIL, are removed, for example, through the CMP method, to thereby form the plug PLG.

Subsequently, a titanium/titanium nitride film, an aluminum film, and a titanium/titanium nitride film are sequentially formed on the inter-contact layer insulating film CIL, and the plugs PLG. Those films can be formed thereon with the use of, for example, the sputtering method. Subsequently, those films are patterned with the use of the photolithography technique and the etching technique to form the line L1.

A known drag reduction process can be used for the wiring process. For example, the line L1 formed in the above-mentioned wiring process is formed of an aluminum wiring, but the line L1 may be formed of a copper wiring (Damascene interconnect technology). Also, a multilayer wiring can be formed as occasion demands. In the manner described above, the semiconductor device according to the second embodiment can be manufactured.

In the second embodiment, the inverter is exemplified. The inverter is a basic unit of a digital circuit, and the inverters can be combined together to form a basic logic circuit such as a NAND circuit, a NOR circuit, an EX-OR circuit, or a flip flop circuit used in the digital circuit. That is, it is found that the digital circuit can be configured by using the n-channel semiconductor element NTr and the p-channel semiconductor element PTr in the second embodiment.

Third Embodiment

In a third embodiment, a description will be given of an example in which a semiconductor element of the present invention and a simplicial transistor formed of a simplicial MOSFET are formed on the same semiconductor substrate.

Figure 28:
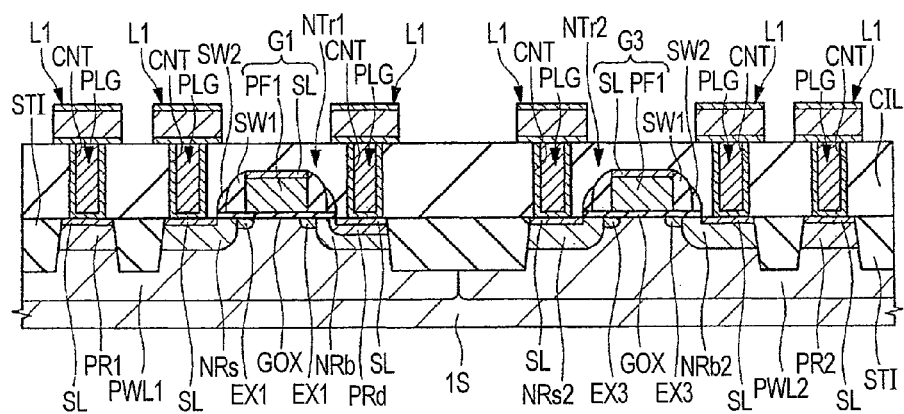
FIG. 28 is a cross-sectional view illustrating a device structure of a semiconductor device according to a third embodiment.

FIG. 28 is a cross-sectional view illustrating a device structure of a semiconductor device according to the third embodiment. As illustrated in FIG. 28, the element separation region ST1 is formed on the main surface of the semiconductor substrate 1S, and a p-type well PWL1 and a p-type well PWL2 are formed in the active layer zoned by the element separation region ST1. In FIG. 28, the p-type well PWL1 is formed in a left region, and the p-type well PWL2 is formed in a right region. Then, an n-channel semiconductor element NTr1 is formed on the p-type well PWL1, and a simplicial transistor NTr2 is formed on the p-type well PWL2.

A structure of the n-channel semiconductor element NTr1 is the same as that of the n-channel semiconductor element NTr (refer to FIG. 21) described in the second embodiment, and therefore a description thereof will be omitted. On the other hand, the simplicial transistor NTr2 is a simplicial MOSFET widely used, and a structure thereof will be described hereinafter with reference to FIG. 28.

Within the semiconductor substrate 1S zoned by the element separation region ST1, the p-type well PWL2 into which the p-type impurities, for example, such as boron are introduced is formed, and a pair of low-concentration n-type semiconductor regions EX3 is formed so as to be distant from each other within the p-type well PWL2. The low-concentration n-type semiconductor regions EX3 are semiconductor regions into which the n-type impurities such as phosphorus have been introduced, and a region within the p-type well PWL2 sandwiched between the pair of low-concentration n-type semiconductor regions EX3 serves as the channel region. Then, an n-type semiconductor region NRs2 and an n-type semiconductor region NRb2 are formed outside of the low-concentration n-type semiconductor regions EX3. That is, the n-type semiconductor region NRs2 is formed on a left side of the left low-concentration n-type semiconductor region EX3 of the pair of low-concentration n-type semiconductor regions EX3, and the n-type semiconductor region NRb2 is formed on a right side of the right low-concentration n-type semiconductor region EX3 of the pair of low-concentration n-type semiconductor regions EX3. The n-type semiconductor region NRs2 and the n-type semiconductor region NRb2 are semiconductor regions into which the n-type impurities such as arsenic have been introduced.

Subsequently, the gate insulating film GOX is formed in the channel region, and a gate electrode G3 is formed on the gate insulating film GOX. The gate insulating film GOX is formed of, for example, a silicon oxide film. However, the gate insulating film GOX is not limited to this film, but may be formed of a high dielectric film higher in dielectric constant than the silicon oxide film such as a hafnium oxide. Also, the gate electrode G3 is formed of, for example, the polysilicon film PF1 (n-type polysilicon film) into which phosphorus has been introduced, and the silicide film SL which has been formed on the polysilicon film PF1. The silicide film SL is a film formed for decreasing a resistance of the gate electrode G1, and the silicide film SL is formed of, for example, a cobalt silicide film, a titanium silicide film, a nickel silicide film, a platinum silicide film, or a nickel platinum silicide film.

The side wall SW1 is formed on both of side walls of the gate electrode G3, and the side wall SW2 is formed outside of the side wall SW1. The silicide film SL is formed in a region outside of the side wall SW2. Specifically, the silicide film SL is formed on a surface of the n-type semiconductor region NRs2 that is exposed to an outside of the left side wall SW2. Also, the silicide film SL is formed on a surface of the n-type semiconductor region NRb2 that is exposed to an outside of the right side wall SW2. The p-type well PWL2 is also formed with a p-type feed region PR2 for applying a potential to the p-type well PWL2.

The semiconductor device according to the third embodiment is configured as described above, and a method for manufacturing the semiconductor device will be described below with reference to the drawings.

Figure 29:
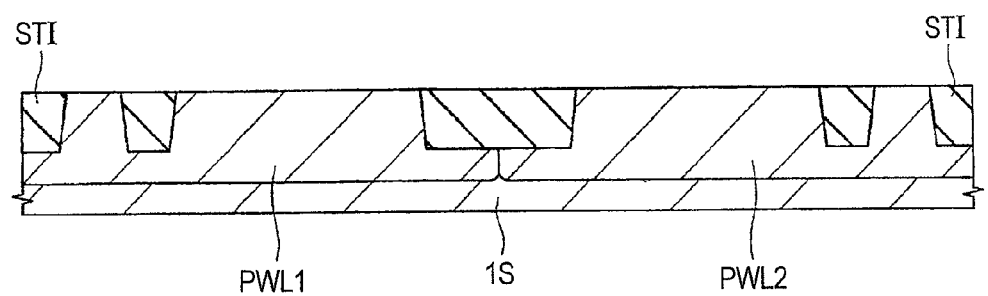
FIG. 29 is a cross-sectional view illustrating a process of manufacturing a semiconductor device according to the third embodiment.

First, as illustrated in FIG. 29, after a silicon oxide film of, for example, 10 nm has been formed on a surface of the semiconductor substrate (p-type silicon substrate) 1S through the thermal oxidation method, a silicon nitride film of 100 nm is deposited thereon with the use of the CVD (chemical vapor deposition) method. Then, an active region is patterned with the use of the photolithography technique. Thereafter, the silicon nitride film and the silicon oxide film have been anisotropically etched in a direction perpendicular to a main surface (substrate surface) of the semiconductor substrate 1S with the use of a dry etching technique. Thereafter, the semiconductor substrate 1S is further anisotropically etched to form a trench having a depth of, for example, 300 nm, in the semiconductor substrate 1S.

Subsequently, a silicon surface exposed to the interior of the trench is oxidized to form a silicon oxide film of 5 nm, and a silicon oxide film of 700 nm is further deposited on the semiconductor substrate 1S through the CVD method. Then, with the user of a CMP (chemical mechanical polishing) method, the deposited silicon oxide film is polished with the silicon nitride film as an underlying mask to remove the silicon oxide film deposited on the semiconductor substrate 1S except for the interior of the groove. Thereafter, the silicon nitride film used as the mask is removed by wet etching using thermal phosphoric acid. In the manner described above, the element separation region ST1 can be formed on the main surface side of the semiconductor substrate 1S.

Then, with the use of the ion implantation method and the heat treatment, the p-type well PWL and the n-type well NWL are formed within the semiconductor substrate 1S. Then, the silicon oxide film that has been formed under the silicon nitride film is removed by hydrofluoric acid to expose the surface (silicon surface) of the semiconductor substrate 1S.

Figure 30:
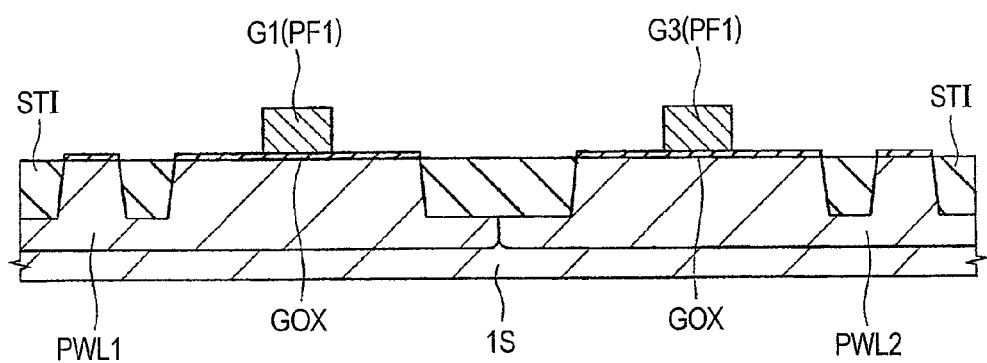
FIG. 30 is a cross-sectional view illustrating the process of manufacturing the semiconductor device subsequent to FIG. 29.

Subsequently, as illustrated in FIG. 30, the gate insulating film GOX of, for example, 3 nm is formed in the active region with the use of the thermal oxidation method. The gate insulating film GOX is formed of, for example, a silicon oxide film. However, the gate insulating film GOX is not limited to this film, but may be formed of a high dielectric film higher in dielectric constant than the silicon oxide film. Thereafter, the polysilicon film PF1 is deposited in thickness of about 100 nm on the gate insulating film GOX with the use of the CVD method. In this situation, the polysilicon film PF1 formed in the n-channel semiconductor element formation region is doped with phosphorus with a high concentration with the use of the ion implantation method.

Then, the polysilicon film PF1 is patterned with the use of the photolithography technique and the dry etching method. Specifically, a resist film formed on the polysilicon film PF1 is patterned with the use of the photolithography technique. Then, the polysilicon film PF1 is dry-etched with the patterned resist film as a mask. In this way, the polysilicon film PF1 is anisotropically etched in a direction perpendicular to the substrate surface of the semiconductor substrate 1S to form the gate electrode G1 and the gate electrode G3 which are each formed of the polysilicon film PF1.

Figure 31:
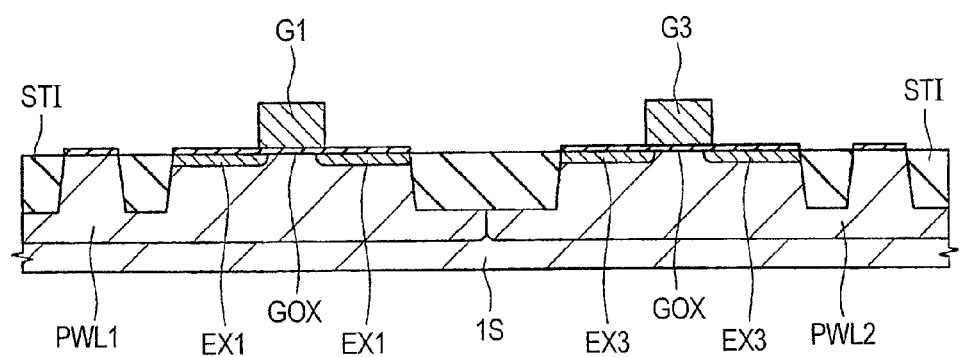
FIG. 31 is a cross-sectional view illustrating the process of manufacturing the semiconductor device subsequent to FIG. 30.
Figure 32:
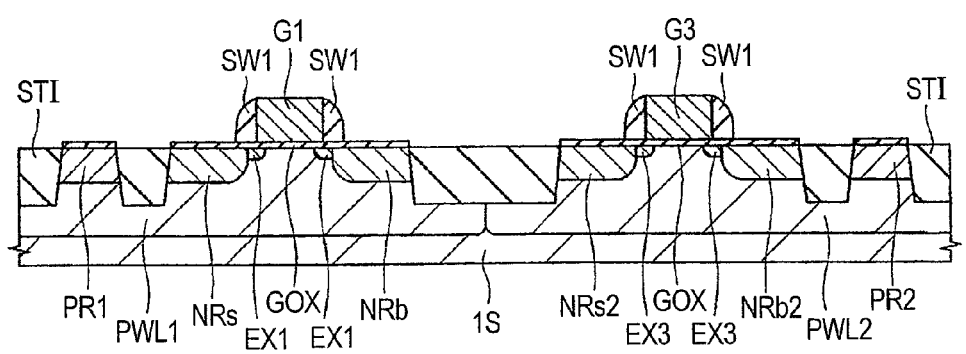
FIG. 32 is a cross-sectional view illustrating the process of manufacturing the semiconductor device subsequent to FIG. 31.

Then, as illustrated in FIG. 31, the low-concentration n-type semiconductor regions EX1 matching the gate electrode G1 is formed within the semiconductor substrate 1S with the use of the photolithography technique and the ion implantation method. Likewise, the low-concentration n-type semiconductor regions EX3 matching the gate electrode G3 is formed within the semiconductor substrate 1S with the use of the photolithography technique and the ion implantation method. Then, as illustrated in FIG. 32, a silicon oxide film is deposited in thickness of about 50 nm on the semiconductor substrate 1S covering the gate electrode G1 and the gate electrode G3 through the CVD method, and the deposited silicon oxide film is anisotropically etched to form the side wall SW1 on both of side walls of the gate electrode G1 and the gate electrode G3.

Thereafter, the p-type well PWL1 is doped with arsenic through the ion implantation method using the gate electrode G1 forming the side wall SW1 and the patterned resist film as a mask. With this processing, the n-type semiconductor region NRs and the n-type semiconductor region NRb can be formed. Likewise, the p-type well PWL2 is doped with arsenic through the ion implantation method using the gate electrode G3 forming the side wall SW1 and the patterned resist film as a mask. With this processing, the n-type semiconductor region NRs2 and the n-type semiconductor region NRb2 can be formed. Further, boron is introduced into the p-type well PWL1 with the use of the photolithography technique and the ion implantation method to form the p-type feed region PR1 within the p-type well PWL1. Likewise, boron is introduced into the p-type well PWL2 with the use of the photolithography technique and the ion implantation method to form the p-type feed region PR2 within the p-type well PWL2. Thereafter, the impurities (arsenic and boron) introduced by the heat treatment may be activated.

Figure 33:
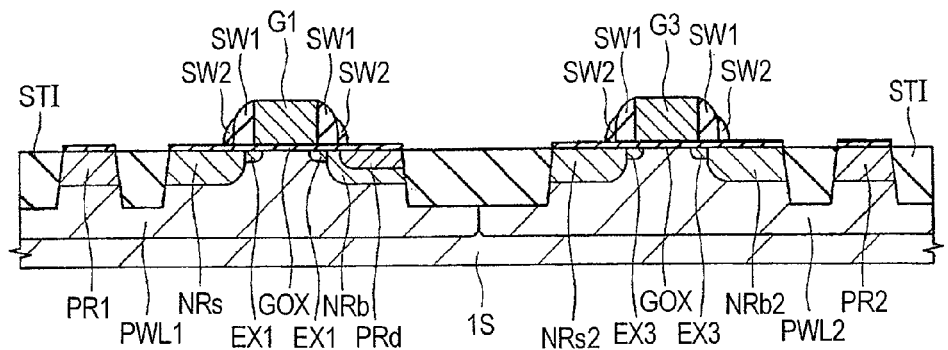
FIG. 33 is a cross-sectional view illustrating the process of manufacturing the semiconductor device subsequent to FIG. 32.

Subsequently, as illustrated in FIG. 33, a silicon oxide film is deposited in thickness of about 50 nm on the semiconductor substrate 1S covering the gate electrode G1 and the gate electrode G3 through the CVD method. Then, the deposited silicon oxide film is anisotropically etched to form the side wall SW2 outside of the side wall SW1. Then, in the n-channel semiconductor element formation region, the p-type semiconductor region PRd is formed to be included in the n-type semiconductor region NRb with the use of the photolithography technique and the ion implantation method.

Thereafter, a high-temperature activation treatment is conducted in a short time with the use of laser spike annealing (LSA). As a result, in the n-channel semiconductor element formation region, the tunnel junction can be formed in the boundary region between the n-type semiconductor region NRb and the p-type semiconductor region PRd.

Figure 34:
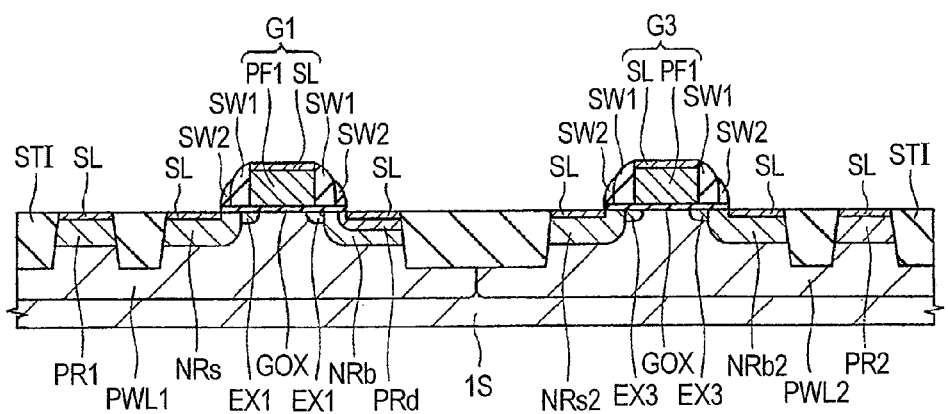
FIG. 34 is a cross-sectional view illustrating the process of manufacturing the semiconductor device subsequent to FIG. 33.

Then, as illustrated in FIG. 34, the silicide film SL is selectively formed on upper surfaces of the gate electrode G1 and the gate electrode G3, the surface of the p-type semiconductor region PRd, the surface of the n-type semiconductor region NRs, the surface of the n-type semiconductor region NRs2, the surface of the n-type semiconductor region NRb2, the surface of the p-type feed region PR1, and the surface of the p-type feed region PR2 with the side wall SW2 as a mask. With this configuration, the gate electrodes G1 and G3, the p-type semiconductor region PRd, the n-type semiconductor region NRs, the n-type semiconductor region NRs2, the n-type semiconductor region NRb2, the p-type feed region PR1, and the p-type feed region PR2 can be reduced in resistance. This is a normal process known as a salicide process. The silicide film SL can be formed of, for example, a cobalt silicide film, a titanium silicide film, a nickel silicide film, a platinum silicide film, or a nickel platinum silicide film.

Thereafter, as illustrated in FIG. 28, a wiring process used in the normal LSI is conducted to obtain the semiconductor element in the third embodiment. Specifically, as illustrated in FIG. 28, the inter-contact layer insulating film CIL formed for example, the silicon oxide film, is formed on the semiconductor substrate 1S, and an upper surface of the inter-contact layer insulating film CIL is flattened through the CMP method. Then, with the use of the photolithography technique and the etching technique, the contact hole CNT, which penetrates through the inter-contact layer insulating film CIL, is formed.

Subsequently, a titanium/titanium nitride film is formed on the inter-contact layer insulating film CIL including a bottom and an inner wall of the contact hole CNT. The titanium/titanium nitride film can be formed of a laminated film including a titanium film and a titanium nitride film, and formed, for example, with the use of a sputtering method. The titanium/titanium nitride film has a so-called barrier property which prevents tungsten, which is a material of a film to be buried in a post-process, from diffusing into silicon.

Subsequently, a tungsten film is formed on an entire main surface of the semiconductor substrate 1S so as to bury the contact hole CNT. The tungsten film can be formed, for example, with the use of the CVD method. The unnecessary titanium/titanium nitride film and tungsten film, which have been formed on the inter-contact layer insulating film CIL, are removed, for example, through the CMP method, to thereby form the plug PLG.

Subsequently, a titanium/titanium nitride film, an aluminum film, and a titanium/titanium nitride film are sequentially formed on the inter-contact layer insulating film CIL, and the plug PLG. Those films can be formed thereon with the use of, for example, the sputtering method. Subsequently, those films are patterned with the use of the photolithography technique and the etching technique to form the line L1.

A known drag reduction process can be used for the wiring process. For example, the line L1 formed in the above-mentioned wiring process is formed of an aluminum wiring, but the line L1 may be formed of a copper wiring (Damascene interconnect technology). Also, a multilayer wiring can be formed as occasion demands. In the manner described above, the semiconductor device according to the third embodiment can be manufactured.

As described above, in the semiconductor device according to the third embodiment, the n-channel semiconductor element NTr1 and the simplicial transistor NTr2 can be easily integrated together. The n-channel semiconductor element NTr1 according to the present invention has an extremely excellent switching property, but is of an asymmetric structure because the source region and the drain region have different structures. For that reason, when the n-channel semiconductor element is used as a pass-transistor requiring the symmetry from the viewpoint of the circuit configuration, there arises such a problem that the n-channel semiconductor element cannot be replaced with the simplicial transistor NTr2.

However, as described in the third embodiment, the n-channel semiconductor element NTr1 according to the present invention has the high integration property with the simplicial transistor NTr2, and therefore can obtain the excellent characteristic by combining the n-channel semiconductor element NTr1 and the simplicial transistor NTr2 of the present invention together, with the use of the simplicial transistor for symmetry.

Figure 35:
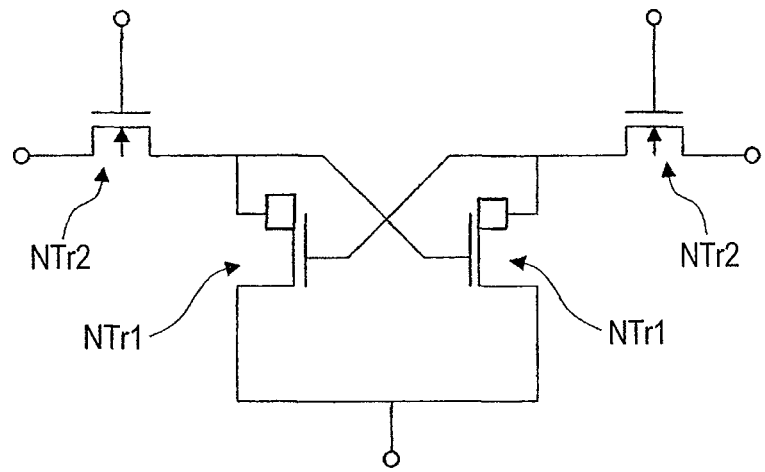
FIG. 35 is a circuit diagram illustrating an example in which two simplicial transistors and two n-channel semiconductor elements are combined together to configure an SRAM cell.

An example in which the combination of the n-channel semiconductor element NTr1 and the simplicial transistor NTr2 is used for an SRAM cell will be described. FIG. 35 is a circuit diagram illustrating an example in which two simplicial transistors NTr2 and two n-channel semiconductor elements NTr1 are combined together to configure an SRAM cell. In the SRAM cell illustrated in FIG. 35, two n-channel semiconductor elements NTr1 are used for a memory node, and the simplicial transistor NTr2 is used for the pass-transistor (transfer transistor) requiring the symmetry.

Figure 36:
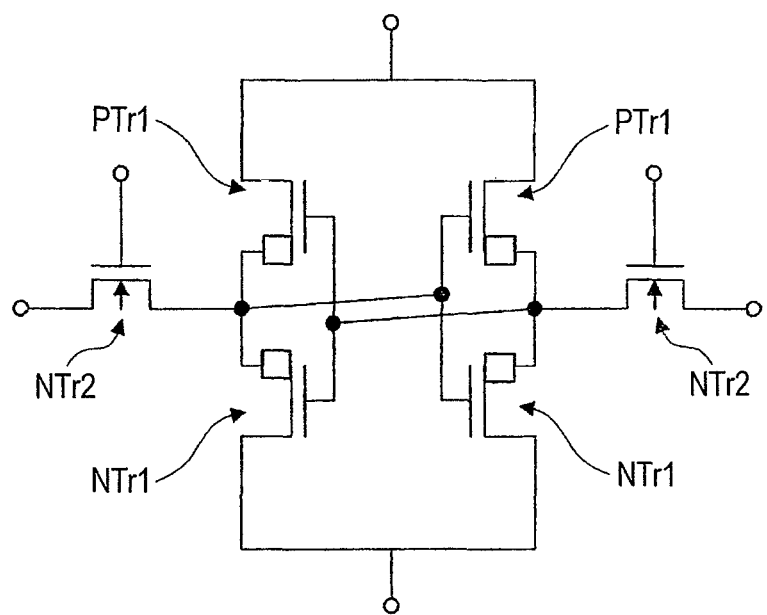
FIG. 36 is a circuit diagram illustrating an example in which the two simplicial transistors, the two n-channel semiconductor elements, and two p-channel semiconductor elements are combined together to configure the SRAM cell.

Also, FIG. 36 is a circuit diagram illustrating an example in which the two simplicial transistors NTr2, the two n-channel semiconductor elements NTr1, and two p-channel semiconductor elements PTr1 are combined together to configure the SRAM cell. In the SRAM cell illustrated in FIG. 36, two inverters are used for the memory node, and the simplicial transistor NTr2 is used for the pass-transistor (transfer transistor) requiring the symmetry. The two inverters each include the n-channel semiconductor element NTr1 and the p-channel semiconductor element PTr1.

Thus, in the SRAM cell illustrated in FIGS. 35 and 36, the simplicial transistor having the symmetry is used for the pass-transistor requiring the symmetry whereas the semiconductor element (n-channel semiconductor element NTr1, p-channel semiconductor element PTr1) that operates at a low voltage and has the excellent switching characteristic according to the present invention is used for the memory node. With this configuration, the extremely excellent memory characteristic can be obtain with the use of the semiconductor element of the present invention even at a low voltage (0.2 to 0.3 V) at which the conventional SRAM cannot operate.

Fourth Embodiment

Figure 37:
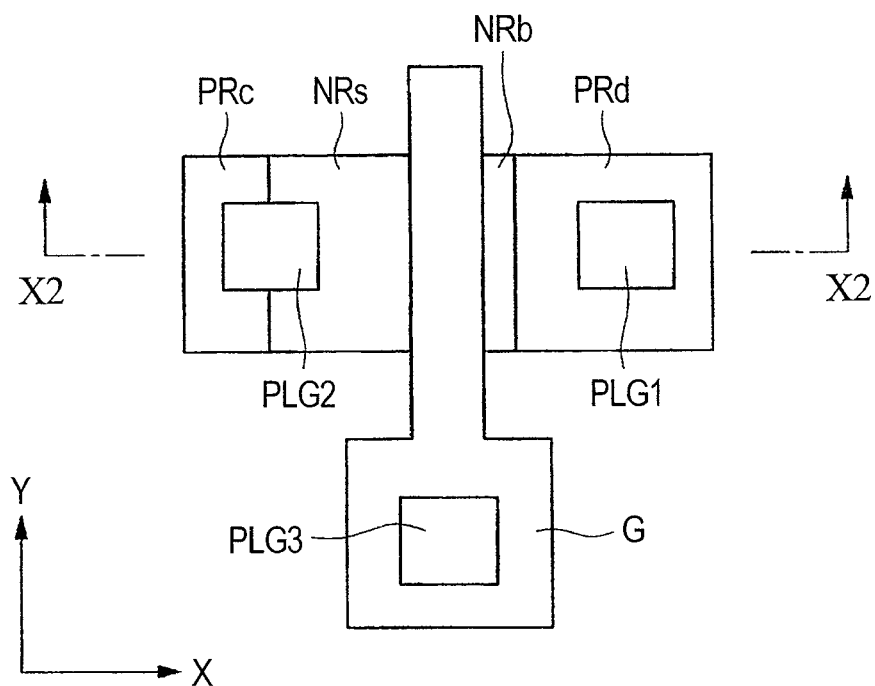
FIG. 37 is a plan view of a semiconductor element viewed from above according to a fourth embodiment.

In a fourth embodiment, a description will be given of an example in which a semiconductor element of the present invention is formed on an SOI (silicon on insulator) substrate. FIG. 37 is a plan view of a semiconductor element viewed from above according to the fourth embodiment. In FIG. 37, the n-type semiconductor region NRs and the n-type semiconductor region NRb are formed to be aligned at a distance from each other in the X-direction. The p-type semiconductor region PRd is formed on the upper portion of the n-type semiconductor region NRb. The plug PLG1 is formed to be electrically connected with the p-type semiconductor region PRd. Also, a p-type semiconductor region PRc is formed in a region outside of the n-type semiconductor region NRs, and the plug PLG2 is formed to be electrically connected with both of the p-type semiconductor region PRc and the n-type semiconductor region NRs. Further, the gate electrode G is formed to extend in the Y-direction between the n-type semiconductor region NRs and the n-type semiconductor region NRb, which are arranged at a distance from each other. The gate electrode G is electrically connected to a plug PLG3 at one end of the gate electrode G.

Figure 38:
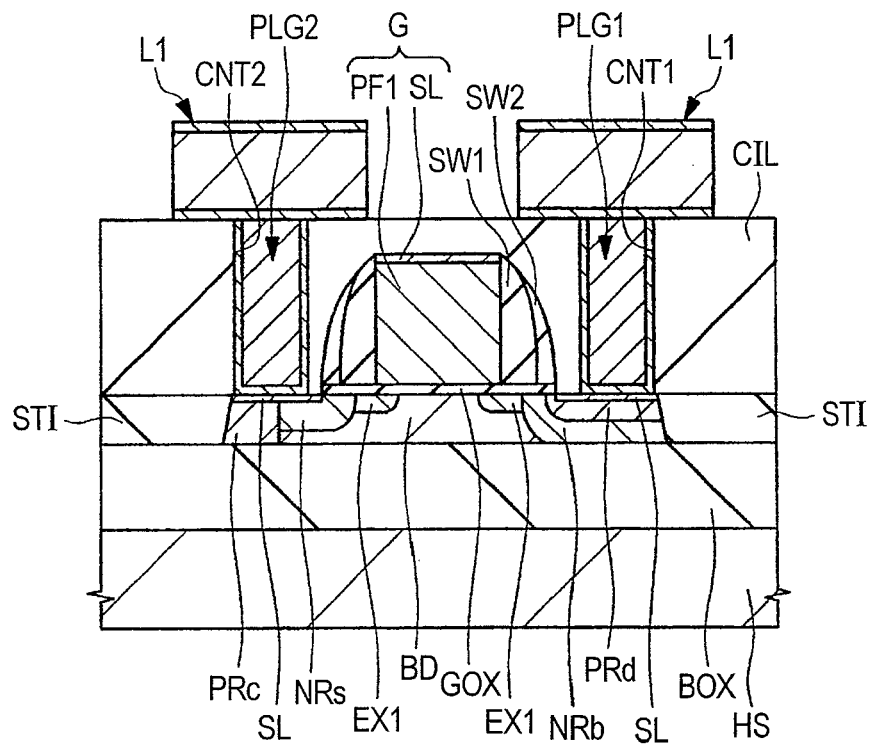
FIG. 38 is a cross-sectional view taken along a line X2-X2 in FIG. 37.

FIG. 38 is a cross-sectional view taken along a line X2-X2 in FIG. 37. As illustrated in FIG. 38, the semiconductor element according to the fourth embodiment is formed in an SOI substrate having a support substrate HS, a buried insulating layer BOX formed on the support substrate HS, and a silicon layer (active layer) formed on the buried insulating layer BOX. Specifically, the silicon layer of the SOI substrate is zoned by the element separation region ST1 that penetrates through the silicon layer and reaches the buried insulating layer, and the semiconductor element in the fourth embodiment is formed in the zoned silicon layer. The silicon layer zoned by the element separation region ST1 is called "body region BD" including the p-type semiconductor region, and a pair of low-concentration n-type semiconductor regions EX1 is formed to be distant from each other within the body region BD. The low-concentration n-type semiconductor regions EX1 are semiconductor regions into which the n-type impurities such as phosphorus have been introduced, and a region within the body region BD sandwiched between the pair of low-concentration n-type semiconductor regions EX1 serves as the channel region. Then, the n-type semiconductor region NRs and the n-type semiconductor region NRb are formed outside of the low-concentration n-type semiconductor regions EX1. That is, the n-type semiconductor region NRs is formed on a left side of the left low-concentration n-type semiconductor region EX1 of the pair of low-concentration n-type semiconductor regions EX1, and the n-type semiconductor region NRb is formed on a right side of the right low-concentration n-type semiconductor region EX1 of the pair of low-concentration n-type semiconductor regions EX1. The n-type semiconductor region NRs and the n-type semiconductor region NRb are semiconductor regions into which the n-type impurities such as arsenic have been introduced.

In this example, the n-type semiconductor region NRb reaches the buried insulating layer BOX while the n-type semiconductor region NRs does not reach the buried insulating layer BOX. The p-type semiconductor region PRc that reaches the buried insulating layer BOX is formed on a side of the n-type semiconductor region NRs opposite to the n-type semiconductor region NRb side. Accordingly, the p-type semiconductor region PRc and the body region BD are each formed by the semiconductor region into which the p-type impurities have been introduced, and therefore are electrically connected to each other. That is, in the fourth embodiment, because the p-type semiconductor region PRc and the body region BD are electrically connected to each other, the n-type semiconductor region NRs does not reach the buried insulating layer BOX.

Further, in the semiconductor element according to the fourth embodiment, the p-type semiconductor region PRd is formed to be included in the n-type semiconductor region NRb. The p-type semiconductor region PRd is a semiconductor region into which the p-type impurities such as boron have been introduced.

Subsequently, the gate insulating film GOX is formed in the channel region (body region BD), and the gate electrode G is formed on the gate insulating film GOX. The gate insulating film GOX is formed of, for example, a silicon oxide film.

However, the gate insulating film GOX is not limited to this film, but may be formed of a high dielectric film higher in dielectric constant than the silicon oxide film such as a hafnium oxide. Also, the gate electrode G is formed of, for example, the polysilicon film PF1 (n-type polysilicon film) into which phosphorus has been introduced, and the silicide film SL which has been formed on the polysilicon film PF1. The silicide film SL is a film formed for decreasing a resistance of the gate electrode G1, and the silicide film SL is formed of, for example, a cobalt silicide film, a titanium silicide film, a nickel silicide film, a platinum silicide film, or a nickel platinum silicide film.

The side wall SW1 is formed on both of side walls of the gate electrode G, and the side wall SW2 is formed outside of the side wall SW1. The silicide film SL is formed in a region outside of the side wall SW2. Specifically, the silicide film SL is formed on a surface of the n-type semiconductor region NRs that is exposed to an outside of the left side wall SW2, and a surface of the p-type semiconductor region PRc. Also, the silicide film SL is formed on a surface of the p-type semiconductor region PRd that is exposed to an outside of the right side wall SW2.

The semiconductor element according to the fourth embodiment is configured as described above, and the semiconductor element includes the MOSFET and the tunnel-injection bipolar transistor. That is, the left low-concentration n-type semiconductor region EX1, the n-type semiconductor region NRs, and the silicide film SL form the source region of the n-channel MOSFET. The gate insulating film GOX formed on the channel region configures the gate insulating film of the MOSFET, and the gate electrode G formed on the gate insulating film GOX configures the gate electrode of the MOSFET. Further, the right low-concentration n-type semiconductor region EX1, and the n-type semiconductor region NRb form a connection region between the MOSFET and the tunnel-injection bipolar transistor.

The p-type semiconductor region PRd and the silicide film SL serve as the emitter region of the tunnel-injection bipolar transistor, and the right low-concentration n-type semiconductor region EX1 and the n-type semiconductor region NRb serve as the base region of the tunnel-injection bipolar transistor. The body region ED serves as the collector region of the tunnel-injection bipolar transistor. From the above description, the semiconductor element NTr according to the fourth embodiment includes the MOSFET and the tunnel-injection bipolar transistor, and the MOSFET and the tunnel-injection bipolar transistor are electrically connected to each other so that the drain region of the MOSFET serves as the base region of the tunnel-injection bipolar transistor.

For example, as illustrated in FIG. 38, the inter-contact layer insulating film CIL formed of a silicon oxide film made of TEOS as a raw material is formed on the semiconductor substrate 1S covering the semiconductor element thus configured. Then, the contact hole CNT1 is so formed as to penetrate through the inter-contact layer insulating film CIL and to reach the silicide film SL formed on the surface of the p-type semiconductor region PRd. On the other hand, the contact hole CNT2 is formed to penetrate through the inter-contact layer insulating film CIL, and to reach both of the silicide film SL formed on the surface of the n-type semiconductor region NRs and the silicide film SL formed on the surface of the p-type semiconductor region PRc.

A titanium/titanium nitride layer forming a barrier conductor film, and a tungsten film formed on the barrier conductor film are buried in the interior of the contact hole CNT1 and the interior of the contact hole CNT2 to form the plug PLG1 and the plug PLG2. The line L1 is formed on the inter-contact layer insulating film CIL in which the plug PLG1 and the plug PLG2 are formed. The line L1 is formed of, for example, a laminated film of a titanium nitride film, an aluminum film, and a titanium nitride film.

From the above description, in the semiconductor element according to the fourth embodiment, the plug PLG2 is formed on the n-type semiconductor region NRs and the p-type semiconductor region PRc so as to come in contact with both of the n-type semiconductor region NRs and the p-type semiconductor region PRc. For that reason, in the semiconductor element according to the fourth embodiment, the same potential is applied to the n-type semiconductor region NRs and the p-type semiconductor region PRc through the plug PLG2. Further, the p-type semiconductor region PRc is electrically connected to the body region BD with the result that the same potential is applied to the p-type semiconductor region PRc and the body region BD.

The feature of the semiconductor element according to the fourth embodiment resides in that since the body region BD is electrically connected to the plug PLG2 through the p-type semiconductor region PRc, the body region BD is not in a floating state. With this feature, when the semiconductor element according to the fourth embodiment is formed on the SOI substrate, the following advantages are obtained.

There has been known that, for example, on the normal SOI substrate, because the buried insulating layer BOX is present between the support substrate HS and the body region BD, electricity cannot be fed to the body region BD, and an unstable operation called "substrate floating phenomenon" occurs. On the contrary, in the fourth embodiment, the p-type semiconductor region PRc is provided outside of the n-type semiconductor region NRs, and the p-type semiconductor region PRc and the body region BD are electrically connected to each other. Since the p-type semiconductor region PRc is connected to the plug PLG2, the body region BD is not in the floating state. As a result, the fourth embodiment is advantageous in that the unstable operation attributable to the substrate floating phenomenon can be suppressed.

The semiconductor device according to the fourth embodiment is configured as described above, and a method for manufacturing the semiconductor device will be described below with reference to the drawings.

Figure 39:
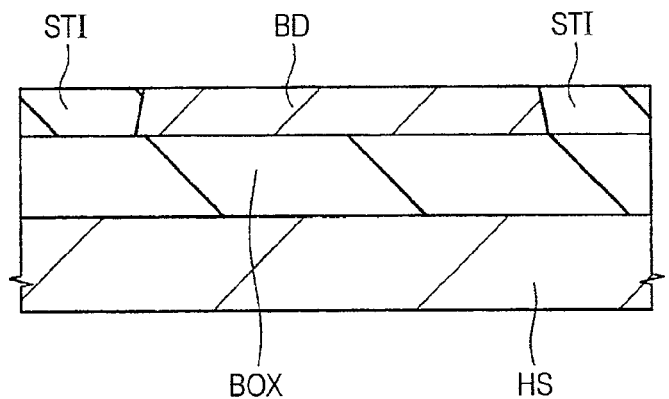
FIG. 39 is a cross-sectional view illustrating a process of manufacturing a semiconductor device according to the fourth embodiment.

First, as illustrated in FIG. 39, there is prepared the SOI substrate including the support substrate HS, the buried insulating layer BOX formed on the support substrate HS, and the silicon layer formed on the buried insulating layer BOX. The element separation region ST1 is formed on the SOI substrate, and the active region is zoned by the element separation region ST1. The zoned active region (silicon layer) serves as the body region BD. In this situation, a thickness of the body region BD is, for example, about 50 nm, and forms the p-type semiconductor region. For example, the impurity concentration (p-type impurity) of the body region BD is a factor of $10^{15}/cm^3$.

Figure 40:
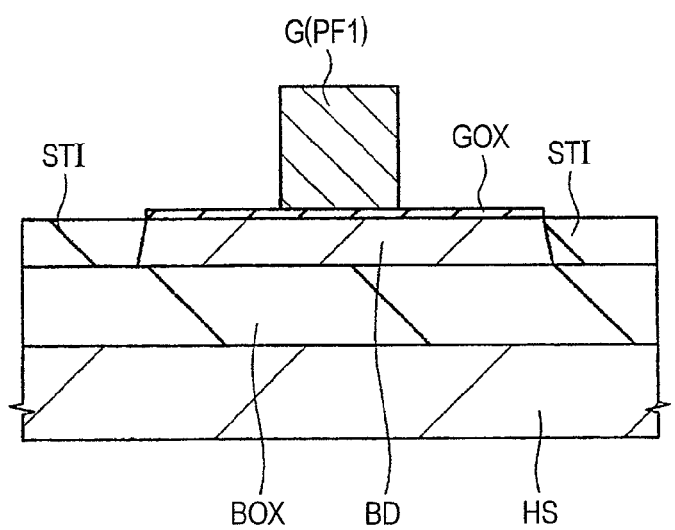
FIG. 40 is a cross-sectional view illustrating the process of manufacturing the semiconductor device subsequent to FIG. 39.

Subsequently, as illustrated in FIG. 40, the gate insulating film GOX of, for example, 3 nm is formed in the body region BD with the use of the thermal oxidation method. The gate insulating film GOX is formed of, for example, a silicon oxide film. However, the gate insulating film GOX is not limited to this film, but may be formed of a high dielectric film higher in dielectric constant than the silicon oxide film. Thereafter, the polysilicon film PF1 is deposited in thickness of about 100 nm on the gate insulating film GOX with the use of the CVD method. In this situation, the polysilicon film PF1 is doped with phosphorus with a high concentration with the use of the in-situ doping method or the ion implantation method. Then, the polysilicon film PF1 is patterned with the use of the photolithography technique and the dry etching method. Specifically, a resist film formed on the polysilicon film PF1 is patterned with the use of the photolithography technique. Then, the polysilicon film PF1 is dry-etched with the patterned resist film as a mask. In this way, the polysilicon film PF1 is anisotropically etched in a direction perpendicular to the substrate surface of the semiconductor substrate 1S to form the gate electrode G formed of the polysilicon film PF1.

Figure 41:
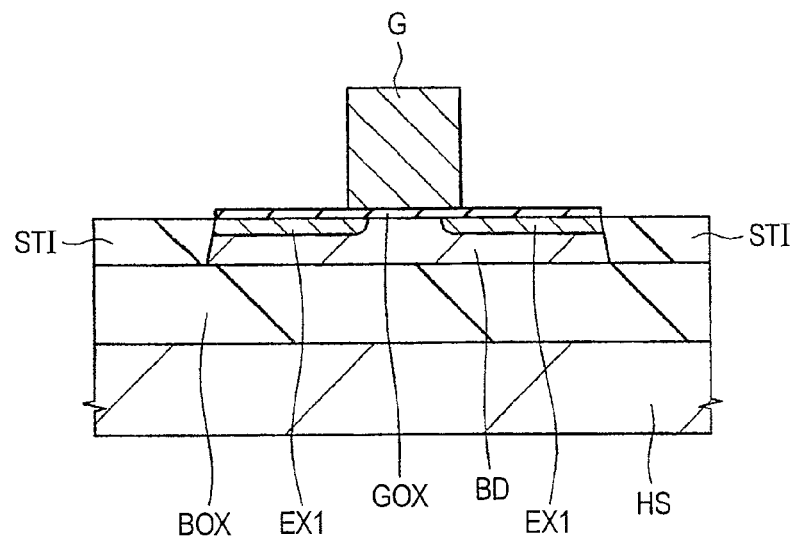
FIG. 41 is a cross-sectional view illustrating the process of manufacturing the semiconductor device subsequent to FIG. 40.
Figure 42:
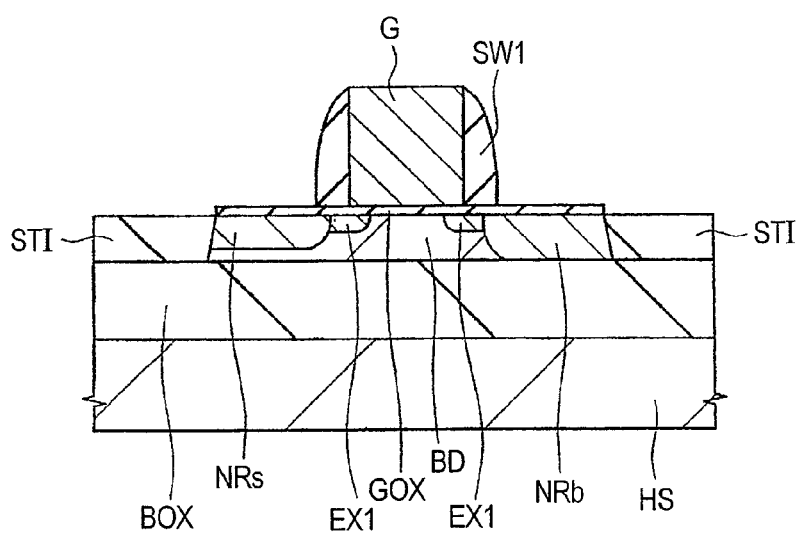
FIG. 42 is a cross-sectional view illustrating the process of manufacturing the semiconductor device subsequent to FIG. 41.

Then, as illustrated in FIG. 41, the low-concentration n-type semiconductor regions EX1 matching the gate electrode G is formed within the semiconductor substrate 1S with the use of the photolithography technique and the ion implantation method. Then, as illustrated in FIG. 42, a silicon oxide film is deposited in thickness of about 50 nm on the semiconductor substrate 1S covering the gate electrode G and the gate electrode G3 through the CVD method, and the deposited silicon oxide film is anisotropically etched to form the side wall SW1 on both of side walls of the gate electrode G.

Thereafter, the semiconductor substrate 1S is doped with arsenic through the ion implantation method with the gate electrode G forming the side wall SW1 as a mask. With this processing, the n-type semiconductor region NRs and the n-type semiconductor region NRb can be formed. Thereafter, the impurities (arsenic) introduced by the heat treatment may be activated. In this situation, when the ion implantation method is implemented, the gate electrode G forming the side wall SW1 as well as the resist film is patterned as the mask of the ion implantation method. In this case, the n-type semiconductor region NRs and the n-type semiconductor region NRb can have the different impurity concentration and the different depth. For example, an implantation energy when forming the n-type semiconductor region NRs can be made lower than the implantation energy when forming the n-type semiconductor region NRb, so that the n-type semiconductor region NRb reaches the buried insulating layer BOX while the n-type semiconductor region NRs does not reach the buried insulating layer BOX.

Figure 43:
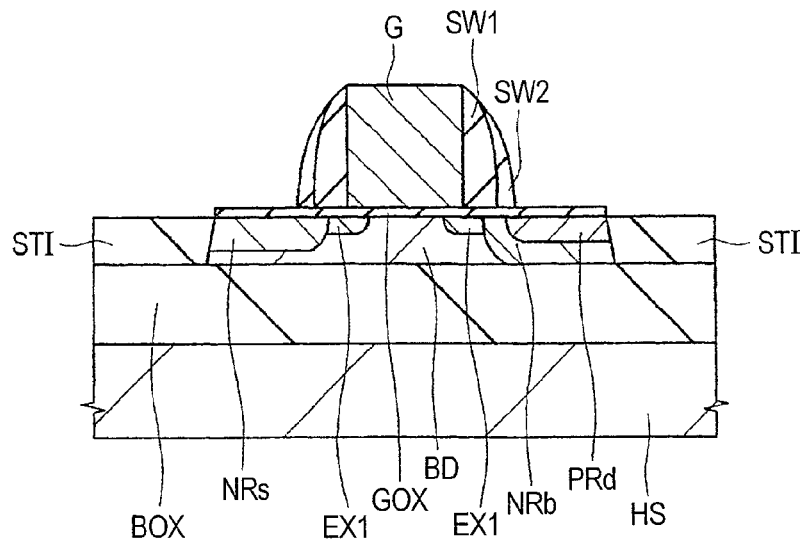
FIG. 43 is a cross-sectional view illustrating the process of manufacturing the semiconductor device subsequent to FIG. 42.

Subsequently, as illustrated in FIG. 43, a silicon oxide film is deposited in thickness of about 50 nm on the semiconductor substrate 1S covering the gate electrode G through the CVD method. Then, the deposited silicon oxide film is anisotropically etched to form the side wall SW2 outside of the side wall SW1. Then, the p-type semiconductor region PRd is formed to be included in the n-type semiconductor region NRb with the use of the photolithography technique and the ion implantation method.

Figure 44:
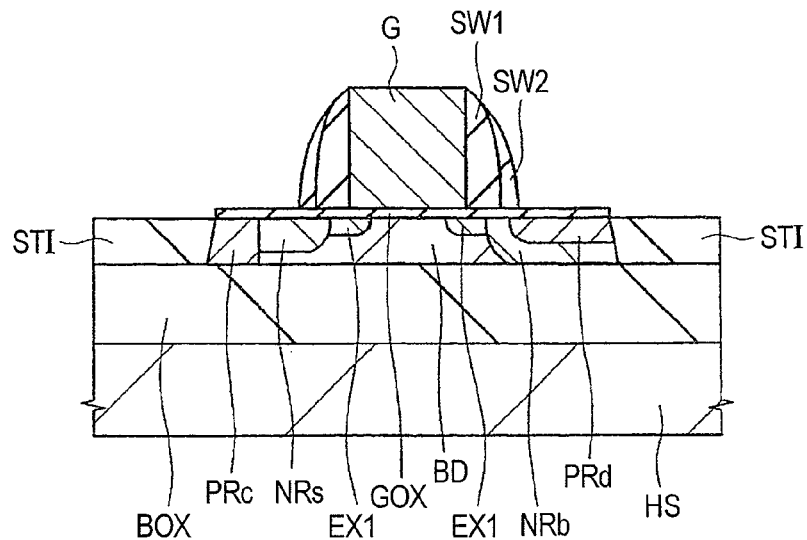
FIG. 44 is a cross-sectional view illustrating the process of manufacturing the semiconductor device subsequent to FIG. 43.

Thereafter, as illustrated in FIG. 44, the p-type semiconductor region PRc that reaches the buried insulating layer BOX is formed in a region outside of the n-type semiconductor region NRs with the use of the photolithography technique and the ion implantation method. In this situation, since a bottom of the n-type semiconductor region NRs does not reach the buried insulating layer BOX, the p-type semiconductor region PRc is not electrically connected to the body region BD.

Then, a high-temperature activation treatment is conducted in a short time with the use of laser spike annealing (LSA). As a result, the tunnel junction can be formed in the boundary region between the n-type semiconductor region NRb and the p-type semiconductor region PRd.

Figure 45:
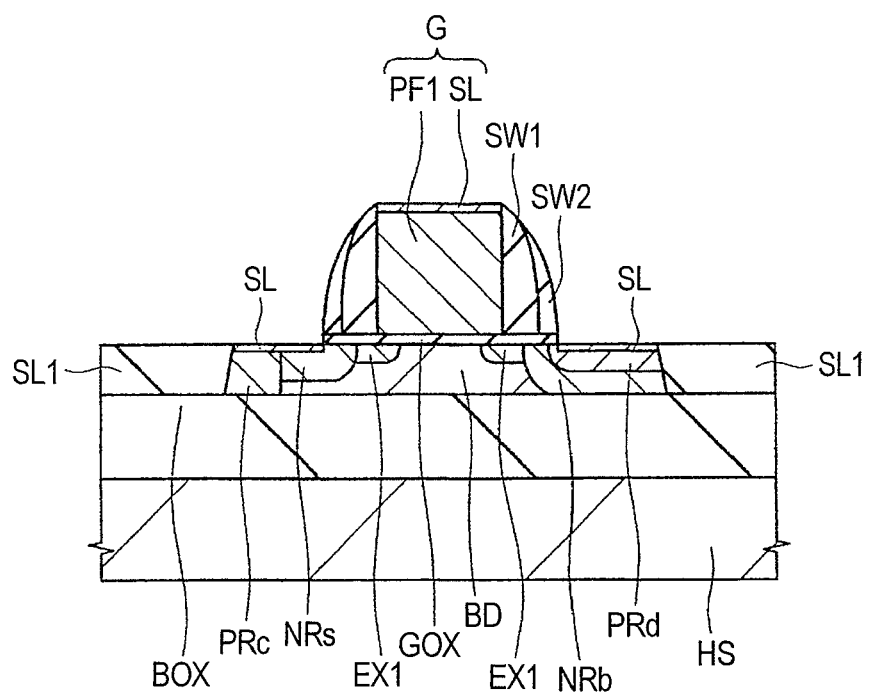
FIG. 45 is a cross-sectional view illustrating the process of manufacturing the semiconductor device subsequent to FIG. 44.

Then, as illustrated in FIG. 45, the silicide film SL is selectively formed on an upper surface of the gate electrode G, the surface of the p-type semiconductor region PRd, the surface of the n-type semiconductor region NRs, and the surface of the p-type semiconductor region PRc, with the side wall SW2 as a mask. With this configuration, the gate electrode G, the p-type semiconductor region PRd, the n-type semiconductor region NRs, and the p-type semiconductor region PRc can be reduced in resistance. This is a normal process known as a salicide process. The silicide film SL can be formed of, for example, a cobalt silicide film, a titanium silicide film, a nickel silicide film, a platinum silicide film, or a nickel platinum silicide film.

Thereafter, as illustrated in FIG. 38, a wiring process used in the normal LSI is conducted to obtain the semiconductor element in the fourth embodiment. Specifically, as illustrated in FIG. 38, the inter-contact layer insulating film CIL formed of, for example, the silicon oxide film, is formed on the semiconductor substrate 1S, and an upper surface of the inter-contact layer insulating film CIL is flattened through the CMP method. Then, with the use of the photolithography technique and the etching technique, the contact hole CNT1 and the contact hole CNT2, which penetrates through the inter-contact layer insulating film CIL, are formed. In this case, the bottom of the contact hole CNT2 is formed to come in contact with both of the p-type semiconductor region PRc and the n-type semiconductor region NRc.

Subsequently, a titanium/titanium nitride film is formed on the inter-contact layer insulating film CIL including the bottoms and the inner walls of the contact holes CNT1 and CNT2. The titanium/titanium nitride film can be formed of a laminated film including a titanium film and a titanium nitride film, and formed, for example, with the use of a sputtering method. The titanium/titanium nitride film has a so-called barrier property which prevents tungsten, which is a material of a film to be buried in a post-process, from diffusing into silicon.

Subsequently, a tungsten film is formed on an entire main surface of the semiconductor substrate 1S so as to bury the contact holes CNT1 and CNT2. The tungsten film can be formed, for example, with the use of the CVD method. The unnecessary titanium/titanium nitride film and tungsten film, which have been formed on the inter-contact layer insulating film CIL, are removed, for example, through the CMP method, to thereby form the plug PLG1 and the plug PLG2. In this situation, the plug PLG2 is electrically connected to both of the p-type semiconductor region PRc and the n-type semiconductor region NRs.

Subsequently, a titanium/titanium nitride film, an aluminum film, and a titanium/titanium nitride film are sequentially formed on the inter-contact layer insulating film CIL, and the plugs PLG1, PLG2. Those films can be formed thereon with the use of, for example, the sputtering method. Subsequently, those films are patterned with the use of the photolithography technique and the etching technique to form the line L1. In the manner described above, the semiconductor device according to the fourth embodiment can be manufactured.

In the semiconductor element according to the above-mentioned fourth embodiment, as described above, in order to feed electricity to the body region BD, the n-type semiconductor region NRs is formed so as not to reach the buried insulating layer BOX, and the p-type semiconductor region PRc that reaches the buried insulating layer BOX in the region outside of the n-type semiconductor region NRs is formed.

Figure 46:
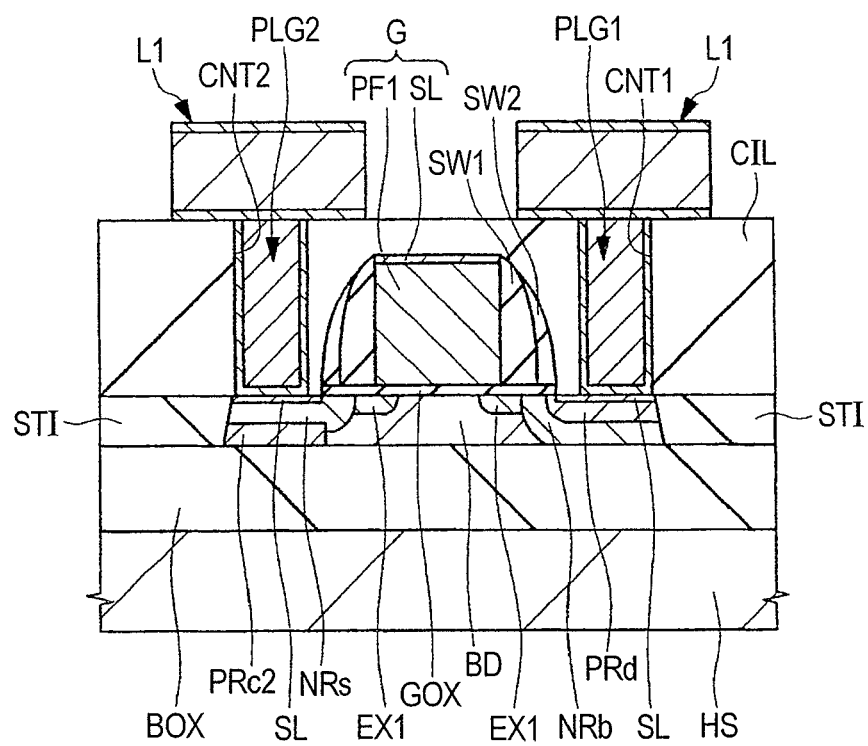
FIG. 46 is a cross-sectional view illustrating a first modified example.

Hereinafter, a description will be given of a modified example 1 in which electricity is fed to the body region BD in another structure different from the above structure. FIG. 46 is a cross-sectional view illustrating the device structure of the semiconductor element according to the modified example 1. Because the device structure of the semiconductor element in the modified example 1 illustrated in FIG. 46 is substantially identical with the device structure of the semiconductor element illustrated in FIG. 38, a different configuration will be described.

As illustrated in FIG. 46, in the modified example 1, the n-type semiconductor region NRs does not reach the buried insulating layer BOX, and a p-type semiconductor region PRc2 is formed between the n-type semiconductor region NRs and the buried insulating layer BOX. Because the impurity concentration of the p-type semiconductor region PRc2 is set to be higher than $10^{20}/cm^3$, the p-type semiconductor region PRc2 and the n-type semiconductor region NRs form not the normal pn junction having a rectifying action, but an ohmic contact. Accordingly, in the modified example 1, the n-type semiconductor region NRs and the p-type semiconductor region PRc2 are electrically connected in resistive contact to each other, and further the p-type semiconductor region PRc2 is connected to the body region BD. As a result, the n-type semiconductor region NRs and the body region BD are electrically connected to each other. Since the n-type semiconductor region NRs is connected to the plug PLG2, electricity can be fed to the body region BD from the plug PLG2 through the n-type semiconductor region NRs and the p-type semiconductor region PRc2. Accordingly, even in the modified example 1, the body region BD does not come into the floating state, and can suppress the substrate floating phenomenon (unstable operation) attributable to the floating state of the body region BD.

The configuration of the modified example 1 has the following advantages. For example, as illustrated in FIG. 38, when the p-type semiconductor region PRc is formed in the region outside of the n-type semiconductor region NRs, a specific mask (mask having a fine opening) for forming the p-type semiconductor region PRc is required. On the contrary, in FIG. 46 illustrated in the modified example, the p-type semiconductor region PRc2 can be formed to be aligned with the side wall SW2 formed on the side wall SW2 formed on the side wall of the gate electrode G. That is, the modified example 1 obtains an advantage that the p-type semiconductor region PRc2 can be formed to be aligned with the side wall SW2 without requiring the specific mask used when the p-type semiconductor region PRc illustrated in FIG. 38 is formed.

As in the fourth embodiment, when the semiconductor element according to the present invention is formed on the SOI substrate, it is effective to skillfully use the structure specific to the SOI substrate. That is, in the semiconductor element according to the fourth embodiment, the PNP tunnel-injection bipolar transistor is included, and the amplifying function of the PNP tunnel-injection bipolar transistor is used to realize the S value of 60 mV/decade or lower which cannot be obtained by the simplicial MOSFET. In this case, a current amplifying function of the PNP tunnel-injection bipolar transistor is realized by implanting holes from the p-type semiconductor region PRd serving as the emitter region of the PNP tunnel-injection bipolar transistor to the n-type semiconductor region NRb serving as the base region of the PNP tunnel-injection bipolar transistor, and drawing the holes, which have been implanted into the base region, into the body region BD. Accordingly, it is important to draw the holes implanted into the base region into the body region BD as much as possible. In this example, in the SOI substrate, when the holes implanted from the emitter region into the base region are drawn into the body region BD, the support substrate HS which is a lower layer of the buried insulating layer BOX is used as a back gate, to thereby effectively draw the holes from the base region to the body region BD (collector region).

Figure 47:
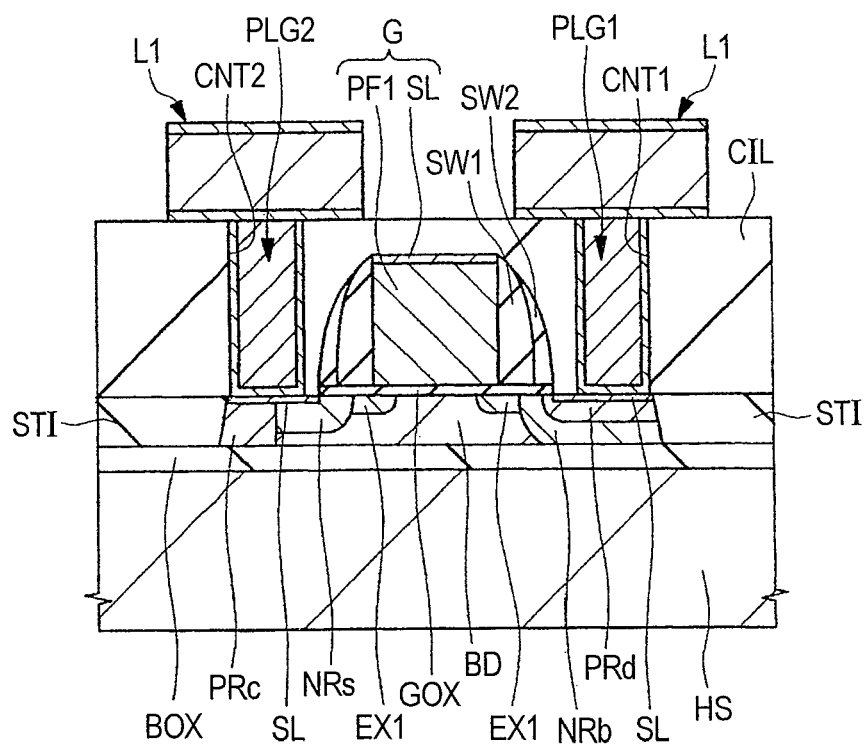
FIG. 47 is a cross-sectional view illustrating a configuration example in which a buried insulating layer is thinned.

Specifically, when a negative potential is applied to the support substrate HS, the holes can be stored on an interface of the body region BD and the buried insulating layer BOX. That is, a storage region caused by the holes is formed in the interface between the body region BD and the buried insulating layer BOX. Since the storage region becomes the p-type semiconductor region with a high concentration, the storage region comes into contact with the n-type semiconductor region NRb (base region), to thereby reduce a width of a depletion layer in a pn junction between the storage region and the n-type semiconductor region NRb (base region). As a result, the holes are liable to be drawn from the base region into the body region BD. In particular, as illustrated in FIG. 47, even if the thickness of the buried insulating layer BOX is thinned to decrease the potential to be applied to the support substrate HS (back gate), the storage region caused by the holes can be easily formed in the interface between the body region BD and the buried insulating layer BOX. As a result, the efficiency of drawing the holes from the base region (n-type semiconductor region NRb) into the collector region (body region BD) can be improved.

It is also effective to deeply form the p-type semiconductor region PRd so that a bottom thereof comes into contact with the BOX. In the normal semiconductor substrate 1S (wafer) used in the first embodiment, when the p-type semiconductor region PRd is formed deeper than the n-type semiconductor region NRb, the p-type semiconductor region PRd comes into contact with the p-type well PWL to eliminate the pn junction. For that reason, the emitter and the collector are short-circuited. However, in the SOI substrate, because the p-type semiconductor region PRd can be surrounded by the buried insulating layer BOX and the n-type semiconductor region NRb, the p-type semiconductor region PRd and the body region BD are not short-circuited. In this situation, the body region BD, the n-type semiconductor region NRb, and the p-type semiconductor region PRb form a laterally arranged PNP tunnel-injection bipolar transistor. In this situation, because an electric field effect can be exerted from the support substrate HS through the buried insulating layer BOX, a flow of carriers between the body region BD and the p-type semiconductor region PRb can be controlled with the use of the support substrate HS.

In particular, a technical concept of the present invention is to realize the semiconductor element that realizes the S value of 60 mV/decade or lower even if the supply potential becomes low voltage. Therefore, a configuration that the thickness of the buried insulating layer BOX of the SOI substrate is thinned to decrease the voltage to be applied to the support substrate HS (back gate) is useful.

Fifth Embodiment

A semiconductor device according to the present invention is a device in which the S value of 60 mV/decade or lower can be realized by combination of the MOSFET and the tunnel-injection bipolar transistor with the result that an excellent switching characteristic is provided even at a low voltage. That is, the present invention has a first feature that the semiconductor element is effective particularly in the operation at the low voltage. On the other hand, the present invention also has a second effective feature different from the above-mentioned first feature. The second feature will be described.

Figure 48:
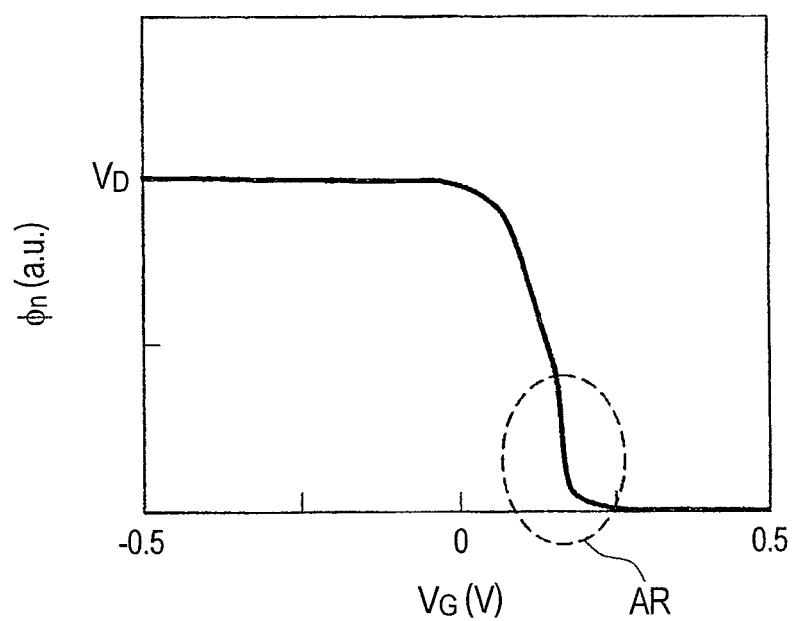
FIG. 48 is a graph illustrating results obtained by measuring a potential change at a node when a voltage is applied to a gate electrode according to a fifth embodiment.

FIG. 48 is a graph illustrating results obtained by measuring a potential ($\phi n$) change at a node A (refer to FIG. 1) when a voltage is applied to a gate electrode. As illustrated in FIGS. 1 and 48, it is found that when the drain potential $V_D$ of a relatively high potential of, for example, 0.8 V is applied to the drain terminal D to increase the gate potential $V_G$ to be applied to the gate terminal GT, the potential (n) at the node A is rapidly decreased from the drain potential $V_D$ contrary to the gate potential $V_G$. That is, as illustrated in FIG. 48, it is found that as the gate potential $V_G$ is increased, a potential change rapidly occurs in the node A, but the potential change further rapidly occurs in the node A in a region indicated in an area AR of FIG. 48. That is, when the drain potential $V_D$ of a relatively high potential of, for example, 0.8 V is applied thereto, there occurs the further rapid potential change (refer to an area AR in FIG. 48) which does not occur when the drain potential V, of the relatively low potential of, for example, 0.3 V is applied thereto. The reason is that when the forward bias (for example, 0.3 V) of the relatively low potential is applied to the tunnel junction, tunnel current caused by the inter-band tunneling phenomenon is dominant in the tunnel junction (refer to FIG. 11). On the contrary, when the forward bias (for example, 0.8 V) of the relatively high potential is applied to the tunnel junction, a diffusion current between the conduction bands becomes dominant, and the resistance becomes rapidly decreased. Therefore, it is conceivable that the potential change at the node A is more accelerated, and appears.

Figure 49:
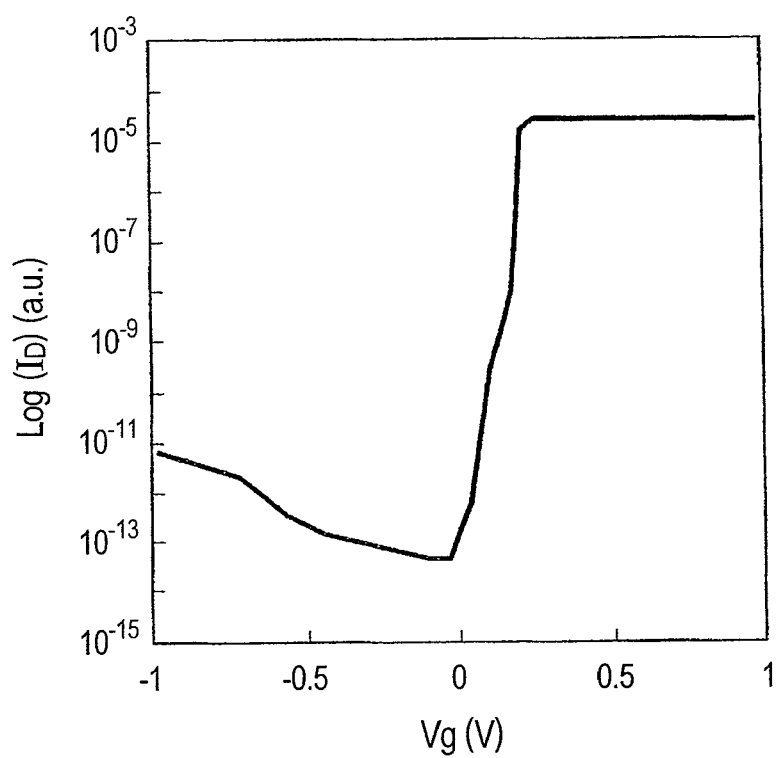
FIG. 49 is a graph illustrating a drain current to gate voltage characteristic of the semiconductor element when, for example, a relatively high potential such as 0.8 V is applied to a drain terminal.

FIG. 49 is a graph illustrating a drain current to gate voltage characteristic of the semiconductor element when a relatively high potential of, for example, 0.8 V is applied to the drain terminal D. It is found that the drain current to gate voltage characteristic illustrated in FIG. 49 has a very steep inclination with respect to a change in the gate potential. From this fact, it is found that the semiconductor element according to the present invention can obtain a larger current by applying the relatively high drain potential $V_D$. That is, the second feature of the present invention resides in that the semiconductor element can obtain the larger drive current by applying the relatively high drain potential $V_D$. From the above description, it is found that the semiconductor element according to the present invention has the first feature that the excellent switching property is provided even at the low voltage, and the second feature that the larger drive current can be obtained at the high voltage.

Under the circumstances, a fifth embodiment is to provide a technical concept of effectively utilizing the first feature and the second feature of the above-mentioned semiconductor element. For example, given a reduction in the power consumption as a semiconductor chip, the semiconductor element according to the present invention can be more effectively utilized by creating and integrating circuit areas different in operating voltage together.

Figure 50:
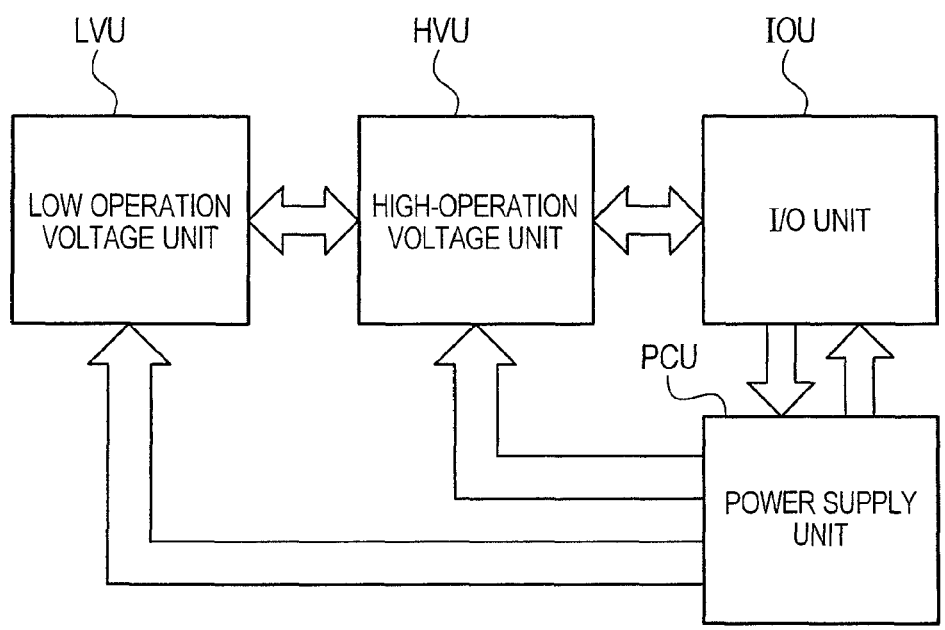
FIG. 50 is a circuit block diagram of a semiconductor chip according to the fifth embodiment.

FIG. 50 is a circuit block diagram of a semiconductor chip according to the fifth embodiment. As illustrated in FIG. 50, the semiconductor chip according to the fifth embodiment includes a power supply unit PCU, an I/O unit IOU, a low operation voltage unit LVU, and a high operation voltage unit HVU. In the semiconductor chip thus configured, a supply potential is applied from the power supply unit PCU to the I/O unit IOU, the low operation voltage unit LVU, and the high operation voltage unit HVU. Then, a relatively low supply potential is applied to the low operation voltage unit LVU, and a relatively high supply potential is applied to the high operation voltage unit HVU.

The semiconductor element according to the present invention is incorporated into each of the low operation voltage unit LVU and the high operation voltage unit HVU, and the low operation voltage unit LVU can provide the excellent switching characteristic at the low voltage by using the first feature of the semiconductor element in the present invention. For example, the SPAM can be operated at the low voltage with application of the semiconductor element of the present invention to a memory, for example, an SRAM. On the other hand, the high operation voltage unit HVU can provide the larger current drive force at the high voltage by using the second feature of the semiconductor element in the present invention. For example, high-speed operation can be conducted at the high voltage with application of the semiconductor element in the present invention to a CPU, for example, an operation unit. Thus, the semiconductor element according to the present invention has the first feature that the excellent switching characteristic is provided in the low-voltage operation, and the second feature that the larger current drive force can be provided at the high voltage. With those features, the semiconductor element of the same structure can be applied to circuits having different functions such as the low operation voltage unit LVU and the high operation voltage unit HVU. The circuit that can operate at the low voltage is integrated into the low operation voltage unit LVU, and the circuit that requires the current drive force at the high voltage is integrated in the high operation voltage unit HVU, to thereby effectively utilize an electric power to be supplied from the power supply unit PCU.

Sixth Embodiment

Figure 51:
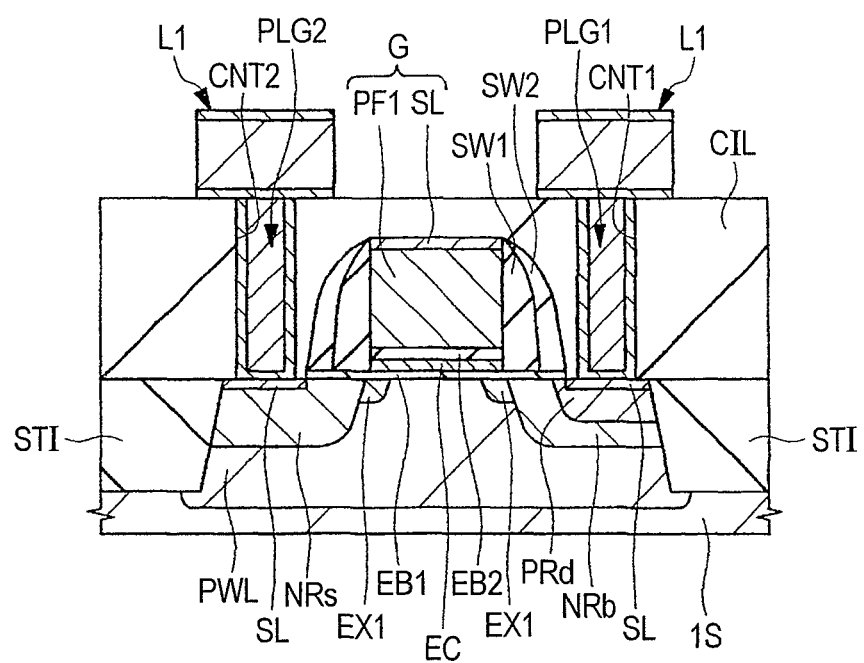
FIG. 51 is a cross-sectional view illustrating a device structure of a nonvolatile memory cell according to a sixth embodiment.

In a sixth embodiment, a description will be given of an example in which the technical concept of the present invention is applied to a nonvolatile semiconductor memory device. FIG. 51 is a cross-sectional view illustrating a device structure of the nonvolatile memory cell according to the sixth embodiment. As illustrated in FIG. 51, the semiconductor cell according to the sixth embodiment is formed in an active region zoned by the element separation region STI formed on the semiconductor substrate 1S. Specifically, a p-type well PWL doped with a p-type impurity, for example, boron is formed within the semiconductor substrate 1S zoned by the element separation region STI. A pair of low-concentration n-type semiconductor regions EX1 is formed at a distance from each other within the p-type well PWL. Each of the low-concentration n-type semiconductor regions EX1 is formed of a semiconductor region doped with an n-type impurity such as phosphorus, and a region between the pair of low-concentration n-type semiconductor regions EX1 within the p-type well PWL serves as the channel region. The n-type semiconductor region NRs and the n-type semiconductor region NRb are formed outside of the low-concentration n-type semiconductor regions EX1. That is, the n-type semiconductor region NRs is formed on the left side of the left low-concentration n-type semiconductor region EX1 of the pair of low-concentration n-type semiconductor regions EX1, and the n-type semiconductor region NRb is formed on the right side of the right low-concentration n-type semiconductor region EX1 of the pair of low-concentration n-type semiconductor regions EX1. The n-type semiconductor region NRs and the n-type semiconductor region NRb are formed of semiconductor regions doped with an n-type impurity such as arsenic.

Further, in the memory cell according to the sixth embodiment, the p-type semiconductor region PRd is formed to be included within the n-type semiconductor region NRb. The p-type semiconductor region PRd is formed of a semiconductor region doped with a p-type impurity such as boron.

Then, a first potential barrier film EB1 is formed on the channel region, and a charge storage film EC is formed on the first potential barrier film EB1. A second potential barrier film EB2 is formed on the charge storage film EC, and the gate electrode G is formed on the second potential barrier film EB2.

The first potential barrier film EB1 and the second potential barrier film EB2 are each formed of, for example, a silicon oxide film. Also, the gate electrode G is formed of, for example, the polysilicon film PF1 (n-type polysilicon film) doped with phosphorus, and the silicide film SL formed on the polysilicon film PF1. The silicide film SL is a film formed for decreasing a resistance of the gate electrode G, and the silicide film SL is formed of, for example, a cobalt silicide film, a titanium silicide film, a nickel silicide film, a platinum silicide film, or a nickel platinum silicide film. Further, the charge storage film EC is formed of, for example, a polysilicon film which is a conductor film, or a silicon nitride film which is an insulating film having a trap level.

The side wall SW1 is formed on both of side walls of the gate electrode G, and the side wall SW2 is formed outside of the side wall SW1. The silicide film SL is formed in a region outside of the side wall SW2. Specifically, the silicide film SL is formed on a surface of the n-type semiconductor region NRs that is exposed to an outside of the left side wall SW2. Also, the silicide film SL is formed on a surface of the p-type semiconductor region PRd that is exposed to an outside of the right side wall SW2.

The memory cell according to the sixth embodiment is configured as described above, and the memory cell includes the memory transistor and the tunnel-injection bipolar transistor. That is, the left low-concentration n-type semiconductor region EX1, the n-type semiconductor region NRs, and the silicide film SL form the source region of the memory transistor. The gate electrode G forms the gate electrode of the memory transistor. Further, the right low-concentration n-type semiconductor region EX1, and the n-type semiconductor region NRb form a connection region between the memory transistor and the tunnel-injection bipolar transistor.

The p-type semiconductor region PRd and the silicide film SL serve as the emitter region of the tunnel-injection bipolar transistor, and the right low-concentration n-type semiconductor region EX1 and the n-type semiconductor region NRb serve as the base region of the tunnel-injection bipolar transistor. The p-type well PWL and the semiconductor substrate 1S serve as the collector region of the tunnel-injection bipolar transistor. From the above description, the memory cell according to the sixth embodiment includes the memory transistor and the tunnel-injection bipolar transistor, and the memory transistor and the tunnel-injection bipolar transistor are electrically connected to each other so that the drain region of the memory transistor serves as the base region of the tunnel-injection bipolar transistor.

The inter-contact layer insulating film CIL formed of a silicon oxide film made of TEOS as a raw material is formed on the semiconductor substrate 1S covering the memory cell thus configured, as illustrated in FIG. 51. Then, the contact hole CNT1 is so formed as to penetrate through the inter-contact layer insulating film CIL and to reach the silicide film SL formed on the surface of the p-type semiconductor region PRd. Likewise, the contact hole CNT2 is so formed as to penetrate through the inter-contact layer insulating film CIL and to reach the silicide film SL formed on a surface of the n-type semiconductor region NRs. A titanium/titanium nitride layer forming a barrier conductor film, and a tungsten film formed on the barrier conductor film are buried in the interior of the contact hole CNT1 and the interior of the contact hole CNT2 to form the plug PLG1 and the plug PLG2. A line L1 is formed on the inter-contact layer insulating film CIL in which the plug PLG1 and the plug PLG2 are formed. The line L1 is formed of, for example, a laminated film of a titanium nitride film, an aluminum film, and a titanium nitride film.

The operation of the memory cell according to the sixth embodiment will be described. First, write operation will be described. The write operation is defined as the operation of increasing a threshold voltage of the memory transistor by implanting electrons into the charge storage film EC illustrated in FIG. 51. For example, a potential difference is generated between the p-type well PWL (semiconductor substrate 1S) and the gate electrode G whereby electrons can tunnel through the first potential barrier film EB1 from the channel region within the p-type well PWL, and be implanted into the charge storage film EC. That is, with the use of an FN tunnel phenomenon, the electrons can be implanted into the charge storage film EC to conduct the write operation.

Subsequently, erase operation will be described. The erase operation is defined as the operation of drawing the electrons from the charge storage film EC illustrated in FIG. 51, and decreasing a threshold voltage of the memory transistor. For example, a potential difference opposite to that in write operation is developed between the p-type well PWL (semiconductor substrate 1S) and the gate electrode G with the result that the electrons can tunnel through the first potential barrier film EB1 from the charge storage film EC, and be drawn into the channel region (p-type well PWL). That is, with the use of the FN tunnel phenomenon, the electrons can be drawn from the charge storage film EC to conduct the erase operation.

Finally, the read operation will be described. First, a potential difference is generated between the n-type semiconductor region NRs serving as the source region and the n-type semiconductor region NRb serving as the drain region. Then, a gate potential of a given potential is applied to the gate electrode G. In this situation, when the memory cell is in an erase state, since a threshold voltage of the memory transistor is low, a current flows into the channel region. On the other hand, when the memory cell is in the write state, since the threshold voltage of the memory transistor is high, a current hardly flows in the channel region. Thus, whether the current flows in the channel region between the source region and the drain region, or not, is detected to discriminate whether the memory cell is in a write state "1", or in an erase state "0".

In this example, in the memory cell according to the sixth embodiment, the p-type semiconductor region PRd is formed to be included in the n-type semiconductor region NRb, and the tunnel junction is formed in the boundary region between the n-type semiconductor region NRb and the p-type semiconductor region PRd. In the tunnel junction, the impurity concentration of the p-type semiconductor region PRd is set to be higher than the impurity concentration of the n-type semiconductor region NRb. For example, the impurity concentration of the p-type semiconductor region PRd is a factor of $10^{20}/cm^3$, and the impurity concentration of the n-type semiconductor region NRb is a factor of $10^{19}/cm^3$.

As a result, for example, even when a low voltage is applied to the p-type semiconductor region PRd during the read operation of the memory cell, the tunnel junction is formed between the p-type semiconductor region PRd and the n-type semiconductor region NRd. Therefore, holes are implanted into the base region formed of the n-type semiconductor region NRb from the emitter region formed of the p-type semiconductor region PRd, and the holes implanted into the base region are drawn into the collector region formed of the p-type well PWL (semiconductor substrate 1S), to thereby function as the tunnel-injection bipolar transistor. That is, in the memory cell according to the sixth embodiment utilizes a phenomenon that the memory transistor and the tunnel-injection bipolar transistor are connected to each other, and when the memory transistor turns on, the tunnel current flows between the emitter region and the base region of the tunnel-injection bipolar transistor by the inter-band tunneling even at the low voltage. As a result, even at the low voltage, the large drain current (read current) can be obtained by the amplifying function of the tunnel-injection bipolar transistor. Accordingly, in the memory according to the sixth embodiment, since the sufficient read current can be ensured even at the low voltage, the voltage during the read operation can be decreased.

The invention made by the present inventors has been described above in detail with reference to the embodiments. However, the present invention should not be limited to the above embodiments, and can be variously changed without departing from the scope of the invention.

INDUSTRIAL APPLICABILITY 1S, semiconductor substrate
A, node
BD, body region
BOX, buried insulating layer
CIL, inter-contact layer insulating film
CNT, contact hole
CNT1, contact hole
CNT2, contact hole
D, drain terminal
EB1, first potential barrier film
EB2, second potential barrier film
EC, charge storage film
Ec, conduction band
Ef, Fermi level
Ev, valence band
EX1, low-concentration n-type semiconductor region
EX2, low-concentration p-type semiconductor region
EX3, low-concentration n-type semiconductor region
G, gate electrode
G1, gate electrode
G2, gate electrode
GND, ground potential
GOX, gate insulating film
GT, gate terminal
HS, support substrate
HVU, high operation voltage unit
IN, input
IOUT, I/O unit
L1, line
LVU, low operation voltage unit
NRb, n-type semiconductor region
NRb2, n-type semiconductor region
NRd, n-type semiconductor region
NRs, n-type semiconductor region
NRs2, n-type semiconductor region
NR1, n-type feed region
NTr, n-channel semiconductor element
NTr1, n-channel semiconductor element
NTr2, simplicial transistor
NWL, n-type well
OUT, output
PCU, power supply unit
PF1, polysilicon film
PLG, plug
PLG1, plug
PLG2, plug
PLG3, plug
PRb, p-type semiconductor region
PRc, p-type semiconductor region
PRc2, p-type semiconductor region
PRd, p-type semiconductor region
PRs, p-type semiconductor region
PR1, p-type feed region
PR2, p-type feed region
PTr, p-channel semiconductor element
PTr1, p-channel semiconductor element
PWL, p-type well
PWL1, p-type well
PWL2, p-type well
S, source terminal
SL, silicide film
STI, element separation region
Sub, substrate terminal
SW1, side wall
SW2, side wall
$V_D$, drain potential
VDD, supply potential
$V_G$, gate potential
$V_S$, source potential
$V_{sub}$, substrate potential

The invention claimed is:

1. A semiconductor device, comprising a semiconductor element including:
a first field effect transistor; and
a tunnel injection bipolar transistor formed on a semiconductor substrate,
wherein the first field effect transistor configuring the semiconductor element includes:
a first semiconductor region of a first conduction type, serving as a first source region, disposed within the semiconductor substrate,
a second semiconductor region of the first conduction type, serving as a first drain region, disposed at a distance from the first semiconductor region within the semiconductor substrate,
a first channel region of a second conduction type, opposite to the first conduction type, disposed within the semiconductor substrate between the first semiconductor region and the second semiconductor region,
a first gate insulating film disposed on the first channel region, and
a first gate electrode disposed on the first gate insulating film,
wherein the tunnel injection bipolar transistor configuring the semiconductor element includes:
a third semiconductor region of the second conduction type, serving as an emitter region, disposed in the second semiconductor region of the first conduction type,
wherein the second semiconductor region of the first conduction type serves as a base region of the tunnel injection bipolar transistor,
wherein the semiconductor substrate, having the second conduction type, serves as a collector region of the tunnel injection bipolar transistor,
wherein a tunnel junction is disposed in a boundary region between the second semiconductor region and the third semiconductor region, and
wherein the tunnel injection bipolar transistor amplifies a drain current.

2. The semiconductor device according to claim 1, wherein the tunnel junction is a junction in which even when a forward bias having a given voltage or lower is applied in a forward direction, there is no case where a current does not flow, and a current caused by inter-band tunneling flows, and a given current suppression function is provided when applying a reverse bias.

3. The semiconductor device according to claim 1, wherein the impurity concentration of the third semiconductor region is a factor of 1020/cm3, and wherein the impurity concentration of the second semiconductor region is a factor of 1019/cm3.

4. The semiconductor device according to claim 1,
wherein the semiconductor device includes a plurality of the semiconductor elements,
wherein the plurality of semiconductor elements includes first semiconductor elements and second semiconductor elements,
wherein the first semiconductor elements have the first conduction type of p-type and the second conduction type of n-type.

5. The semiconductor device according to claim 4,
wherein the first semiconductor elements and the second semiconductor elements configure an inverter.

6. The semiconductor device according to claim 5,
wherein the inverter is used for a memory cell of an SRAM.

7. The semiconductor device according to claim 1,
wherein the semiconductor device includes a plurality of the semiconductor elements, and
wherein the plurality of semiconductor elements includes low voltage semiconductor elements that operate with a low voltage, and high voltage semiconductor elements that operate with a high voltage higher than the low voltage.

8. The semiconductor device according to claim 1,
wherein the semiconductor device includes a second field effect transistor different from the semiconductor element, and
wherein the second field effect transistor includes:
 a second source region disposed within the semiconductor substrate;
 a second drain region disposed at a distance from the second source region within the semiconductor substrate;
 a second channel region formed within the semiconductor substrate between the second source region and the second drain region;
 a second gate insulating film formed on the second channel region; and
 a second gate electrode formed on the second gate insulating film.

9. The semiconductor device according to claim 1,
wherein a drain current to gate voltage response curve has a slope of more than 60 mV/decade.

* * * * *